(12) United States Patent
Oh et al.

(10) Patent No.: US 9,419,008 B2
(45) Date of Patent: Aug. 16, 2016

(54) METHOD OF FABRICATING SEMICONDUCTOR DEVICES HAVING VERTICAL CELLS

(71) Applicants: Jung-Ik Oh, Hwaseong-si (KR); Dae-Hyun Jang, Suwon-si (KR); Kyoung-Sub Shin, Seongnam-si (KR)

(72) Inventors: Jung-Ik Oh, Hwaseong-si (KR); Dae-Hyun Jang, Suwon-si (KR); Kyoung-Sub Shin, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/795,352

(22) Filed: Jul. 9, 2015

(65) Prior Publication Data

US 2015/0311153 A1    Oct. 29, 2015

Related U.S. Application Data

(62) Division of application No. 14/018,578, filed on Sep. 5, 2013, now Pat. No. 9,257,444.

(30) Foreign Application Priority Data

Dec. 7, 2012    (KR) .................. 10-2012-0141980

(51) Int. Cl.
*H01L 27/115* (2006.01)
*H01L 23/528* (2006.01)

(52) U.S. Cl.
CPC ........ *H01L 27/11565* (2013.01); *H01L 23/528* (2013.01); *H01L 27/11573* (2013.01); *H01L 27/11575* (2013.01); *H01L 27/11582* (2013.01)

(58) Field of Classification Search
CPC .................. H01L 27/11565; H01L 27/11575; H01L 27/11582; H01L 27/11573; H01L 23/528

See application file for complete search history.

(56) References Cited

U.S. PATENT DOCUMENTS

| 7,279,377 | B2 | 10/2007 | Rueger et al. |
| 7,989,880 | B2 | 8/2011 | Wada et al. |
| 8,058,683 | B2 | 11/2011 | Yoon et al. |
| 2009/0242967 | A1 | 10/2009 | Katsumata et al. |
| 2010/0090286 | A1 | 4/2010 | Lee et al. |

(Continued)

FOREIGN PATENT DOCUMENTS

| JP | 2010-199311 A | 9/2010 |
| KR | 10-1037621 B1 | 5/2011 |

(Continued)

*Primary Examiner* — Minh-Loan Tran
*Assistant Examiner* — Farid Khan
(74) *Attorney, Agent, or Firm* — Harness, Dickey & Pierce, P.L.C.

(57) ABSTRACT

According to example embodiments, a method of fabricating a semiconductor device includes: forming a preliminary stack structure including upper and lower preliminary stack structures by alternately stacking a plurality of interlayer insulating and sacrificial layers on a cell, first pad area, dummy area and second pad area of a substrate; removing an entire portion of the upper preliminary stack structure on the second pad area; forming a first mask defining openings over parts of the first and second pad areas; etching an etch depth corresponding to ones of the plurality of interlayer insulating and sacrificial layers through a remaining part of the preliminary stack structure exposed by the first mask; and repetitively performing a first staircase forming process that includes shrinking sides of the first mask and etching the etch depth through remaining parts of the plurality of interlayer insulating and sacrificial layers exposed by the shrunken first mask.

6 Claims, 66 Drawing Sheets

(56) References Cited

U.S. PATENT DOCUMENTS

| | | |
|---|---|---|
| 2010/0213526 A1 | 8/2010 | Wada et al. |
| 2011/0026604 A1 | 2/2011 | Zhao et al. |
| 2011/0121403 A1* | 5/2011 | Lee .................. H01L 27/11526 257/390 |
| 2011/0147818 A1* | 6/2011 | Katsumata ........ H01L 27/11573 257/314 |
| 2011/0169067 A1 | 7/2011 | Ernst et al. |
| 2011/0205797 A1* | 8/2011 | Kim .................. G11C 16/0483 365/185.11 |
| 2011/0256672 A1 | 10/2011 | Wada et al. |
| 2012/0061744 A1* | 3/2012 | Hwang ............. H01L 27/11565 257/324 |
| 2012/0119287 A1 | 5/2012 | Park et al. |
| 2012/0168858 A1* | 7/2012 | Hong ................ H01L 27/11573 257/330 |
| 2013/0009274 A1 | 1/2013 | Lee et al. |
| 2013/0161821 A1 | 6/2013 | Hwang et al. |
| 2014/0021632 A1* | 1/2014 | Lee ........................ G11C 5/063 257/774 |
| 2014/0054787 A1* | 2/2014 | Eun .................. H01L 27/11548 257/773 |
| 2014/0106569 A1* | 4/2014 | Oh .................... H01L 21/31144 438/703 |
| 2014/0183756 A1* | 7/2014 | Hwang ............... H01L 29/7889 257/774 |

FOREIGN PATENT DOCUMENTS

| | | |
|---|---|---|
| KR | 2011-0078490 A | 7/2011 |
| KR | 10-1102548 B1 | 1/2012 |

\* cited by examiner

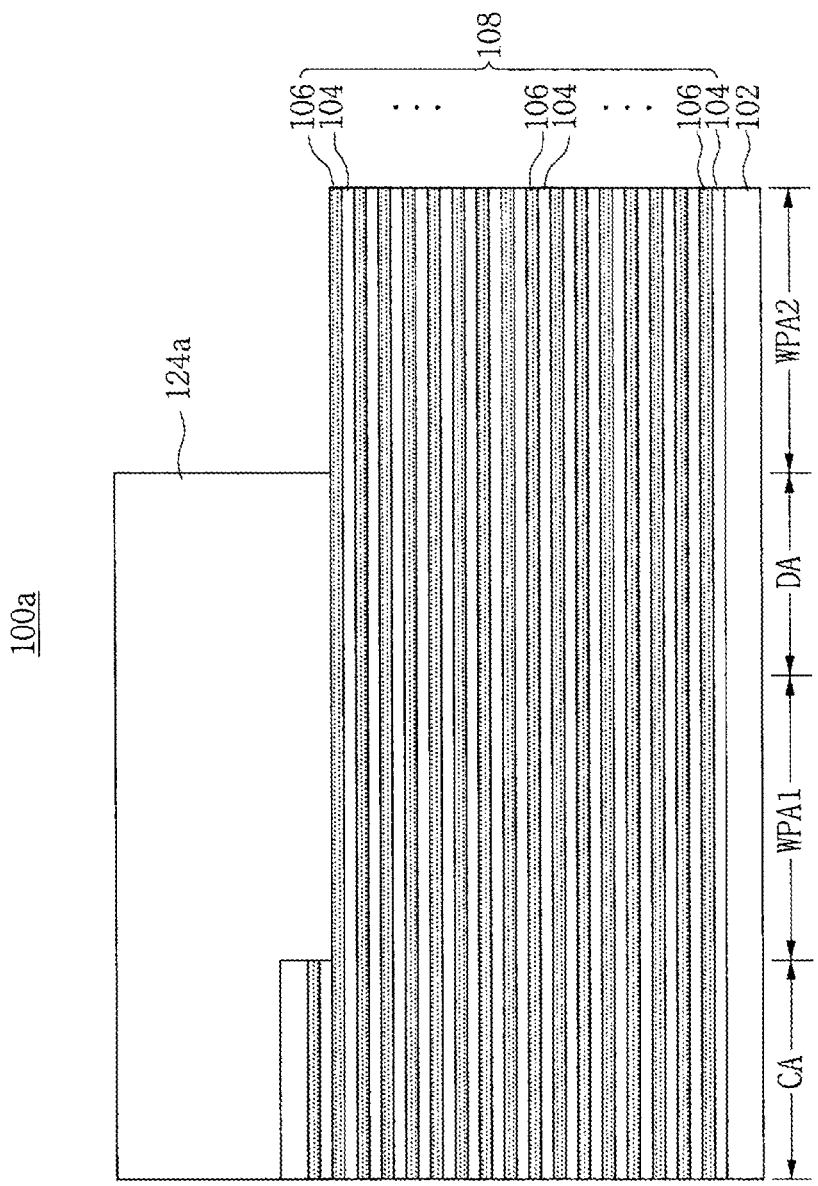

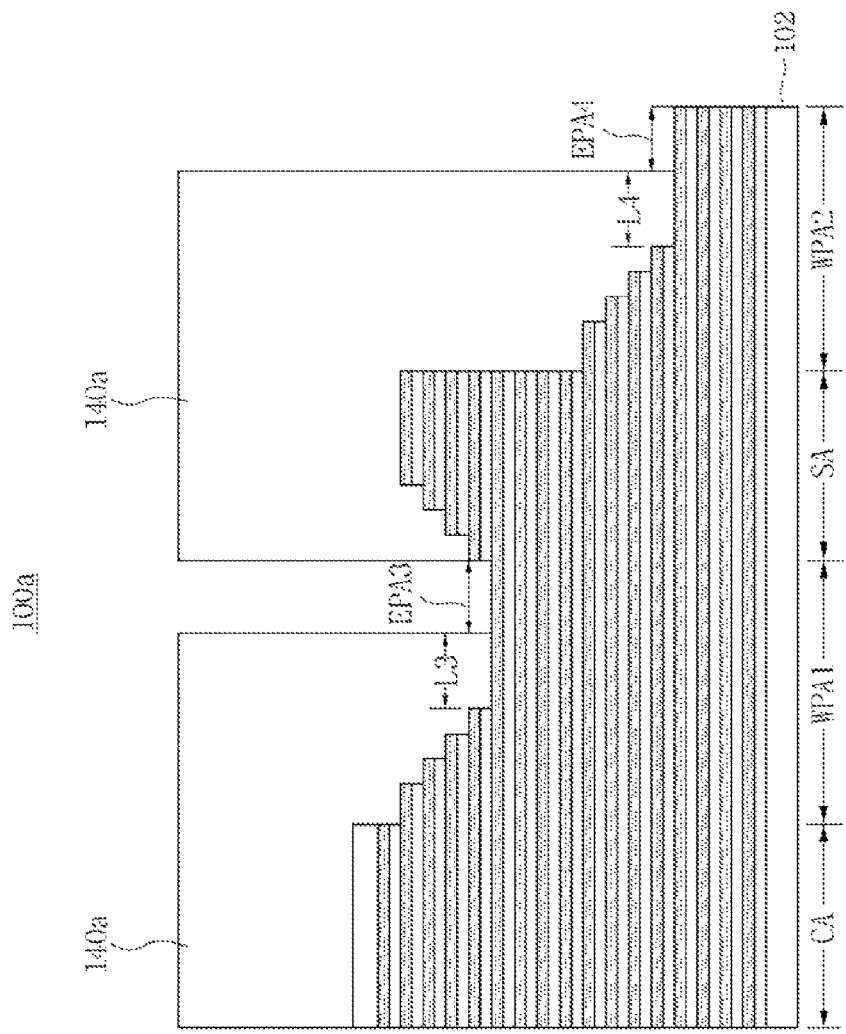

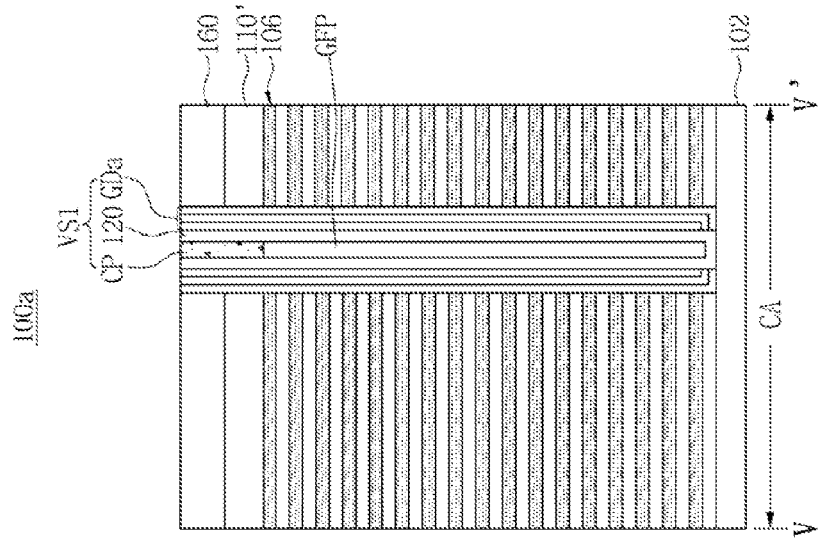

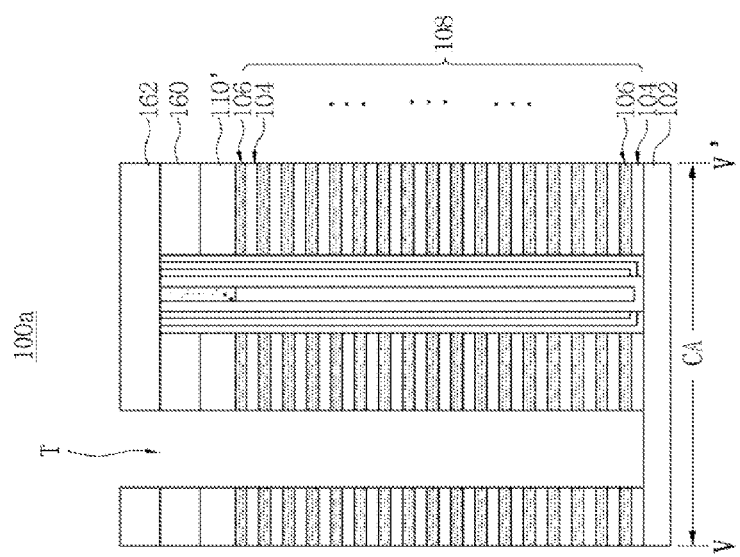

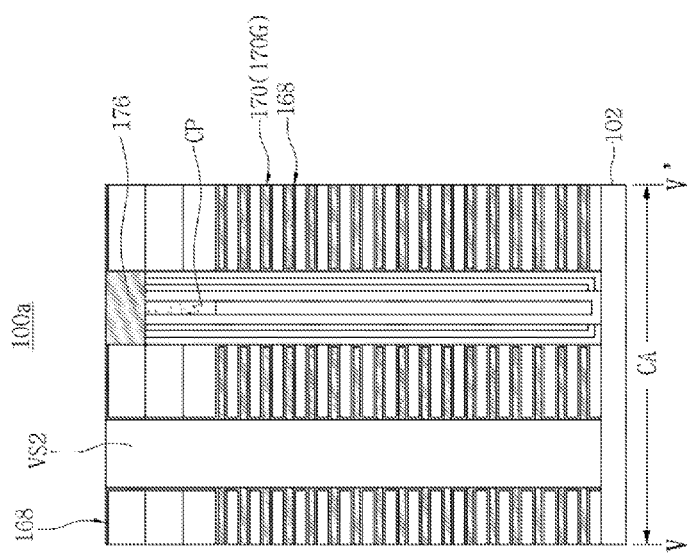

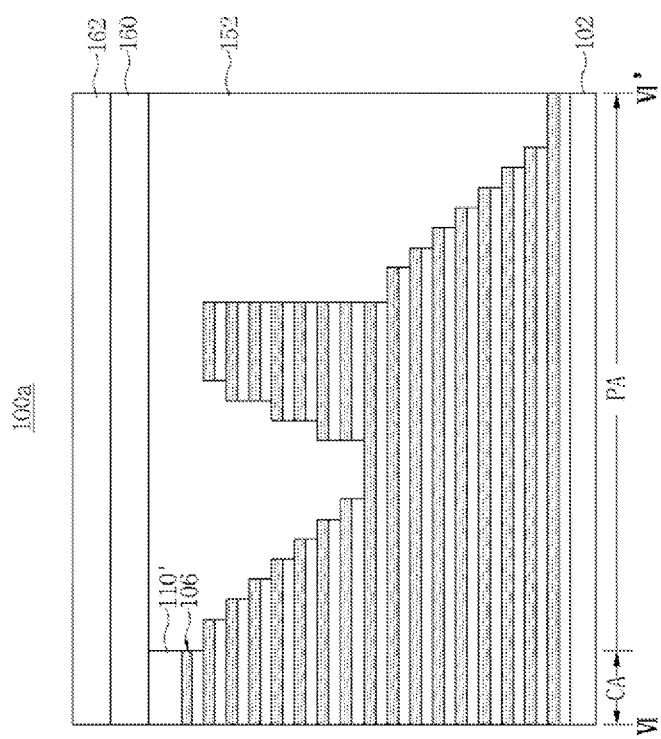

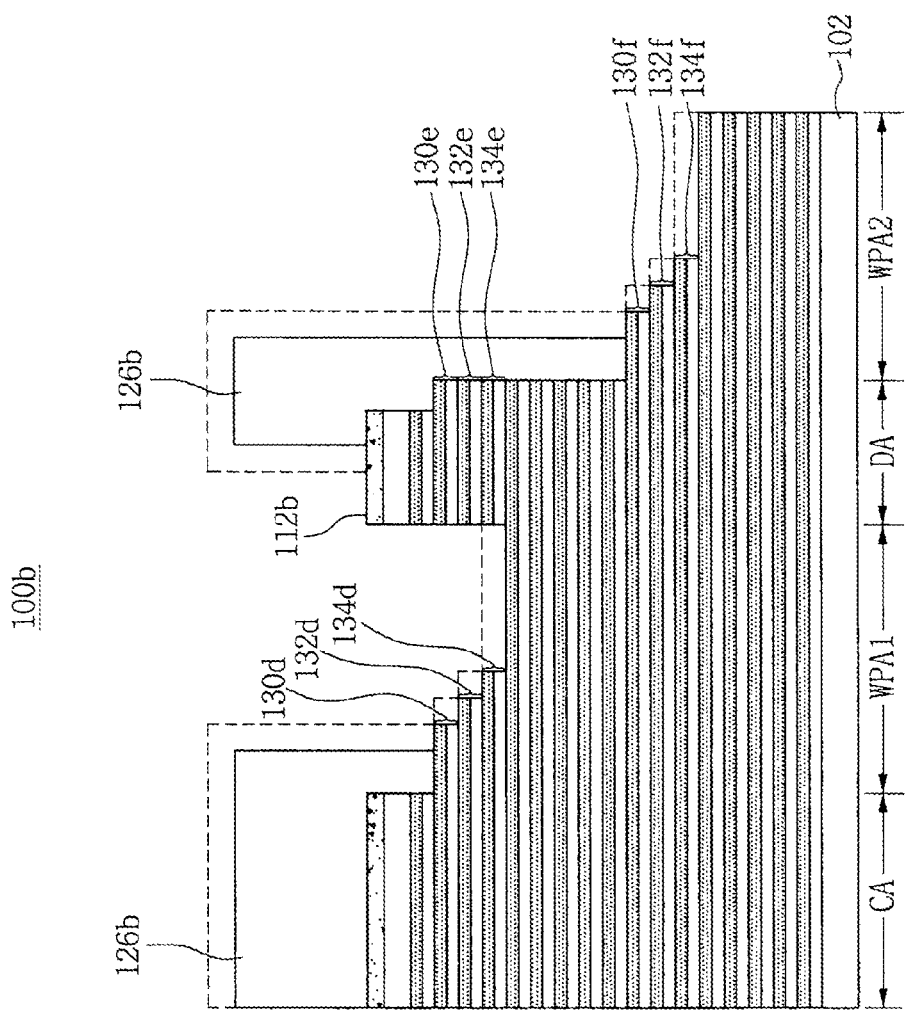

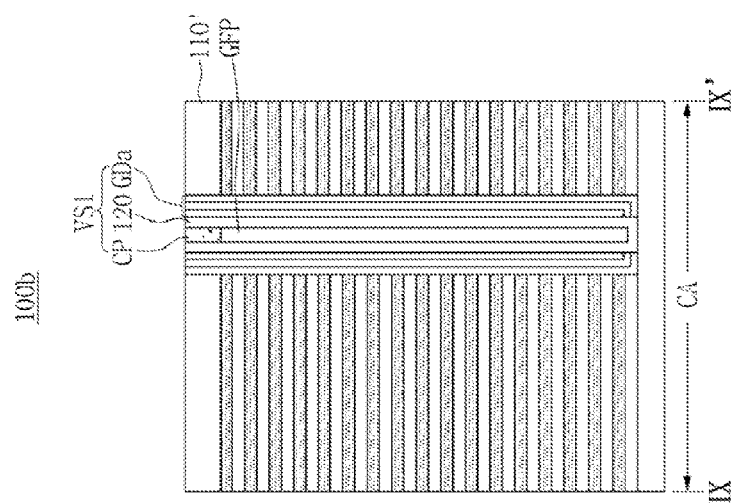

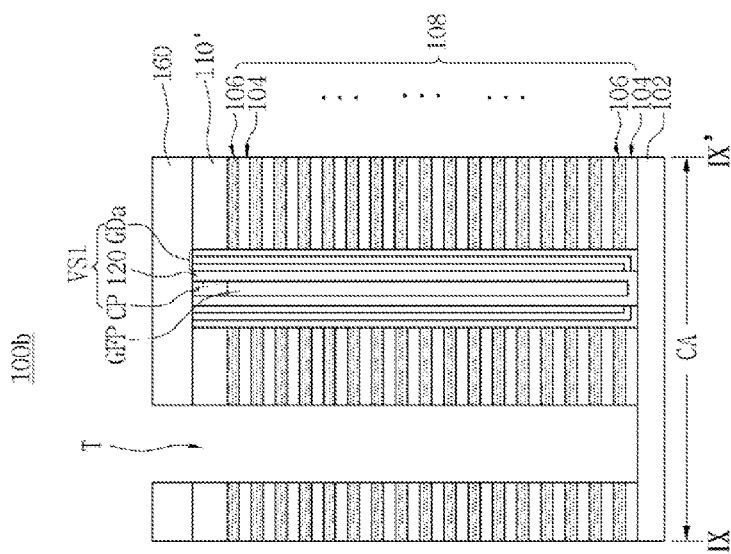

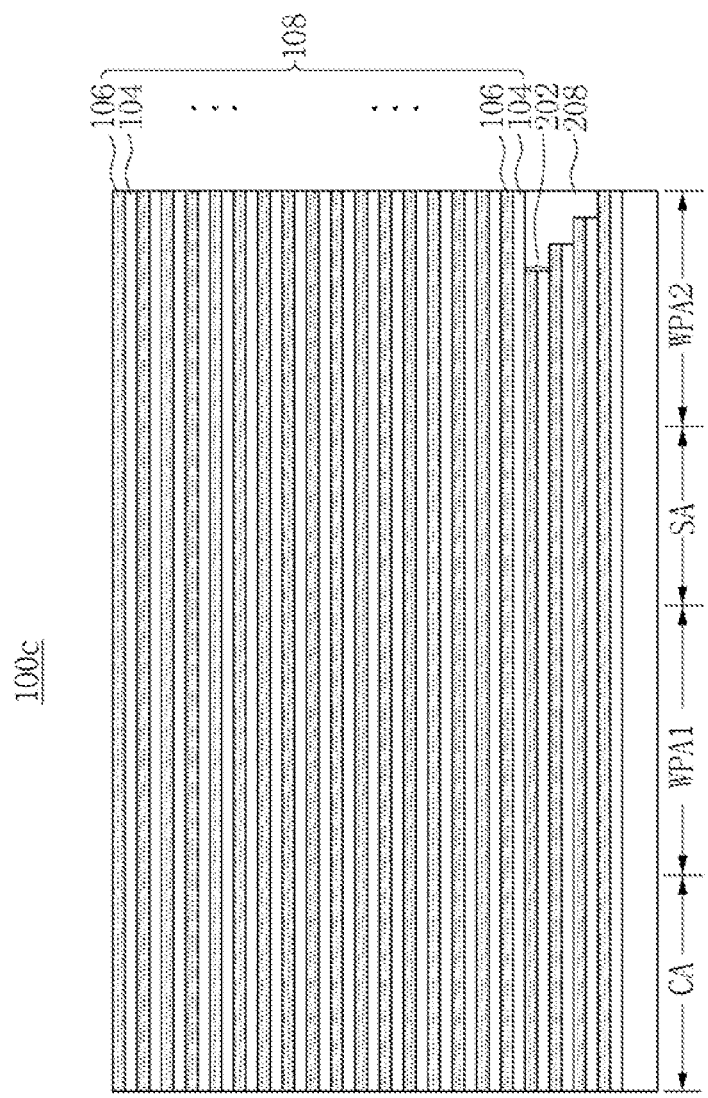

ional stack structure on the second pad area; forming a capping pattern on the preliminary stack structure; forming the first mask on an entire portion of the cell area, a portion of the first pad area, an entire portion of the sacrificial area, and a portion of the second pad area.

METHOD OF FABRICATING SEMICONDUCTOR DEVICES HAVING VERTICAL CELLS

CROSS-REFERENCE TO RELATED APPLICATION

This application is a divisional application of U.S. application Ser. No. 14/018,578, filed on Sep. 5, 2013, which claims priority under U.S.C. §119 to Korean Patent Application No. 10-2012-0141980 filed on Dec. 7, 2012, the disclosure of which is hereby incorporated by reference in its entirety.

BACKGROUND

1. Field

Example embodiments of inventive concepts relate to a method of fabricating semiconductor devices having vertical cells.

2. Description of Related Art

With rapid downscaling of integrated circuits (ICs), vertical-cell-type semiconductor devices in which planar elements are modified into vertical elements, have been proposed, and a process of forming pads of elements formed in a lengthwise direction, as a staircase type, has been suggested.

SUMMARY

Example embodiments of inventive concepts provide a method of fabricating a vertical-cell-type semiconductor device.

Example embodiments of inventive concepts also relate to a method of fabricating a semiconductor device, which may reduce the process time taken to form signal input terminals (or word pads) of elements formed in a vertical direction as a staircase type.

Features and/or objectives of example embodiments of inventive concepts are not limited to the above disclosure; other objectives may become apparent to those of ordinary skill in the art based on the following description.

In accordance with example embodiments of inventive concepts, a method of fabricating a semiconductor device includes: forming a preliminary stack structure including an upper preliminary stack structure on a lower preliminary stack structure by alternately stacking a plurality of interlayer insulating layers and a plurality of sacrificial layers on a substrate, the substrate including a cell area, a first pad area surrounding the cell area, a dummy area surrounding the first pad area, and a second pad area surrounding the dummy area; removing a portion of the upper preliminary stack structure on the second pad area; forming a first mask on an entire portion of the cell area, a portion of the first pad area, an entire portion of the sacrificial area, and a portion of the second pad area; forming first patterns in the upper preliminary stack structure and another first pattern in the lower preliminary stack structure by removing portions of the plurality of sacrificial layers and the plurality of interlayer insulating layers thereunder, which are not covered with the first mask; shrinking sides of the first mask to expose two opposite end portions of the first pattern on the first pad area and the dummy area, and one end portion of the other first pattern on the second pad area; forming second patterns in the upper preliminary stack structure and another second pattern in the lower preliminary stack structure by removing parts of the plurality of sacrificial layers and the plurality of interlayer insulating layers exposed by the shrunken first mask under the first patterns and the other first pattern while removing the portions of the first patterns and the other first pattern exposed by the shrunken first shrunken first mask; performing a staircase forming process that includes shrinking the sides of the first mask again to expose more of the first patterns, the other first pattern, the second patterns, and the other second pattern, and removing the more of the first patterns and the other first pattern exposed by the shrunken first mask while removing the more of the second patterns and the other second pattern exposed by the shrunken first mask, first patterns, and other first pattern, respectively; and forming a staircase structure and a dummy staircase structure in the upper preliminary stack structure while forming an other staircase structure in the lower preliminary stack structure after repeating the performing the staircase forming process a plurality of times. The staircase structure is on the first pad area. The dummy staircase structure is on the dummy area and spaced apart from the staircase structure. The other staircase structure is on the second pad area.

In example embodiments, the repeating the performing of the staircase forming process a first time may include forming a third pattern in the upper preliminary stack structure and another third pattern in the lower preliminary stack structure by removing parts of the plurality of sacrificial layers and the plurality of interlayer insulating layers thereunder, which are not covered with the shrunken first mask while removing the portions of the first to second patterns and other first to second patterns exposed by the shrunken first mask, shrinking again the sides of the shrunken first mask, and exposing the end portions of the first to second patterns and other first to second patterns exposed by the re-shrunken first mask at the same time. The method may further include, before the forming of the first pattern, forming a dummy pattern on the first pattern of the first pad area to form a staircase along with the first pattern of the first pad area.

In example embodiments, the method may further include: forming an added stack structure on the substrate before the forming the preliminary stack structure, the added stack structure including end portions that define a staircase structure in the added stack structure on the second pad area; forming an insulating layer at a same level as a surface of the added stack structure to cover the end portions of the staircase structure in the added stack structure. The added stack structure may include sacrificial layers and interlayer insulating layers stacked alternately and repetitively on the substrate.

In example embodiments, the plurality of interlayer insulating layers may include silicon oxide, and the plurality of sacrificial layers may include silicon nitride.

In example embodiments, a length of the portion of the first pad area covered by the first mask may correspond to a length of a bottom step on the first pad area of the staircase structure to be formed, a length of the portion of the second pad area covered by the first mask may correspond to a length of a bottom step of the other staircase structure to be formed.

In example embodiments, the forming the staircase structure and the dummy staircase structure while forming the other staircase structure may include forming the staircase structure and the other staircase structure from an equal number of the plurality of interlayer insulating layers and the plurality of sacrificial layers, and forming the dummy staircase structure from one less interlayer insulating layer and one less sacrificial layer compared to the equal number of the plurality of interlayer insulating layers and the plurality of sacrificial layers.

In example embodiments, the method may include: forming a capping pattern on the preliminary stack structure before the removing the portion of the upper preliminary stack structure on the second pad area; forming an insulating layer on the staircase structure, the dummy staircase structure, the other staircase structure, the first pad area, the dummy area, and the second pad area, where a level of the insulating layer may be equal to a level of the capping pattern; forming through holes through the capping pattern and the preliminary stack structure on the cell area to expose the substrate; forming first vertical structures including a channel pattern and a gate dielectric layer in the through holes; forming trenches through the capping pattern and the preliminary stack structure, the trenches extending in one horizontal direction; removing the plurality of sacrificial layers to form interlayer spaces between remaining portions of the plurality of interlayer insulating layers; forming a blocking layer on surfaces of the remaining portions of the plurality of interlayer insulating layers exposed by the interlayers spaced; forming conductive layers to fill the interlayer spaces; forming second vertical structures in the trenches; forming first vias through the capping pattern to expose the channel pattern; forming second vias through the insulating layer and the capping pattern of the first and second pad areas; forming first contact electrodes electrically connected to the channel patterns through the first vias; and forming second contact electrodes electrically connected to the staircase structure and the other staircase structure through the second vias on the first and second pad areas. The trenches may extend from the cell area to the first pad area, the dummy area, and the second pad area. The second vertical structures may include silicon oxide. The forming the second vias may include an etching process having an etch selectivity with respect to the conductive layer and the insulating layer, and vias to be formed may be divided by a desired number according to the height of the second vias, and the divided vias may be formed using separate processes.

In accordance with example embodiments of inventive concepts, a method of fabricating a semiconductor device includes: forming a preliminary stack structure including an upper preliminary stack structure and a lower preliminary stack structure by alternately stacking interlayer insulating layers and sacrificial layers on a substrate, the substrate including a cell area, a first pad area, a dummy area, and a second pad area; removing a portion of the upper preliminary stack structure on the second pad area; forming an etch stop pattern on a top surface of the upper preliminary stack structure on the dummy area; forming a first mask to cover an entire portion of the cell area, a portion of the first pad area, an entire portion of the dummy area, and a portion of the second pad area; forming first patterns in the upper preliminary stack structure and another first pattern in the lower preliminary stack structure by removing parts of sacrificial layers and interlayer insulating layers exposed by the first mask, the first patterns being on the first pad area and the dummy area, and the other first pattern being on the second pad area; shrinking sides of the first mask to expose end portions of the first pattern on the first pad area and the other first pattern on the second pad area; forming seconds pattern in the upper preliminary stack structure and another second pattern in the lower preliminary stack structure by removing parts of sacrificial layers and interlayer insulating layers exposed by the shrunken first mask, the first pattern, and the other first pattern while removing the portions of the first pattern and the other first pattern exposed by the shrunken first mask; performing a staircase forming process; and forming a staircase structure and a dummy preliminary stack structure in the upper preliminary stack structure while forming an other staircase structure in the lower preliminary stack structure after repeating the performing the staircase forming process. The staircase forming process includes: shrinking the sides of the first mask again to expose more of the first pattern, the second pattern, the other first pattern, and the other second pattern; and removing the more of the first pattern and the other first pattern exposed by the shrunken first mask while removing the more of the second pattern and the other second pattern exposed by the shrunken first mask, first pattern, and other first pattern, respectively. The staircase structure is on the first pad area. The dummy preliminary stack structure is on the dummy area and spaced apart from the staircase structure. The other staircase structure is on the second pad area.

In example embodiments, the etch stop pattern may include polysilicon (poly-Si).

In example embodiments, a lowermost one of the sacrificial layers and a lowermost one of the insulating layer in the upper preliminary stack structure extends from the cell area to the dummy area after the forming the staircase structure and the dummy staircase structure, and the staircase structure and the dummy staircase structure may expose an upper surface of an underlying one of the sacrificial layers.

According to example embodiments, a method of fabricating a semiconductor device includes: forming a preliminary stack structure including an upper preliminary stack structure on a lower preliminary stack structure by alternately stacking a plurality of insulating layers and a plurality of sacrificial layers on a substrate, the substrate including a cell area, a first pad area surrounding the cell area, a dummy area surrounding the first pad area, and a second pad area surrounding the dummy area; removing an entire portion of the upper preliminary stack structure on the second pad area; forming a first mask on the substrate, the first mask defining openings over parts of the first pad area and the second pad area and the first mask covering the cell area and dummy area of the substrate; etching an etch depth through a remaining part of the preliminary stack structure exposed by the first mask, the etch depth corresponding to thicknesses of one of the plurality of interlayer insulating layers and one of the plurality of sacrificial layers; performing a first staircase forming process that includes shrinking sides of the first mask to increase a size of the openings and etching the etch depth through remaining parts of the plurality of interlayer insulating layers and the plurality of sacrificial layers exposed by the shrunken first mask; and repeating the first staircase forming process.

In example embodiments, the method may include forming a second mask on the substrate after the first staircase forming process is repeated, the second mask defining a first exposed area over the first pad area adjacent to the dummy area and a second exposed area over the second pad area; etching the etch depth through a remaining portion of the preliminary stack structure exposed by the second mask; performing a second staircase forming process that includes shrinking sides of the second mask to increase size of the first and second exposed areas and etching the etch depth through remaining parts of the plurality of interlayer insulating layers and the plurality of sacrificial layers exposed by the shrunken second mask; and repeating the second staircase forming process.

In example embodiments, the method may include forming a poly-si-layer on the preliminary stack structure before the removing the entire portion of the upper preliminary stack structure on the second pad area.

In example embodiments, the forming the preliminary stack structure may include forming an added stack structure from some of the plurality of interlayer insulating layers and the plurality of sacrificial layers alternately stacked between the lower preliminary stack structure and the substrate; and the method may further include converting sidewalls of the some of the plurality of interlayer insulating layers and the some of the plurality of sacrificial layers to a staircase structure on the second pad area.

In example embodiments, the plurality of interlayer insulating layers may include silicon oxide, and the plurality of sacrificial layers may include silicon nitride.

BRIEF DESCRIPTION OF THE DRAWINGS

The foregoing and other features and advantages of example embodiments of inventive concepts will be apparent from the more particular description of non-limiting embodiments, as illustrated in the accompanying drawings in which like reference characters refer to the same parts throughout the different views. The drawings are not necessarily to scale, emphasis instead being placed upon illustrating principles of example embodiments of inventive concepts. In the drawings:

FIGS. 5A through 5G and 6A through 6G are cross-sectional views taken along lines V-V' and VI-VI' of FIG. 4, which illustrate process operations of a method of fabricating the vertical-cell-type semiconductor device shown in FIGS. 1A and 1B;

FIGS. 9A through 9D and FIGS. 10A through 10D are cross-sectional views taken along lines IX-IX' and X-X' of FIG. 8, which illustrate process operations of a method of fabricating the semiconductor device shown in FIGS. 2A and 2B;

FIGS. 11A through 11G are process cross-sectional views of process operations of a method of fabricating a vertical-cell-type semiconductor device according to example embodiments of inventive concepts;

DETAILED DESCRIPTION

Figure 1A:
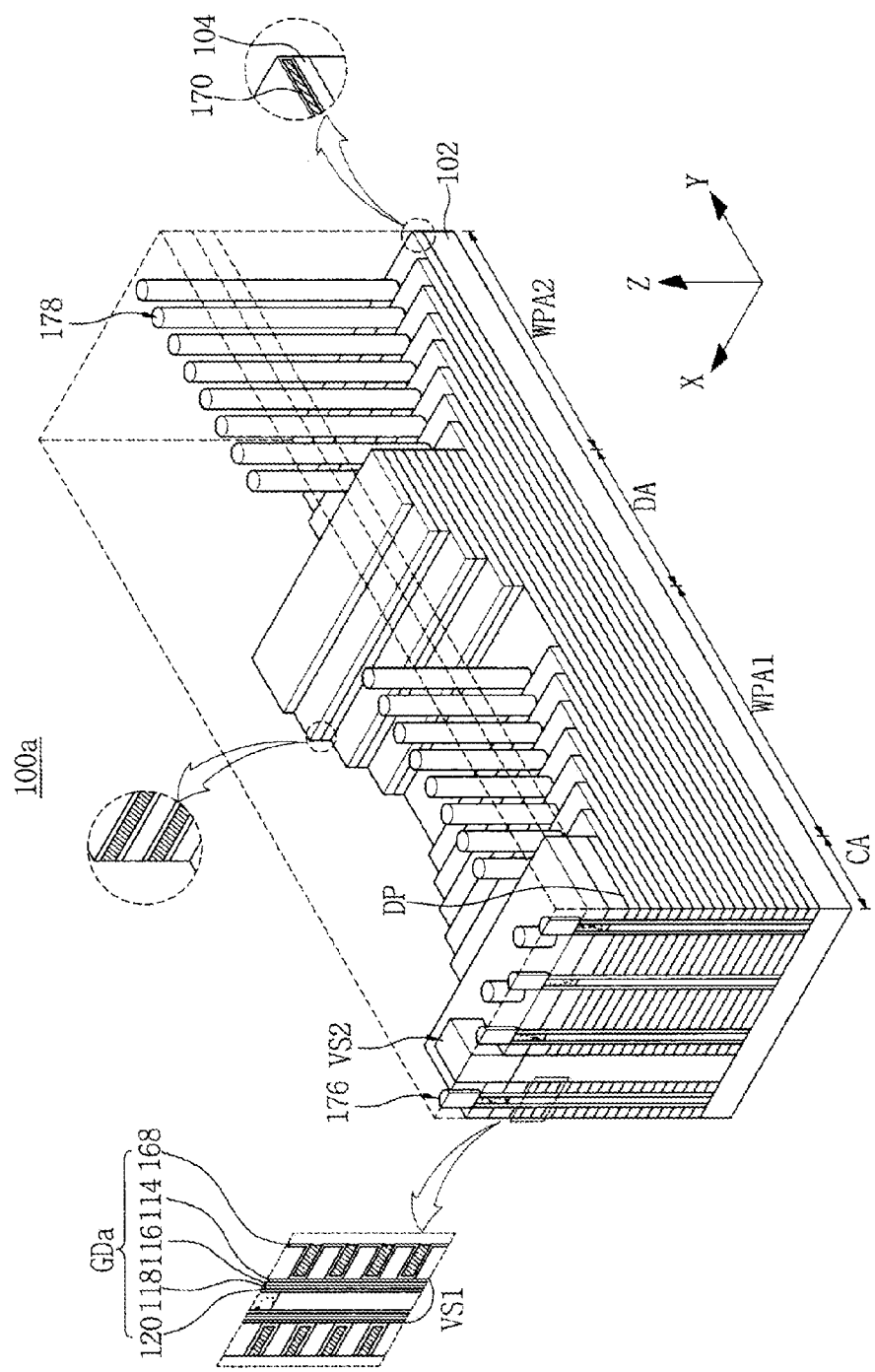
FIG. 1A is a perspective view of a vertical-cell-type semiconductor device according to example embodiments of inventive concepts.

Example embodiments of inventive concepts will now be described more fully with reference to the accompanying drawings, in which some example embodiments of inventive concepts are shown. Example embodiments of inventive concepts may, however, be embodied in many different forms and should not be construed as being limited to the embodiments set forth herein; rather, these example embodiments of inventive concepts are provided so that this disclosure will be thorough and complete, and will fully convey the scope of inventive concepts to those skilled in the art.

In the drawings, the thicknesses of layers and regions may be exaggerated for clarity. Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
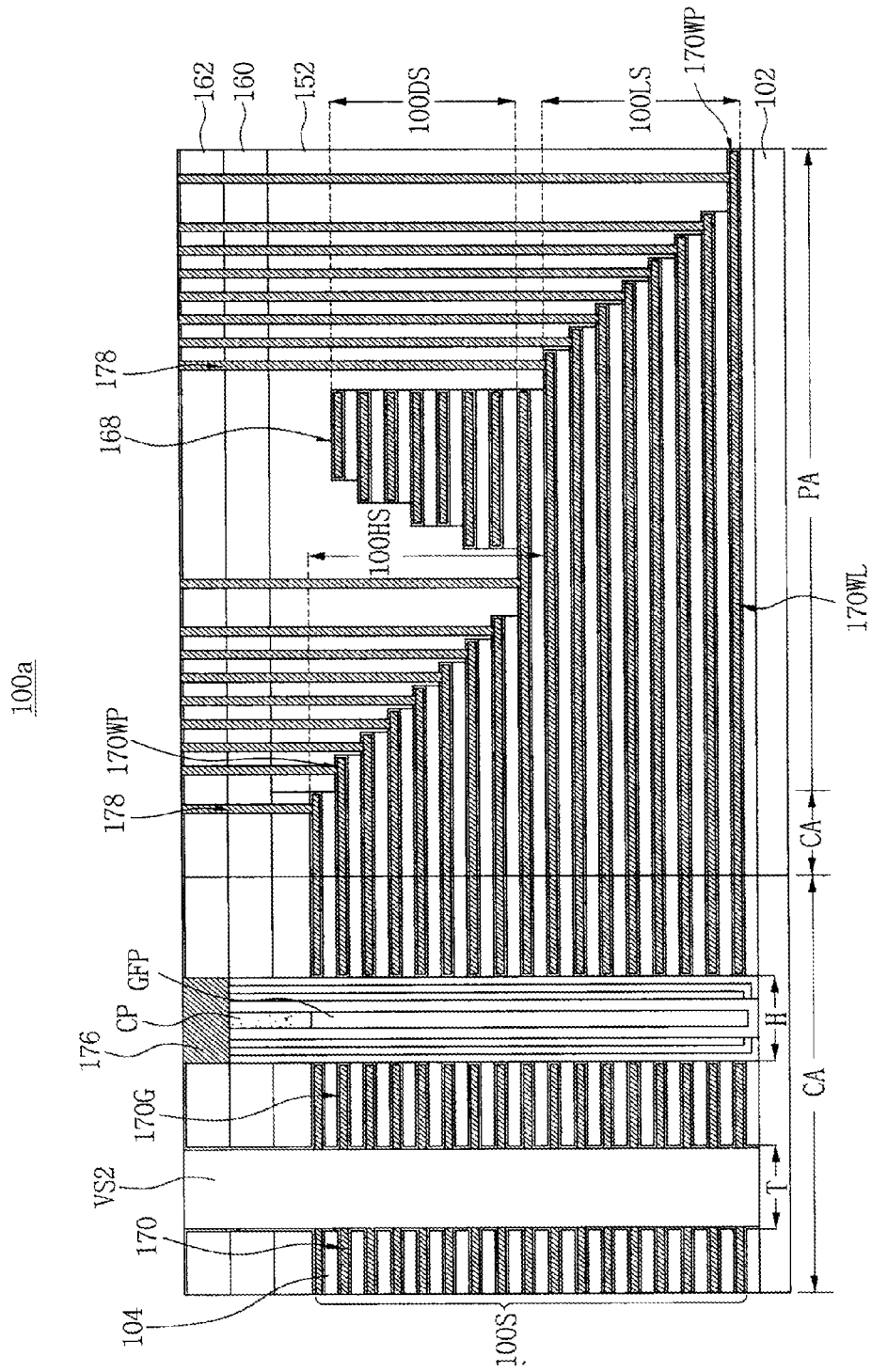
FIG. 1B is a cross-sectional view of a portion of an X-axial plane surface and a Y-axial plane surface of FIG. 1A.

FIG. 1A is a perspective view of a vertical-cell-type semiconductor device 100a according to example embodiments of inventive concepts, and FIG. 1B is a cross-sectional view of a portion of an X-axial plane surface and a Y-axial plane surface of FIG. 1A.

Referring to FIGS. 1A and 1B, according to example embodiments of inventive concepts, the vertical-cell-type semiconductor device 100a may include a substrate 102, and a stack structure 100S formed on the substrate 102. The stack structure 100S may include an upper stack structure 100HS and a lower stack structure 100LS into which the stack structure 100S is vertically halved.

The substrate 102 may include a cell area CA, a first pad area WPA1, a dummy area DA, and a second pad area WPA2. The stack structure 100S and a first vertical structure VS1 and a second vertical structure VS2, which may penetrate the stack structure 100S, may be formed in the cell area CA.

The upper stack structure 100HS may extend to the first pad area WPA1, and the lower stack structure 100LS may extend to the second pad area WPA2. A dummy stack structure 100DS may be separated from the upper stack structure 100HS and formed in the dummy area DA.

Each of the lower stack structure 100LS and the upper stack structure 100HS may include n patterns stacked, and the dummy stack structure 100DS may include n−1 floating patterns stacked. A dummy pattern DP may be further formed on the upper stack structure 100HS. The dummy pattern may be used as an element.

One end portions of the respective patterns of the lower stack structure 100LS may be formed as a staircase type in the second pad area WPA2. One end portions of the respective patterns of the upper stack structure 100HS may be formed as a staircase type in the first pad area WPA1.

One end portions of the respective patterns of the dummy stack structure 100DS formed in the dummy area DA, which may face the respective patterns of the upper stack structure 100HS, may be formed as a staircase type. Unlike in the first and second pad areas WPA1 and WPA2, two patterns may be formed in one staircase form.

Each of the upper stack structure 100HS, the lower stack structure 100LS, and the dummy stack structure 100DS may include interlayer insulating layers 104 and conductive layers 170 stacked alternately and repetitively. Each of the patterns may include an interlayer insulating layer 104 and conductive layer 170.

For brevity, in the upper stack structure 100HS and the lower stack structure 100LS, a portion of each of the conductive layers 170, which is close to the first vertical structure VS1 of the cell area CA, may be referred to as a gate electrode 170G, a portion of each of the conductive layers 170, which extends from the gate electrode 170G into the first pad area WPA1 and the second pad area WPA2, may be referred to as a word line 170WL, and an end portion of the word line 170WL, which may directly receive signals, may be referred to as a word pad 170WP.

The first vertical structure VS1 may include a gate dielectric layer GDa formed along an inner wall of the through hole H, a channel pattern 120 formed as a cylindrical type along an inner wall of the gate dielectric layer GDa, a gap-fill pattern GFP formed in the center of the through hole H to fill the inside of the channel pattern 120, and a contact pad CP configured to fill an upper portion of the gap-fill pattern GFP and contact the channel pattern 120. The gate dielectric layer GDa may include a blocking layer 168, a barrier layer 114, a charge trap layer 116, and a tunneling layer 118. The blocking layer 168 may contact and surround top and bottom surfaces and one side surface of each of the gate electrodes 170G.

The second vertical structure VS2 may have a fence shape to fill the trench T.

In addition, the vertical-cell-type semiconductor device 100a may include contact electrodes 176 configured to contact the contact pads CP, and pad contact electrodes 178 formed in the first and second pad areas WPA1 and WPA2 and configured to contact data pads 170WP.

The substrate 102 may be a semiconductor substrate, for example, a silicon (Si) substrate, a silicon-germanium (Si—Ge) substrate, or a silicon on insulator (SOI) substrate.

The interlayer insulating layers 104 included in the stack structure 100S may include an insulating material such as silicon oxide ($SiO_2$), and the conductive layers 170 may include a conductive material, such as tungsten (W), copper (Cu), aluminum (Al), titanium (Ti), titanium nitride (TiN), tantalum (Ta), or a doped silicon (e.g., an n or p-type Si).

The barrier layer 114 of the gate dielectric layer GDa may include silicon oxide. The charge trap layer 116 may be a material having a higher dielectric constant than silicon oxide. For example, the charge trap layer 116 may include silicon nitride (SiNx), aluminum oxide ($Al_2O_3$), zirconium oxide (ZrO), hafnium oxide (HfO), and lanthanum oxide (LaO). The tunneling layer 118 may include silicon oxide or nitrogen (N)-doped silicon oxide. The blocking layer 168 may include an insulating material having a large work function or a dielectric constant, such as aluminum oxide ($Al_2O_3$) or hafnium oxide ($HfO_2$). The channel pattern 120 may include a semiconductor material, such as single crystalline silicon or poly-crystalline silicon (poly-Si).

The contact pad CP may include a conductive material or a semiconductor material, such as single crystalline silicon or poly-Si. The first capping pattern 110' may include an insulating material, such as silicon oxide ($SiO_2$), and contact electrode 176 and the pad contact electrode 178 may include a conductive material, such as copper (Cu), tungsten (W), or aluminum (Al).

Among the plurality of gate electrodes 170G, a lowermost gate electrode may be used as a ground selection gate electrode, an uppermost gate electrode may be used as a string selection gate electrode, and gate electrodes 170G formed between the ground selection gate electrode and the string selection gate electrode may be used as cell gate electrodes. The gate electrode 170G and the gate dielectric layer GDa and the channel pattern 120, which are in contact with the gate electrode 170G, may constitute a transistor.

Figure 2A:
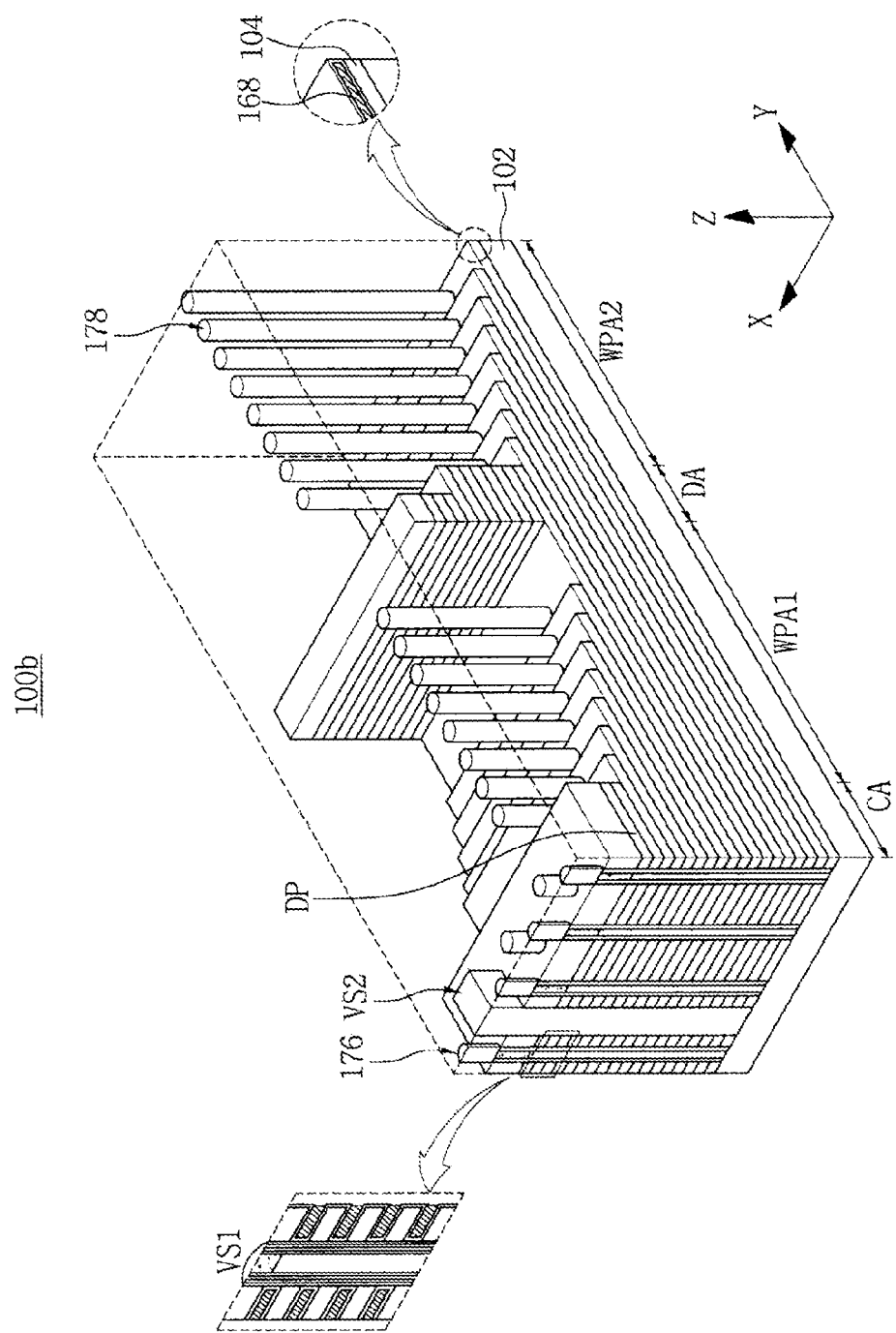
FIG. 2A is a perspective view of a vertical-cell-type semiconductor device according to example embodiments of inventive concepts.
Figure 2B:
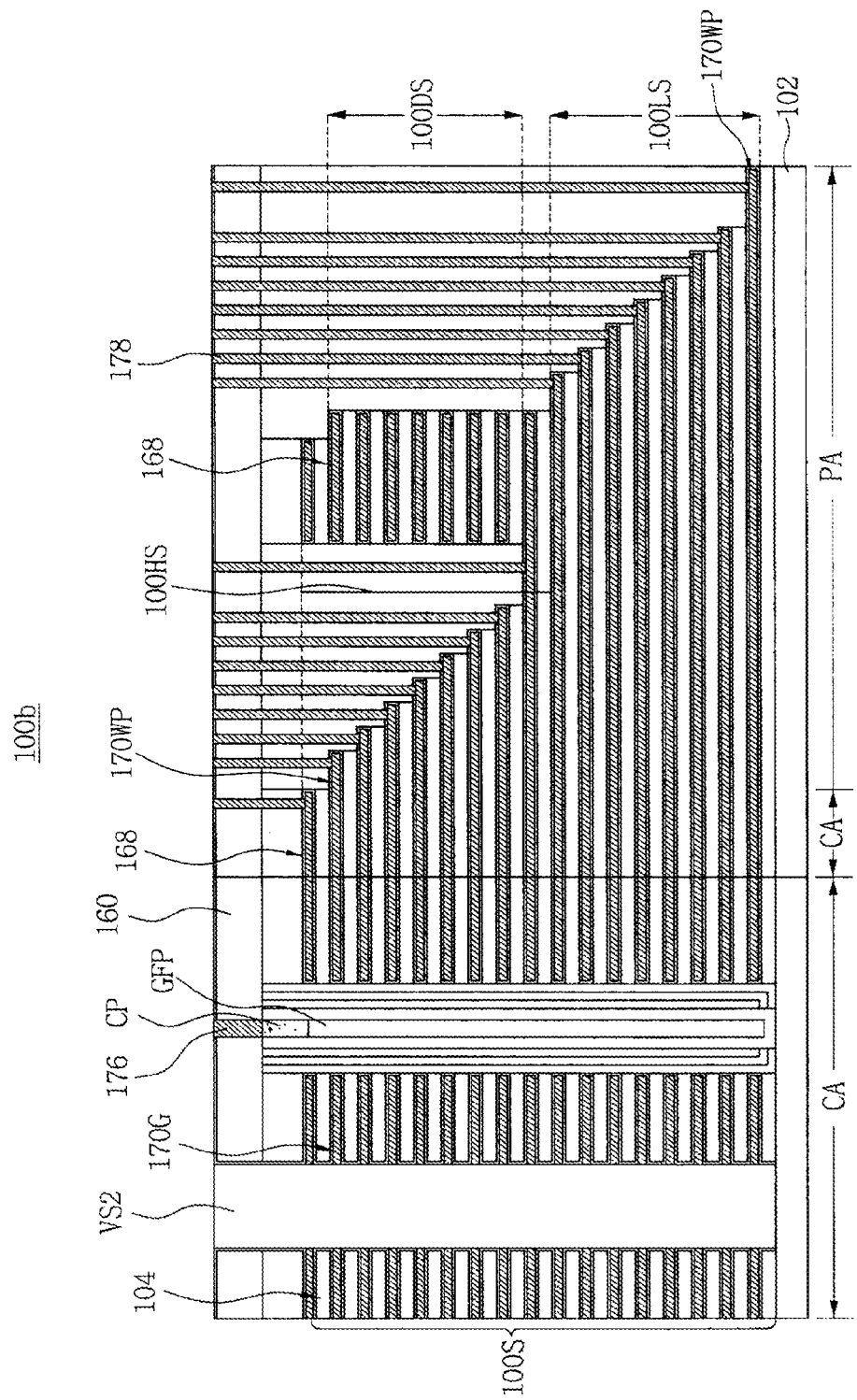
FIG. 2B is a cross-sectional view of a portion of an X-axial plane surface and a Y-axial plane surface of FIG. 2A.

FIG. 2A is a perspective view of a vertical-cell-type semiconductor device according to example embodiments of inventive concepts, and FIG. 2B is a cross-sectional view of a portion of an X-axial plane surface and a Y-axial plane surface of FIG. 2A.

Referring to FIGS. 2A and 2B, according to example embodiments of inventive concepts, a vertical-cell-type semiconductor device 100b may include a substrate 102, and a stack structure stack structure 100S formed on the substrate 102. The stack structure 100S may include an upper stack structure 100HS and a lower stack structure 100LS into which the stack structure 100S is halved.

The stack structure 100S and a first vertical structure VS1 and a second vertical structure VS2, which may penetrate the stack structure 100S, may be formed in the cell area CA.

The upper stack structure 100HS may extend to the first pad area WPA1, and the lower stack structure 100LS may extend to the second pad area WPA2. A dummy stack structure 100DS may be separated from the upper stack structure 100HS and formed in the dummy area DA. Each of the lower stack structure 100LS and the upper stack structure 100HS may include n patterns stacked, and the dummy stack structure 100DS may include n−1 floating patterns stacked. A dummy pattern DP may be further formed on the upper stack structure 100HS.

One end portions of the respective patterns of the lower stack structure 100LS may be formed as a staircase type in the second pad area WPA2, and one end portions of the respective patterns of the upper stack structure 100HS may be formed as a staircase type in the first pad area WPA1.

One side surfaces of the respective patterns of the dummy stack structure 100DS formed in the dummy area DA, which face the respective patterns of the upper stack structure 100HS, may be vertically aligned.

In according to example embodiments of inventive concepts, a staircase forming process may be simultaneously performed in both the first pad area WPA1 and the second pad area WPA2. Thus, the time taken to form word pads 170WP, which are end portions of the respective word lines 170WL, in a staircase form, may be reduced. In this connection, processes of fabricating the semiconductor device according to example embodiments of inventive concepts will now be described with reference to the following drawings.

Figure 3A:
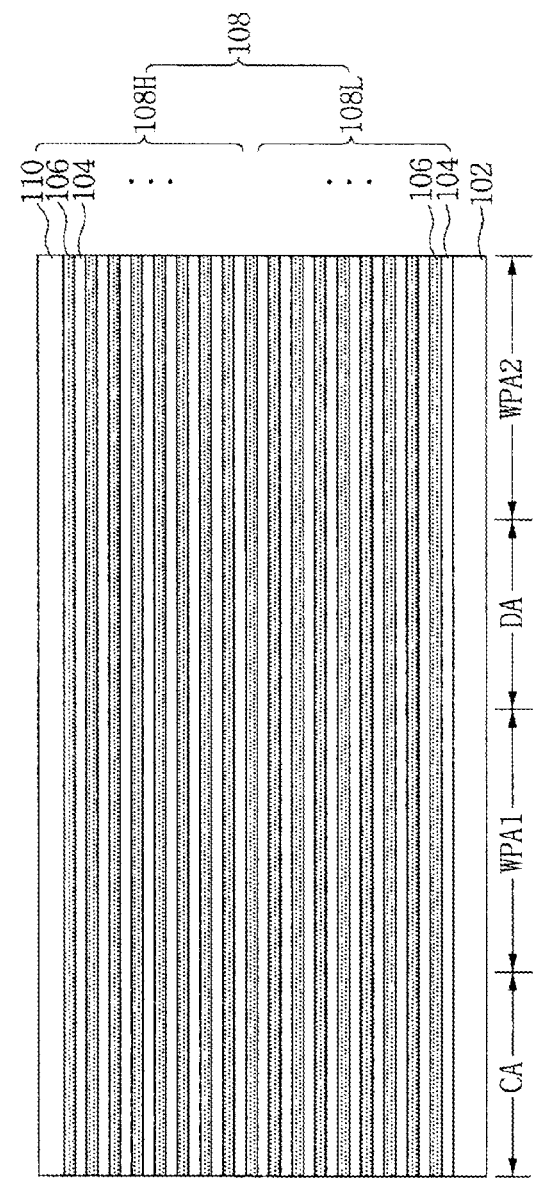
FIGS. 3A through 3P are cross-sectional views of process operations of a method of fabricating the vertical-cell-type semiconductor device shown in FIGS. 1A and 1B, according to example embodiments of inventive concepts.
Figure 3B:
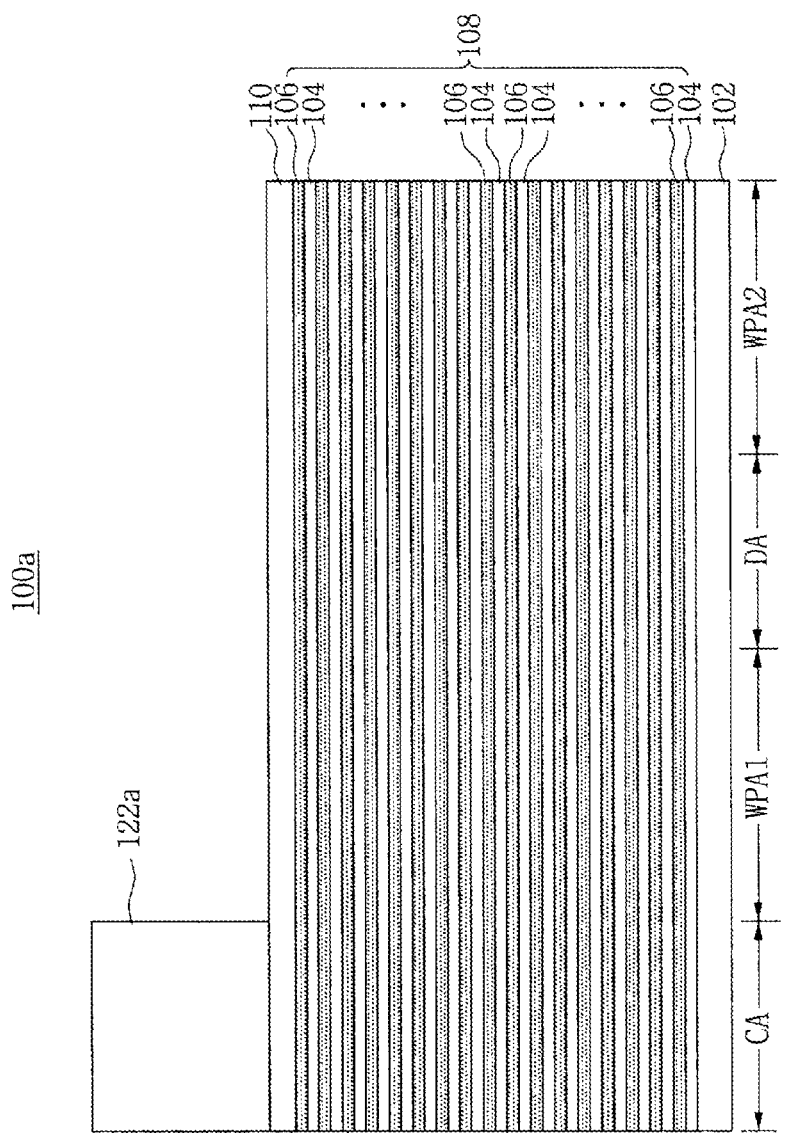
Figure 3C:
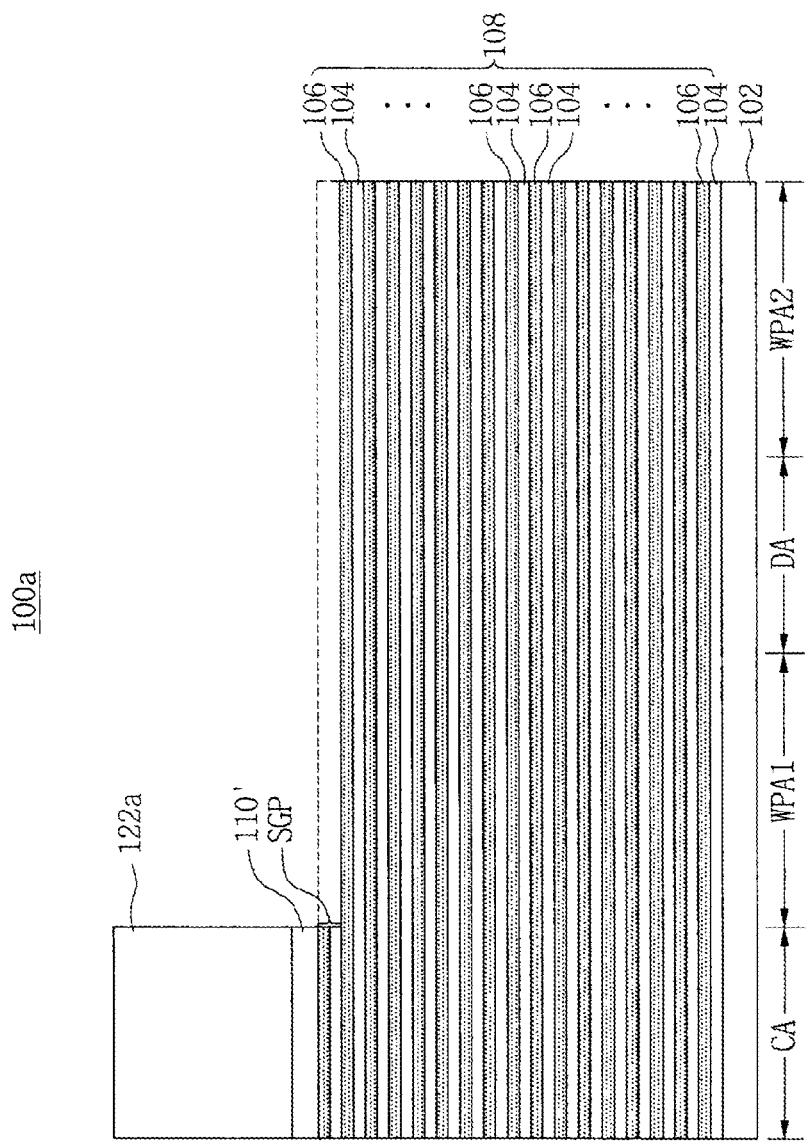
Figure 3E:
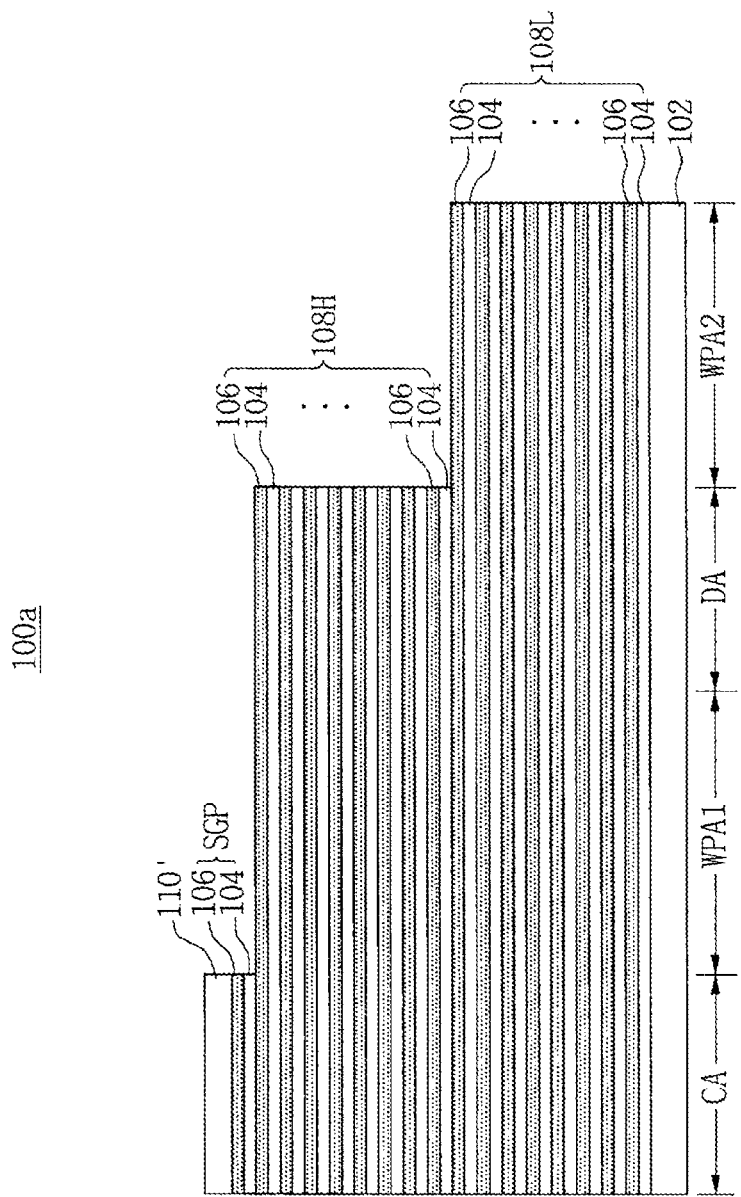
Figure 3F:
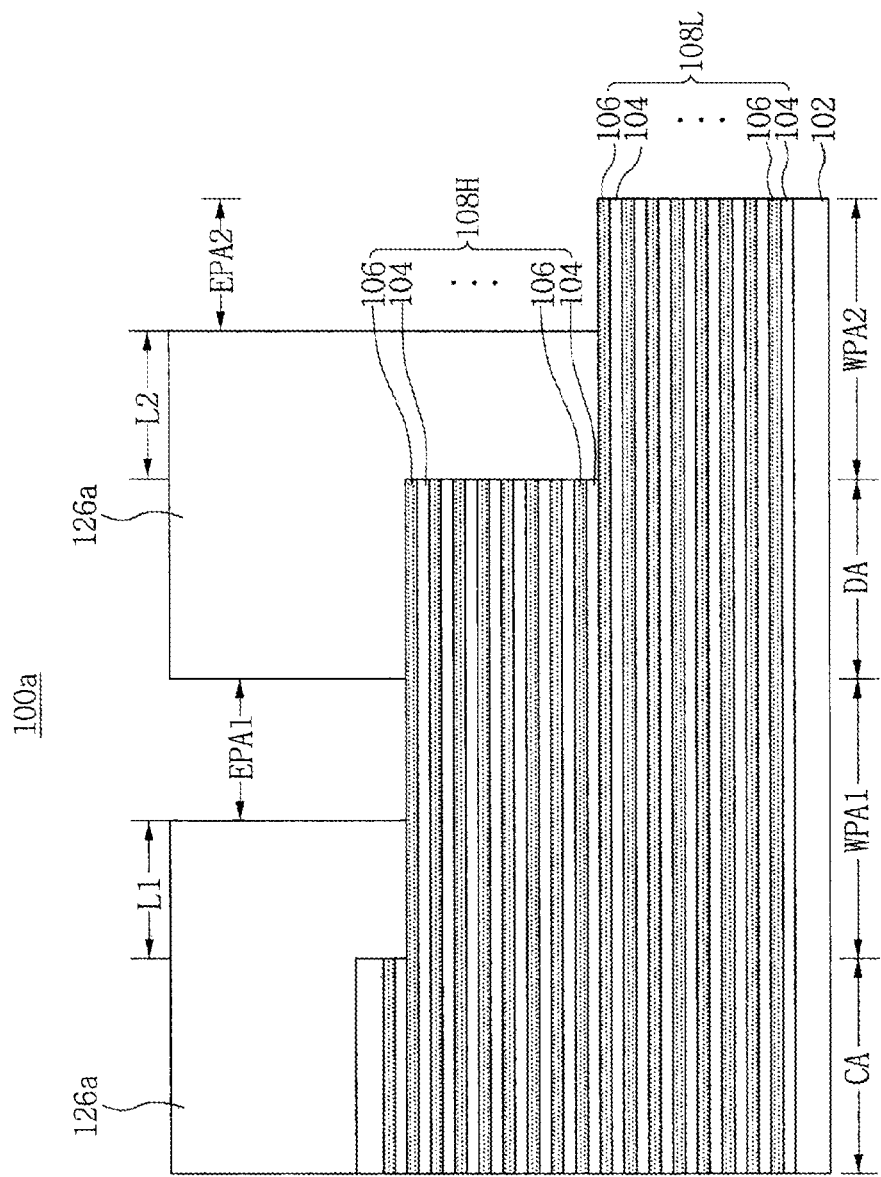
Figure 3G:
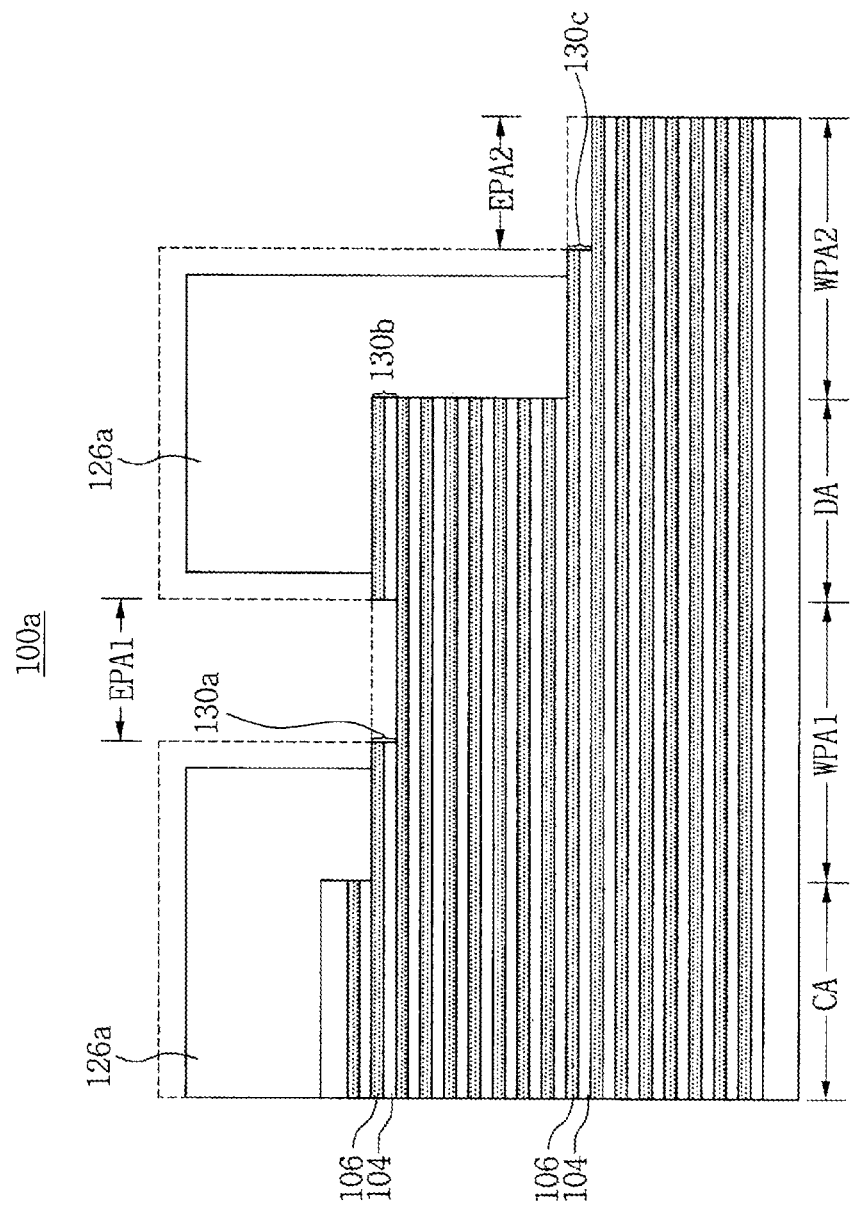
Figure 3H:
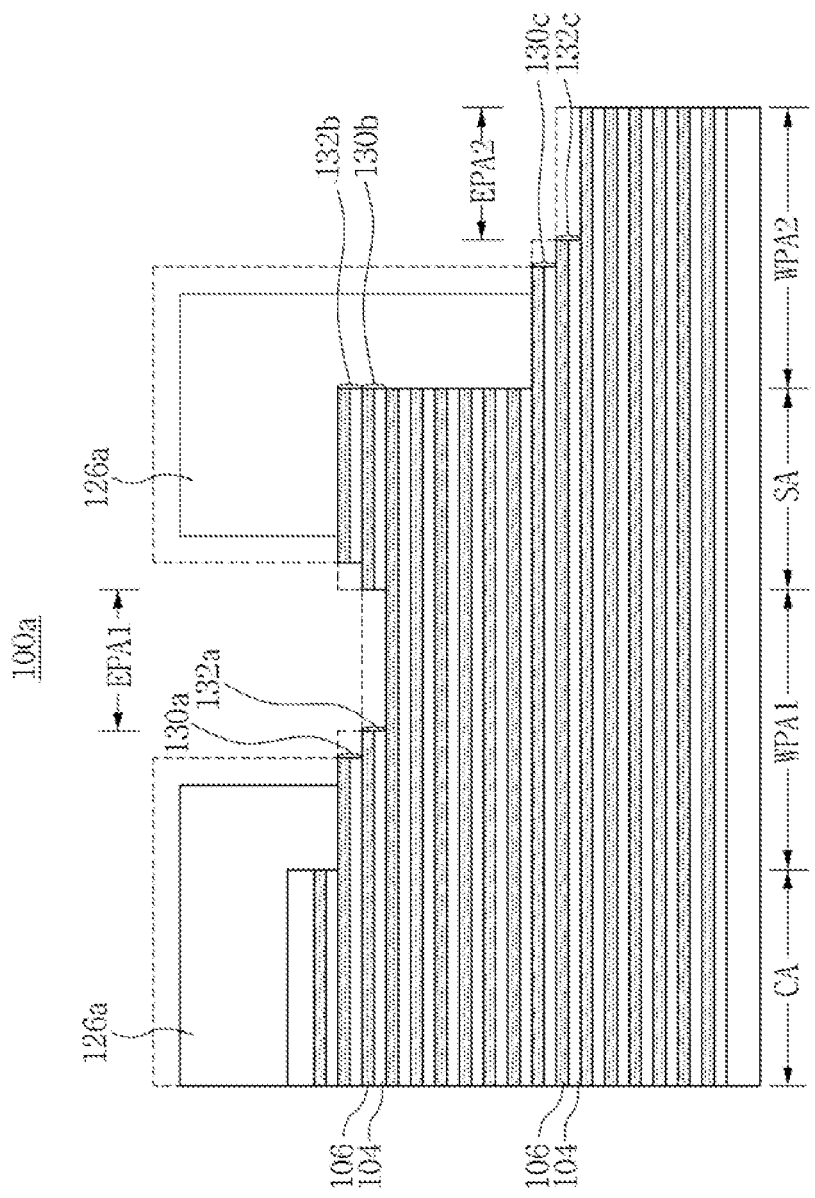
Figure 3I:
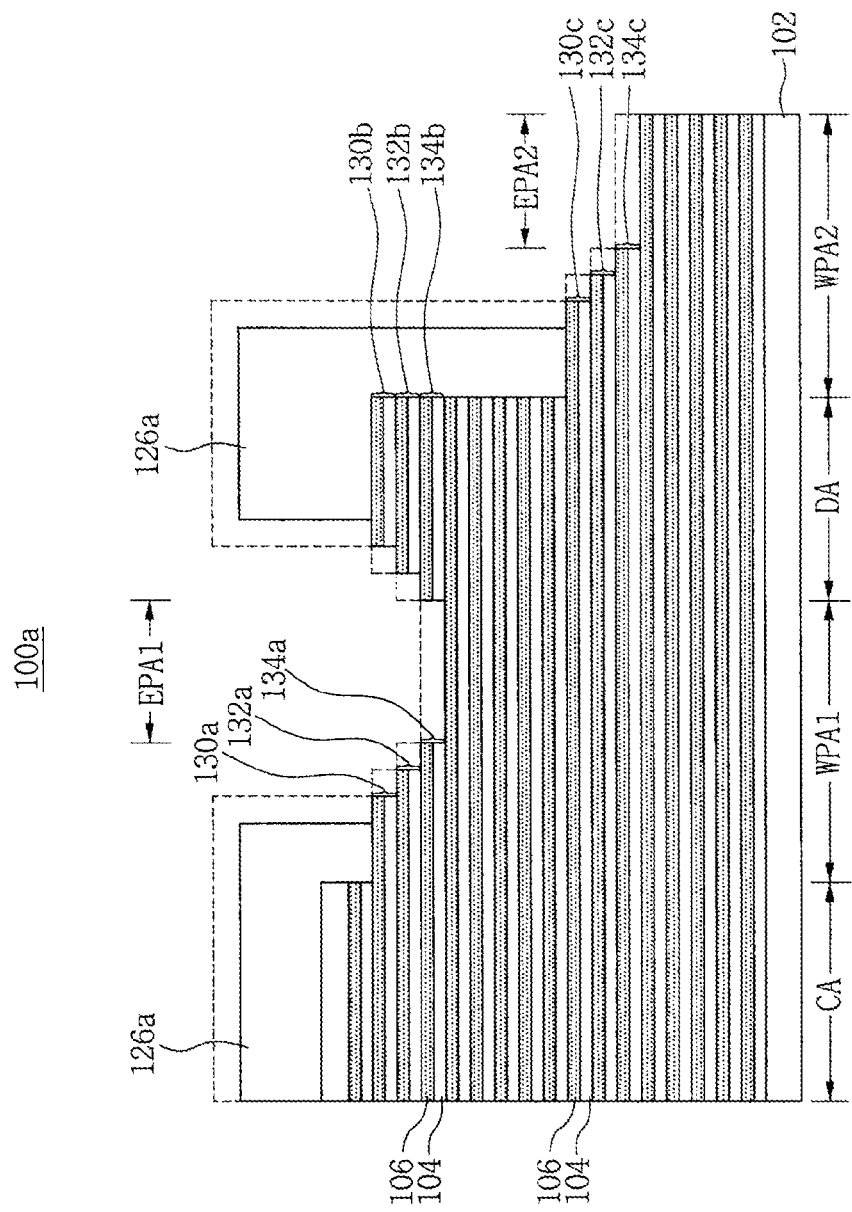
Figure 3J:
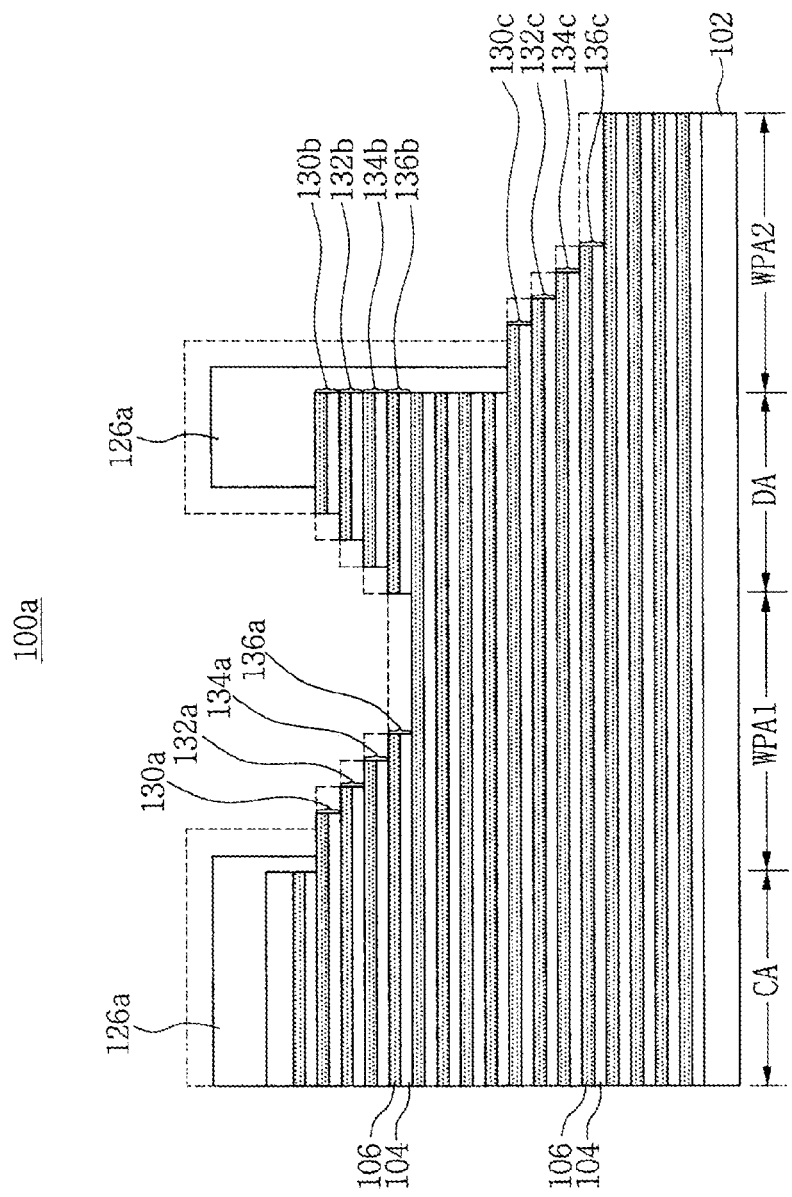
Figure 3K:
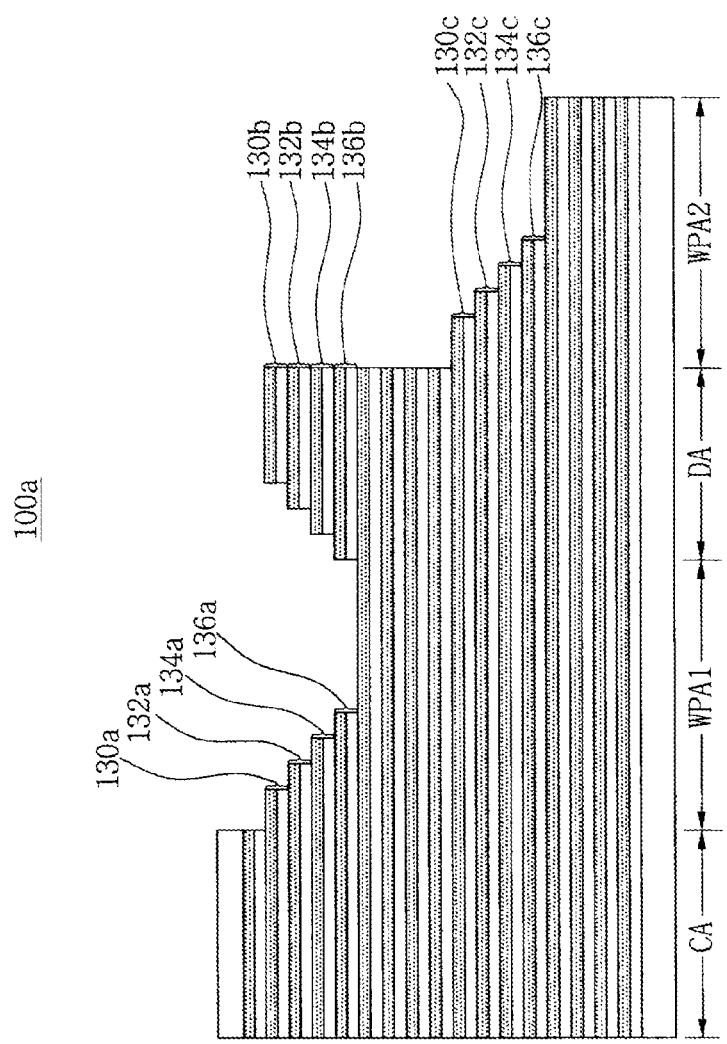
Figure 3M:
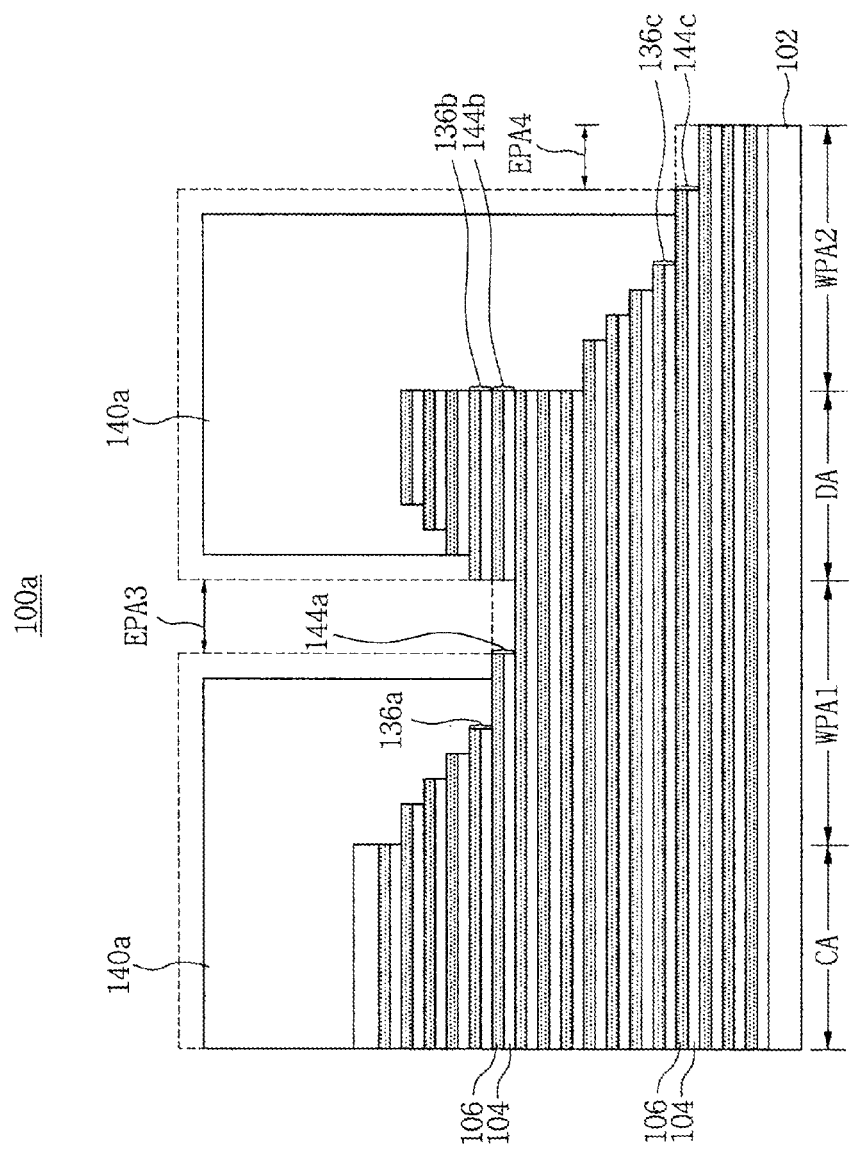
Figure 3N:
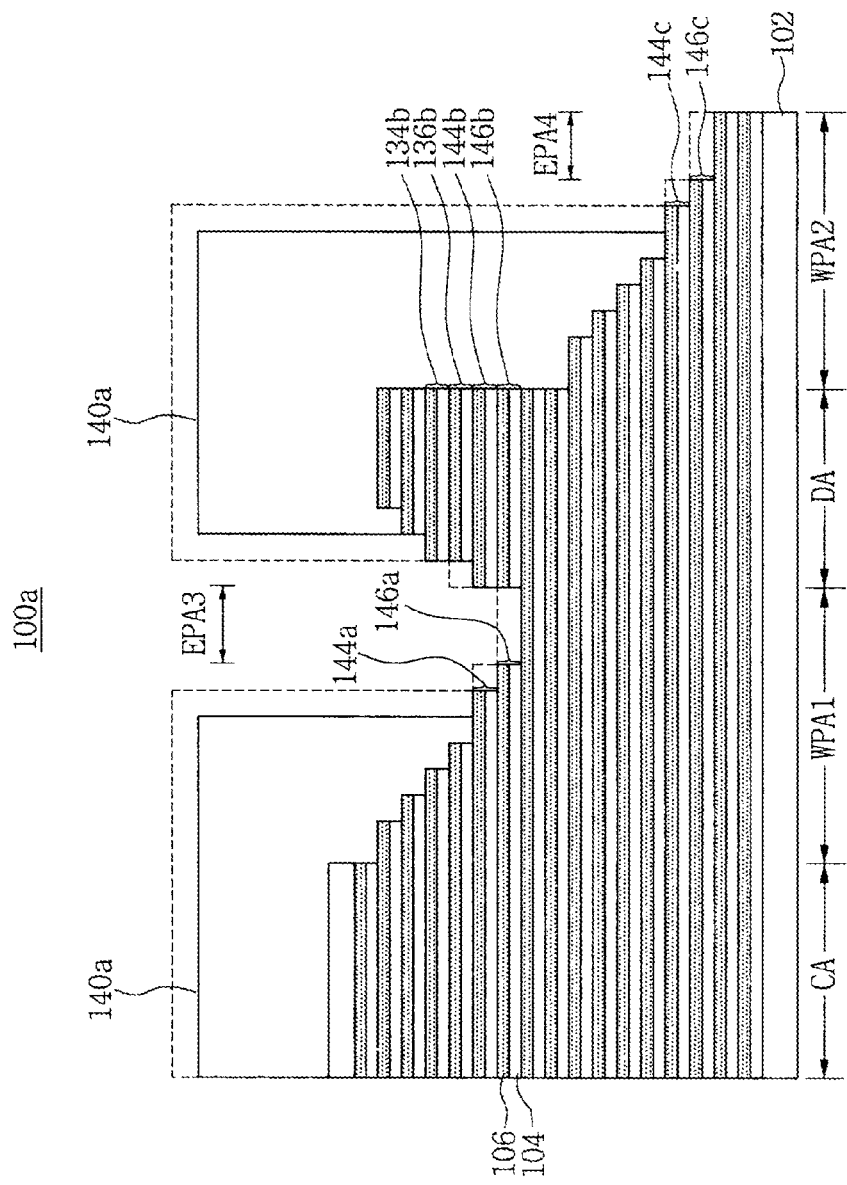
Figure 30:
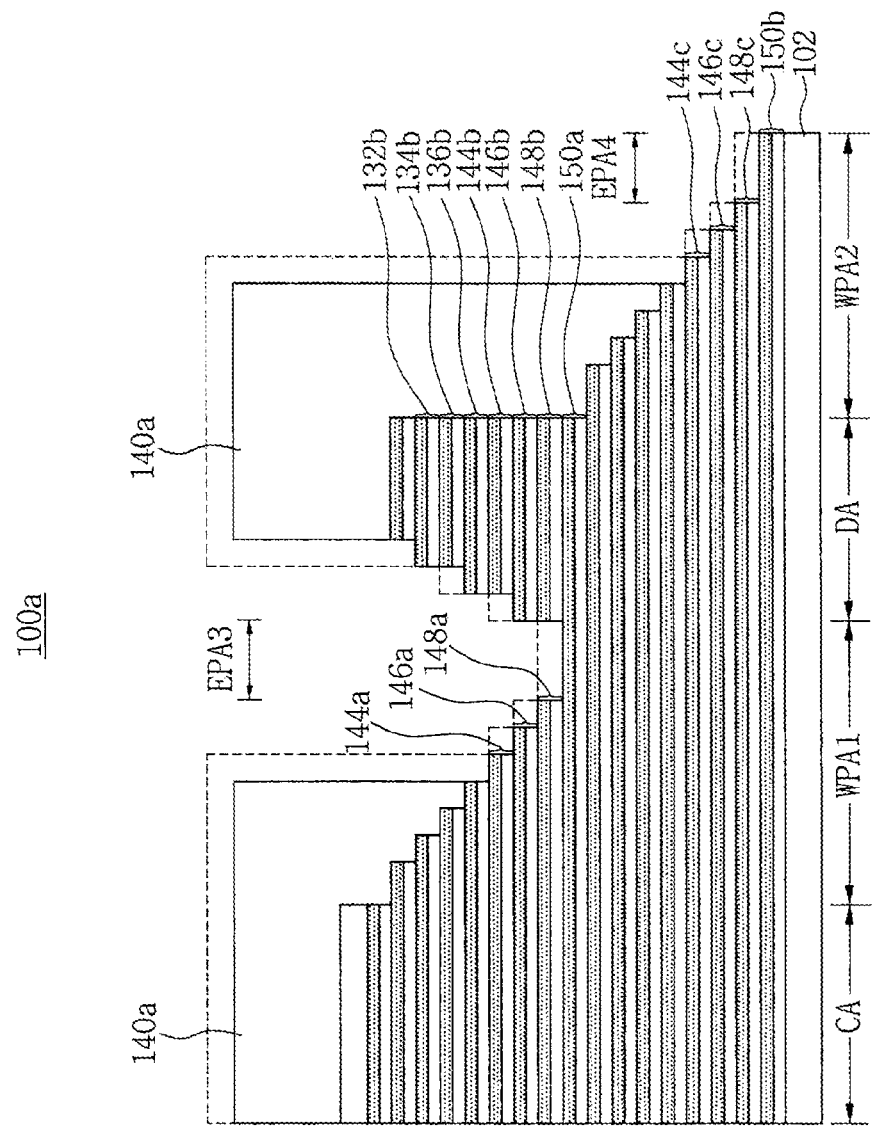
Figure 3P:
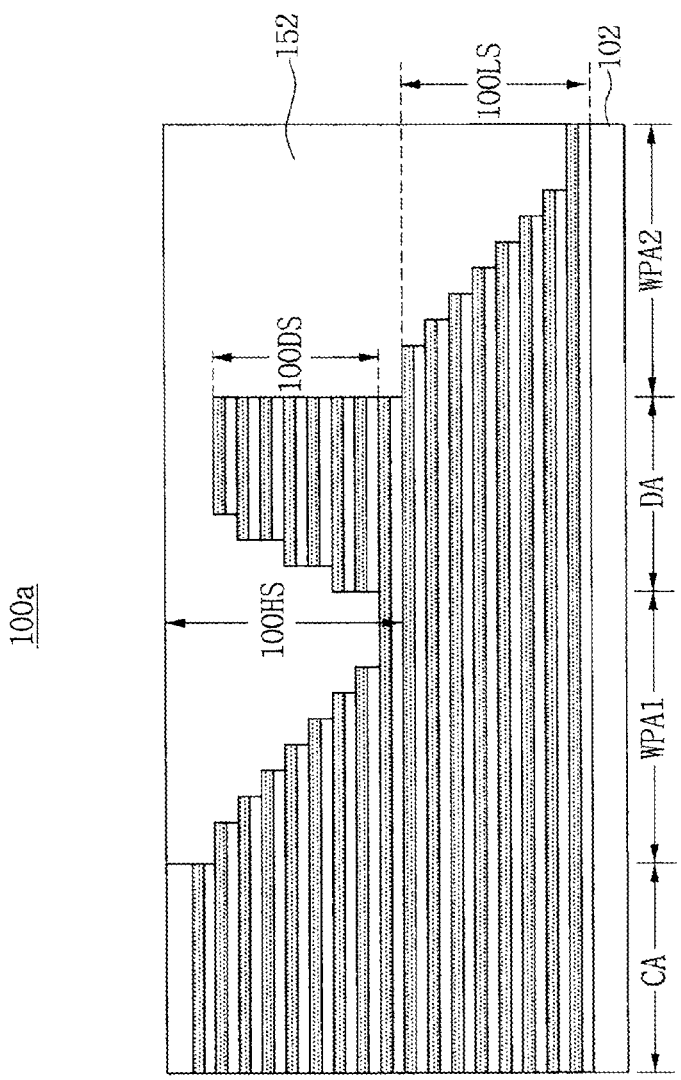

FIGS. 3A through 3P are cross-sectional views of process operations of a method of fabricating the vertical-cell-type semiconductor device shown in FIGS. 1A and 1B, according to example embodiments of inventive concepts.

Referring to FIG. 3A, the method of fabricating the vertical-cell-type semiconductor device 100a shown in FIGS. 1A and 1B may include forming a preliminary stack structure 108 on a substrate 102.

For brevity, the preliminary stack structure 108 will be divided into an upper preliminary stack structure 108H and a lower preliminary stack structure 108L and described.

The substrate 102 may be divided into a cell area CA, a first pad area WPA1, a dummy area DA, and a second pad area WPA2 and defined, and the stack structure 108 may be formed on the entire surface of the substrate 102.

The preliminary stack structure 108 may include interlayer insulating layers 104 and sacrificial layers 106 stacked alternately and repetitively.

When the semiconductor device 100a further includes a dummy device, the upper preliminary stack structure 100HS may further include an interlayer insulating layer 104 and a sacrificial layer 106. Also, the method may include forming a capping layer 110 on the upper preliminary stack structure 108H.

The substrate 102 may include a semiconductor material, for example, Si, SiGe, or SOI. The interlayer insulating layer 104 may include $SiO_2$, while the sacrificial layer 106 may include silicon nitride ($SiN_x$). Also, the capping layer 110 may include silicon oxide ($SiO_2$).

For brevity, it is assumed that 17 transistors are formed on the substrate 102. Accordingly, subsequent processes will be performed on the preliminary stack structure 108 in which 34 layers including the interlayer insulating layers 104 and the sacrificial layers 106, are stacked. When the preliminary stack structure 108 includes a dummy layer, the upper preliminary stack structure 100HS may further include the interlayer insulating layer 104 and the sacrificial layers 106.

Referring to FIG. 3B, according to example embodiments of inventive concepts, the method of fabricating the vertical-cell-type semiconductor device 100a may include forming a first mask 122a to cover the preliminary stack structure 108 corresponding to the cell area CA. The formation of the first mask 122a may include coating photoresist on a top surface of the preliminary stack structure 108 to form a photoresist layer, partially performing an exposure process, and partially removing the photoresist to leave a photoresist pattern 122a only in the cell area CA.

The photoresist pattern 122a left only in the cell area CA may not affect the cell area CA during an etching process performed on the first pad area WPA1, the dummy area DA, and the second pad area WPA2.

Referring to FIG. 3C, according to example embodiments of inventive concepts, the method of fabricating the vertical-cell-type semiconductor device 100a may include performing a first etching process to remove the capping layer 110, and the sacrificial layer 106 and the interlayer insulating layer 104, which are disposed under the capping layer 110, from the first pad area WPA1, the dummy area DA, and the second pad area WPA2.

After the first etching process is performed, a preliminary string selection gate pattern SGP and a capping pattern 110' may be left only in the cell area CA. The first capping pattern 110' may include an insulating material, such as silicon oxide ($SiO_2$).

Referring to FIG. 3D, according to example embodiments of inventive concepts, the method of fabricating the vertical-cell-type semiconductor device 100a may include forming a second mask 124a to cover the cell area CA, the first pad area WPA1, and the dummy area DA.

A surface of a portion of the preliminary stack structure 10, which is not covered with the second mask 124a, may be exposed in the second pad area WPA2. The second mask 124a may include photoresist.

Referring to FIG. 3E, according to example embodiments of inventive concepts, the method of fabricating the vertical-cell-type semiconductor device 100a may include removing the upper preliminary stack structure 108H corresponding to the second pad area WPA2, and removing the second mask 124a. Accordingly, the upper preliminary stack structure 108H may be exist on the cell area CA and the dummy area DA.

Hereinafter, a process of forming patterns having an exposed one end portion as staircase type using third masks in the first pad area WPA1, the dummy area DA, and the second pad area WPA2, will be described with reference to FIGS. 3F through 3J.

Here, an example according to example embodiments of inventive concepts is described in which four staircases are formed by means of staircase forming processes using one mask.

Hereinafter, first through fourth patterns may be termed in the etched order, and each of the first through fourth patterns may include the interlayer insulating layer 104 and the sacrificial layer 106.

Referring to FIG. 3F, according to example embodiments of inventive concepts, the method of fabricating the vertical-cell-type semiconductor device 100a may include forming third masks 126a to cover the upper and lower preliminary stack structures 108H and 108L.

Each of the third masks 126a may be formed to cover the entire cell area CA and a first length portion L1 of the first pad area WPA1, and cover the entire dummy area DA and a second length L2 of the second pad area WPA2. Cut-off lengths L1 and L2 of the first pad area WPA1 and the second pad area WPA2 respectively covered with the third masks 126a may be equal to or greater than the product of an exposed width of a staircase to be formed and the number of steps of the staircase. In other words, a length L1 of the portion of the first pad area WPA1 covered by the third masks 126a may correspond to a length of a bottom step of the staircase structure to be formed on the first pad area WPA1, such as a length of fourth patterns 136a on the first pad area WPA1 in FIG. 3K. Similarly, a length of the second pad area WPA2 covered by the third masks 126a may correspond to a length of a bottom step of the staircase structure to be formed on the second pad area WPA2, such as a length of the fourth patterns 136c on the second pad area WPA2. A region of the first pad area WPA1, which is not covered with the third mask 126a, may be referred to as a first exposed area EPA1, while a region of the second pad area WPA2, which is not covered with the third mask 126a, may be referred to as a second exposed area EPA2.

Referring to FIG. 3G, according to example embodiments of inventive concepts, the method of fabricating the vertical-cell-type semiconductor device 100a may include performing a first etching process to form first patterns 130a, 130b, and 130c having one exposed end portions in the first pad area WPA1, the dummy area DA, and the second pad area WPA2.

The first etching process may include removing each of the sacrificial layer 106 exposed by the first exposed area EXP1 and the second exposed area EXP2, and the interlayer insulating layer 104 disposed thereunder, and simultaneously, etching top and side surfaces of the third masks 126a to shrink the third masks 126a. In this case, means of etching used in the first etching process may have an etch selectivity with respect to each of the sacrificial layer 106 and the interlayer insulating layer 104.

The first pattern 130b of the dummy area DA may be separated from the first pattern 130a of the first pad area WPA1. Accordingly, the first patterns of the first pad area WPA1 and the dummy area DA may be formed apart from each other with the first exposed area EPA1 therebetween. Also, one end portions of the first patterns 130a, 130b, and 130c may be exposed in the respective areas WPA1, SA, and WPA2.

Referring to FIG. 3H, according to example embodiments of inventive concepts, the method of fabricating the vertical-cell-type semiconductor device 100a may include performing a second etching process (i.e., staircase forming process) to form second patterns 132a, 132b, and 132c under the first patterns 130a, 130b, and 130c.

The second etching process may include removing the exposed sacrificial layer 106 and the interlayer insulating layer 104 disposed thereunder from the first exposed area EXP1 and the second exposed area EXP2 to form second patterns 132a, 132b, and 132c under the first patterns 130a, 130b, and 130c, and simultaneously, removing the one exposed end portions of the first patterns 130a, 130b, and 130c to expose one end portions of the underlying second patterns 132a, 132b, and 132c. Simultaneously, the second etching process may include shrinking side and top surfaces of the third masks 126a to re-expose one end portions of the first patterns 130a, 130b, and 130c. Accordingly, end portions of the first patterns 130a and 130b and the second patterns 132a and 132b may be formed as a staircase type in the first pad area WPA1 and the dummy area DA, and the end portions of the first pattern 130c and the second pattern 132c may be formed as a staircase type in the second pad area WPA2. In this case, the second pattern 132b may be formed separately from the second pattern 132a of the first pad area WPA1 in the dummy area DA, and one end portion of the second pattern 132a may form a staircase along with the first pattern 130a disposed thereon.

Referring to FIG. 3I, according to example embodiments of inventive concepts, the method of fabricating the vertical-cell-type semiconductor device 100a may include forming a third etching process to form third patterns 134a, 134b, and 134c under the second patterns 132a, 132b, and 132c.

The third etching process may include removing the exposed end portions of the first patterns 130a, 130b, and 130c and the exposed end portions of the underlying second patterns 132a, 132b, and 132c, and shrinking the side and top surfaces of the third masks 126a. Accordingly, the third etching process may include re-removing (removing once more or removing again) one end portions of the first patterns 130a, 130b, and 130c and the second patterns 132a, 132b, and 132c, and simultaneously, exposing one end portions of the first patterns and the second patterns, and exposing one end portions of the third patterns 134a, 134b, and 134c.

Accordingly, the end portions of the first patterns 130a and 130c, the second patterns 132a and 132c, and the third patterns 134a and 134c may be formed as a staircase type in the first and second pad areas WPA1 and WPA2, and one end portions of the first through third pattern 130b, 132b, 134b separated from the first through third patterns 130b, 132b, and 134b of the first pad area WPA1 may be formed as a staircase type in the dummy area DA.

Referring to FIG. 3J, according to example embodiments of inventive concepts, the vertical-cell-type semiconductor device 100a may include performing a fourth etching process to form fourth patterns 136a, 136b, and 136c under the third patterns 134a, 134b, and 134c.

The fourth etching process may include removing the exposed end portions of the first patterns 130a, 130b, and 130c, the second patterns 132a, 132b, and 132c, and the third patterns 134a, 134b, and 134c, and simultaneously, shrinking the side and top surfaces of the third masks 126a.

Accordingly, one end portions of the first patterns 130a, 130b, and 130c, the second patterns 132a, 132b, and 132c, and the third patterns 134a, 134b, and 134c may be removed again, and simultaneously, one end portions of the first patterns 130a, 130b, and 130c, the second patterns 132a, 132b, and 132c, and the third patterns 134a, 134b, and 134c may be exposed, and one end portions of the fourth patterns 136a, 136b, and 136c may be exposed. Accordingly, the first patterns 130a and 130c, the second patterns 132a, 132c, the third patterns 134a and 134c, and the fourth patterns 136a and 136c may be formed as a staircase type in the first and second pad areas WPA1 and WPA2, and one end portions of the first through fourth patterns 130b, 132b, 134b, and 136b may be separated from the first through fourth patterns 130a, 132a, 134a, and 136a of the first pad area WPA1 and formed as a staircase type in the dummy area DA.

As shown in FIG. 3K, according to example embodiments of inventive concepts, the method of fabricating the vertical-cell-type semiconductor device 100a may include removing the third masks 126a.

Accordingly, after a multi-stage etching process (i.e., staircase forming processes) using the third masks 126a is performed, one end portions of the first through fourth patterns 130a, 132a, 134a, and 136a may be simultaneously formed as a staircase type in the first pad area WPA1 and the second pad area WPA2. Since the first through fourth patterns 130b, 132b, 134b, and 136b of the dummy area DA are formed separately from the cell area CA, the first through fourth patterns 130b, 132b, 134b, and 136b of the dummy area DA are not used as elements, and may be resultant structures required to simultaneously perform processes in the first and second pad areas WPA1 and WPA2.

Hereinafter, staircase forming processes using fourth masks, that is, processes of forming fifth through eighth patterns having one end portions formed as a staircase type in the first pad area WPA1, the dummy area DA, and the second pad area WPA2 will be described with reference to FIGS. 3L through 3P.

Referring to FIG. 3L, according to example embodiments of inventive concepts, the method of fabricating the vertical-cell-type semiconductor device 100a may include forming fifth masks 140a on the substrate 102 to cover the cell area CA and a portion of the first pad area WPA1, and cover the dummy area DA and a portion of the second pad area WPA2.

The fifth masks 140a may be formed to further cover at least a third length L3 equal to the product of the exposed width of the staircase and the number of the steps of the staircase from the side surface of the fourth pattern 136a of the first pad area WPA1, and further cover at least a fourth length L4 equal to the product of the exposed width of the staircase and the number of the steps of the staircase from the side surface of the fourth pattern 136c of the second pad area WPA2. In this case, the fourth length L4 may be equal to the third length L3. A third exposed area EPA3 and a fourth exposed area EPA4, which are not covered with the fifth masks 140a, may be present.

Referring to FIG. 3M, according to example embodiments of inventive concepts, the method of fabricating the vertical-cell-type semiconductor device 100a may include performing a fifth etching process of forming fifth patterns 144a, 144b, and 144c in the first pad area WPA1, the dummy area DA, and the second pad area WPA2.

The fifth etching process may include removing the sacrificial layer 106 exposed by the third exposed area EXP3 and the fourth exposed area EXP4 and the interlayer insulating layer 104 disposed thereunder, and simultaneously, etching top and side surfaces of the fourth masks 140a to shrink the volumes of the fourth masks 140a. Accordingly, the fifth patterns 144a, 144b, and 144c may be formed under the fourth patterns 136a, 136b, and 136c in the respective areas WPA1, SA, and WPA2, and simultaneously, one end portions of the fifth patterns 144a, 144b, and 144c may be exposed. The fifth patterns 144a and 144b of the first pad area WPA1 and the dummy area DA may be formed apart from each other with the third exposed area EPA3 therebetween.

In this case, one side surface of the fifth pattern 144a of the dummy area DA, which faces the fifth pattern 144a of the first pad area WPA1, may be vertically aligned with one side surface of the fourth pattern 136b disposed thereon, and one end portion of the fourth pattern 136b may be exposed.

Referring to FIG. 3N, according to example embodiments of inventive concepts, the method of fabricating the vertical-cell-type semiconductor device 100a may include performing a sixth etching process to form sixth patterns 146a, 146b, and 146c under the fifth patterns 144a, 144b, and 144c.

The sixth etching process may include removing the sacrificial layers 106 exposed by the third exposed area EXP3 and the fourth exposed area EXP4 and the interlayer insulating layers 104 disposed thereunder, and removing the exposed one end portions of the fifth patterns 144a and 144c in the first and second pad areas WPA1 and WPA2, and simultaneously, removing the exposed one end portion of the fourth pattern 136b in the dummy area DA. Due to the sixth etching process, the sixth patterns 146a, 146b and 146c may be formed under the fifth patterns 144a, 144b and 144c, and simultaneously, the one end portions of the sixth patterns 146a and 146c in the first and second pad areas WPA1 and WPA2 may be exposed and, simultaneously one end portion of the fifth pattern 144b in the dummy area DA may be exposed. Simultaneously, the top and side surfaces of the fifth masks 140a may be shrunk to expose the one end portions of the fifth patterns 144a and 144c in the first and second pad areas WPA1 and WPA2 and third pattern 134b in the dummy area DA. The sixth patterns 146a and 146c and the fifth patterns 144a and 144c in the first and second pad areas WPA1 and WPA2 may be formed as a staircase type. In the dummy area DA, one side surface of the fourth pattern 136b and one side surface of the third pattern 134b may be vertically aligned, while one side surface of the fifth 144b and one side surface of the sixth patterns 146b may be vertically aligned. Accordingly, the forth pattern 136b and the fifth pattern 144b may be formed as staircase type.

Referring to FIG. 3O, according to example embodiments of inventive concepts, the method of fabricating the vertical-cell-type semiconductor device 100a may include performing a seventh etching process to form seventh patterns 148a, 148b, and 148c under the sixth patterns 146a, 146b, and 146c.

Due to the seventh etching process, the one exposed end portions of the sixth patterns 146a and 146c may be removed in the first pad area WPA1 and the second pad area WPA2 to expose one end portions of the seventh patterns 148a and 148c disposed thereunder, and the sixth patterns 146a and 146c and seventh patterns 148a and 148c in the first and second pad areas WPA1 and WPA2 may form a staircase. Simultaneously, top and side surfaces of the fifth masks 140a may shrink to expose one end portions of the fifth patterns 144a and 144c in the first and second pad areas WPA1 and WPA2. Simultaneously, an end portion of second pattern 132b in the dummy area DA may be exposed.

In the dummy area DA, one end portions of the sixth pattern 146b and the seventh pattern 148b may be vertically aligned, and the one exposed end portions of the fifth pattern 144b and the third pattern 134b may be removed so that the fifth pattern 144b may be vertically aligned with one end top if the fourth pattern 136b disposed thereon, and the third pattern 134b may be vertically aligned with the second pattern 132b disposed thereon. In this case, one end portions of the sixth pattern 146b, the fourth pattern 136b, and the second pattern 132b may be exposed. Accordingly, the sixth and seventh patterns 146b and 148b, the fourth and fifth patterns 136*b* and 144*b*, and the second and third patterns 132*b* and 134*b* may make respective pairs and form staircases in the dummy area DA.

In this case, although layers disposed under the seventh patterns 148*a* and 148*c* in the first pad area WPA1 and the second pad area WPA2 is not patterned, the layers may form along with the seventh patterns 148*a* and 148*c* and will be referred to as eighth patterns 150*a* and 150*b*. The eighth pattern 150*a* disposed under the seventh pattern 148*a* in the first pad area WPA1 may extend over the first pad area WPA1 and the dummy area DA, and a portion of the eighth pattern 150*a* may be exposed between the seventh pattern 148*a* of the first pad area WPA1 and the seventh pattern 148*b* of the dummy area DA.

After the above-described multi-stage etching process (staircase forming process) using the fifth masks 140*a* is completed, the fifth patterns 144*a* and 144*c*, the sixth patterns 146*a* and 146*c*, and the seventh patterns 148*a* and 148*c* may be provided and simultaneously form staircases in the first pad area WPA1 and the second pad area WPA2.

Referring to FIG. 3P, according to example embodiments of inventive concepts, the method of fabricating the vertical-cell-type semiconductor device 100*a* may include forming an insulating layer 152 to cover the first pad area WPA1, the dummy area DA, and the second pad area WPA2. The insulating layer 152 may cover the first pad area WPA1, the dummy area DA, and the second pad area WPA2, and planarize the surfaces of the first pad area WPA1, the dummy area DA, and the second pad area WPA2. The insulating layer 152 may include silicon oxide ($SiO_2$).

According to example embodiments of inventive concepts, due to the method of fabricating the vertical-cell-type semiconductor device 100*a* one end portions of patterns of the upper preliminary stack structure 100HS may be formed as a staircase type in the first pad area WPA1, and simultaneously, one end portions of patterns of the lower preliminary stack structure 100LS may be formed as a staircase type in the second pad area WPA2. Also, in the dummy area DA, a preliminary dummy stack structure 100DS may be separated from the upper preliminary stack structure 100HS and formed to have one end portion formed as a staircase type.

Subsequent processes will be described with reference to FIGS. 4, 5A through 5G, and 6A through 6G. After the above-described processes are completed, through holes H and trenches T may be formed in the cell area CA, and the shapes of the through holes H and the trenches T will be described with reference to FIG. 4.

Figure 4:
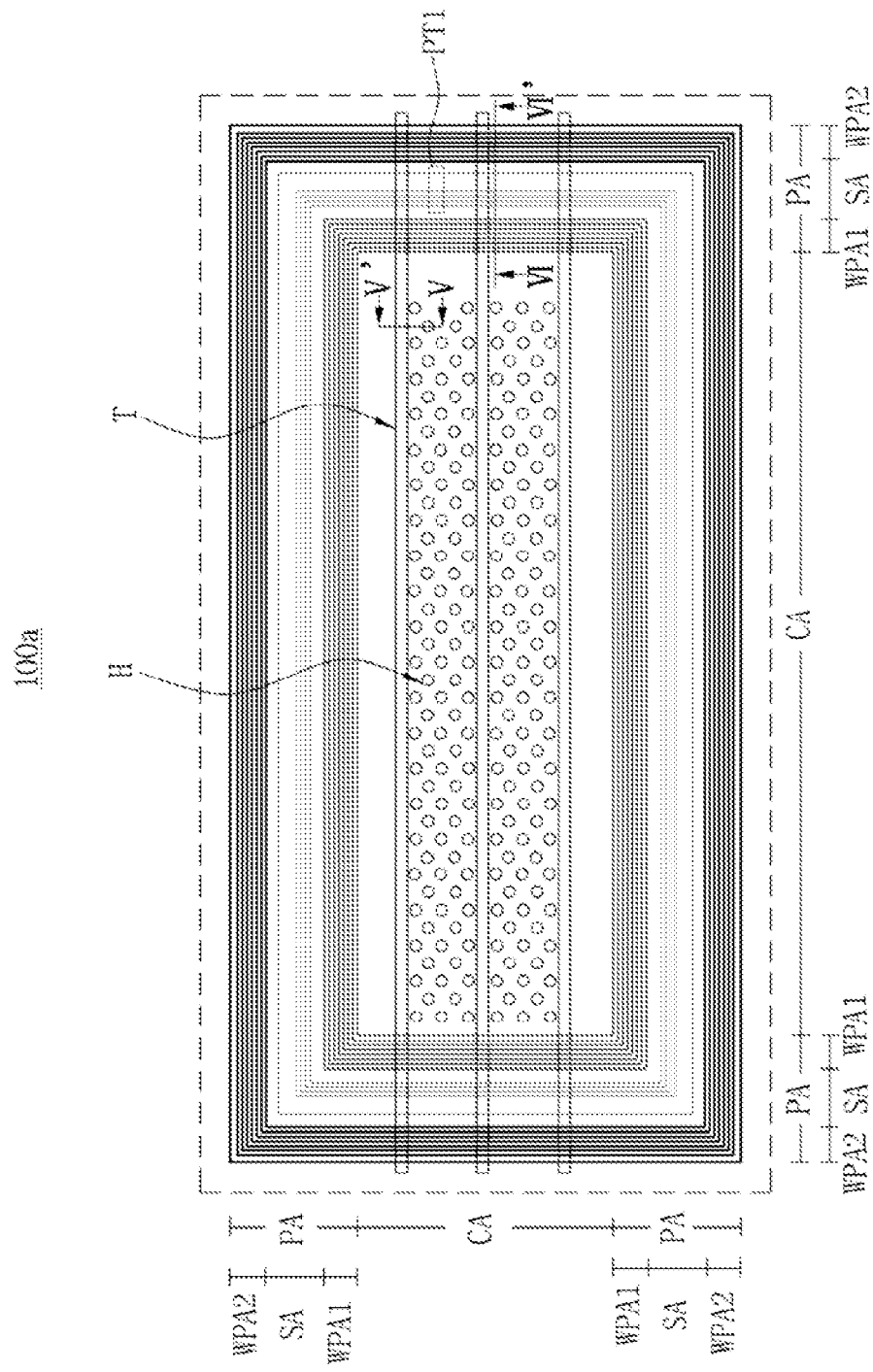
FIG. 4 is a schematic plan view of the semiconductor device shown in FIGS. 1A and 1B, according to example embodiments of inventive concepts.

FIG. 4 is a schematic plan view of the vertical-cell-type semiconductor device 100*a* shown in FIGS. 1A and 1B, according to example embodiments of inventive concepts.

Referring to FIG. 4, according to example embodiments of inventive concepts, the vertical-cell-type semiconductor device 100*a* may include a cell area CA, and a pad area PA configured to define the cell area CA around the cell area CA.

The cell area CA may include through holes H and trenches T extending in one direction. Although not shown, in some cases, the through hoes H may be formed also in the pad area PA, and the trenches T may extend from the cell area CA to the pad area PA.

The pad area PA may include the above-described first pad area WPA1, dummy area DA, and second pad area WPA2. End portions of patterns may be formed as a staircase type in the first pad area WPA1 and the second pad area WPA2. The dummy area DA may include patterns PT1 having one end portions formed as a staircase type.

Hereinafter, processes subsequent to the above-described processes of FIG. 3P, which include forming through holes H and trenches T in the cell area CA and the pad area PA, will be described with reference to the above-described processes.

FIGS. 5A through 5G and 6A through 6G are cross-sectional views taken along lines V-V' and VI-VI' of FIG. 4, which illustrate process operations of a method of fabricating the vertical-cell-type semiconductor device shown in FIGS. 1A and 1B.

Figure 5A:
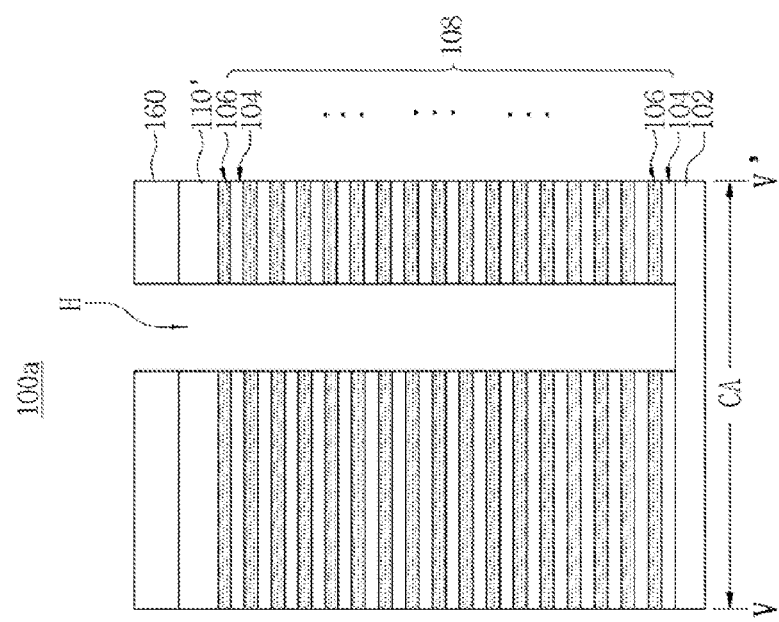
Figure 6A:
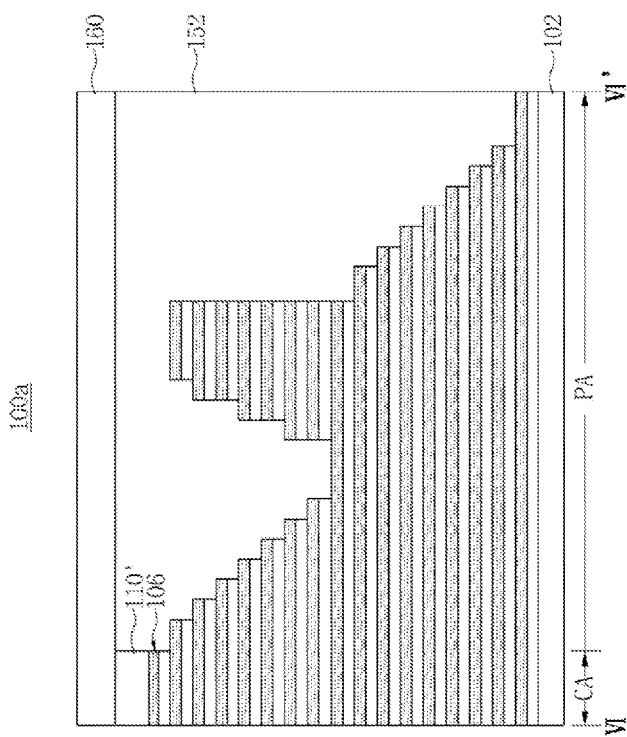

Referring to FIGS. 4, 5A, and 6A, according to example embodiments of inventive concepts, the method of fabricating the vertical-cell-type semiconductor device 100*a* may include forming a second capping layer 160 on the first capping pattern 110', and forming a plurality of through holes H.

The through holes H may be formed through the preliminary stack structure 108, the first capping pattern 110', and the second capping layer 160. In some cases, the through holes H may be formed also in the pad area PA.

The second capping layer 160 may have an etch selectivity with respect to the sacrificial layer 106. For example, when the sacrificial layer 106 is formed of silicon nitride, the second capping layer 160 may include silicon oxide.

Figure 6B:
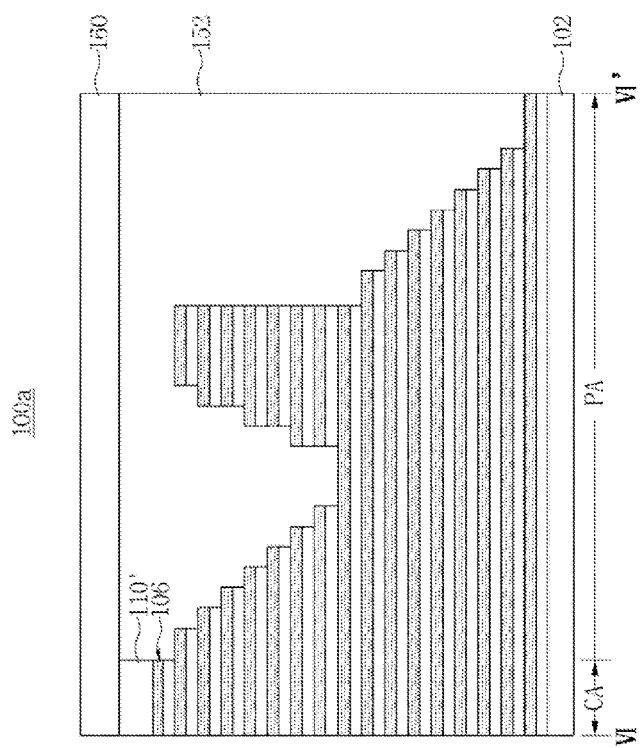

Referring to FIGS. 4, 5B, and 6B, according to example embodiments of inventive concepts, the method of fabricating the vertical-cell-type semiconductor device 100*a* may include forming the first vertical structure VS1 to fill the through holes H.

The formation of the first vertical structure VS1 may include forming a gap-fill pattern GFP to mostly fill the through hole H, forming a channel pattern 120 around the gap-fill pattern GFP, forming a gate dielectric layer GDa around the channel pattern 120, and forming a contact pad CP to fill an upper portion of the gap-fill pattern GFP. In this case, when the through hole H is formed in the pad area PA, the through hole H formed in the pad area PA may not be filled with a vertical structure.

Referring to FIGS. 4, 5C, and 6C, according to example embodiments of inventive concepts, the method of fabricating the vertical-cell-type semiconductor device 100*a* may include forming a third capping layer 162 on the second capping layer 160, and forming a trench T to penetrate the third capping layer 162, the second capping layer 160, the first capping pattern 110', and the preliminary stack structure 108 and extend in one direction. Referring to FIG. 4, the trench T may extend from the cell area CA to the pad area PA.

Figure 5D:
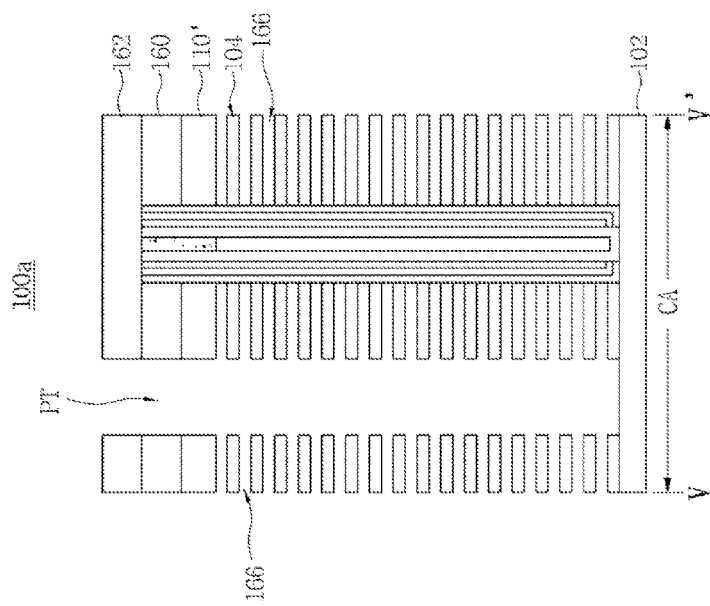
Figure 6D:
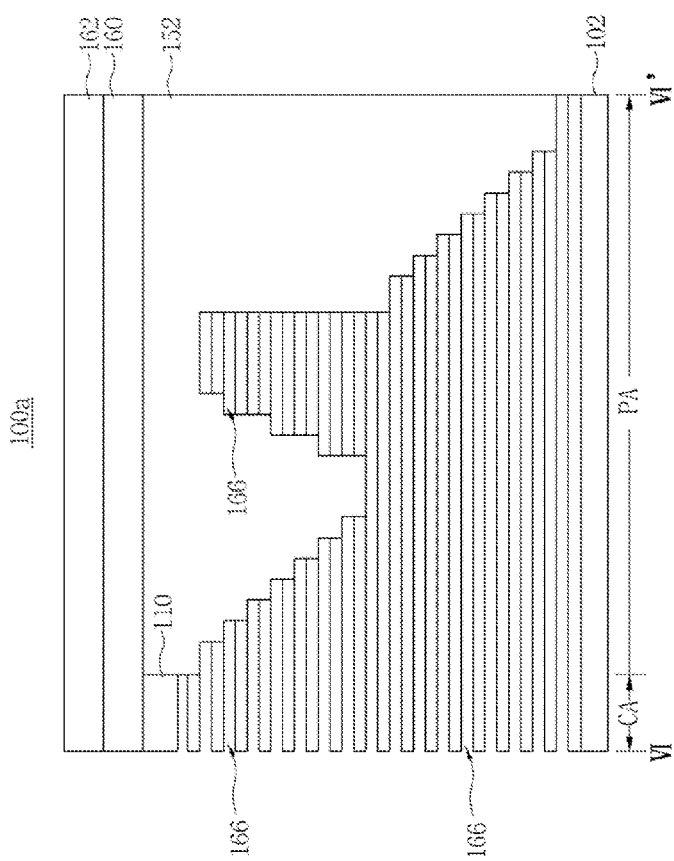

Referring to FIGS. 5D and 6D, the method of fabricating the vertical-cell-type semiconductor device 100*a* according to example embodiments of inventive concepts may include removing the sacrificial layer 106 interposed between the interlayer insulating layers 104, through the trench T to form an interlayer space 166. Phosphoric acid ($H_3PO_4$) may be used as an etchant for removing the sacrificial layer 106. After the sacrificial layer 106 is removed using the phosphoric acid, a cleaning process using a standard clean step 1 (SC-1) may be further performed.

Figure 5E:
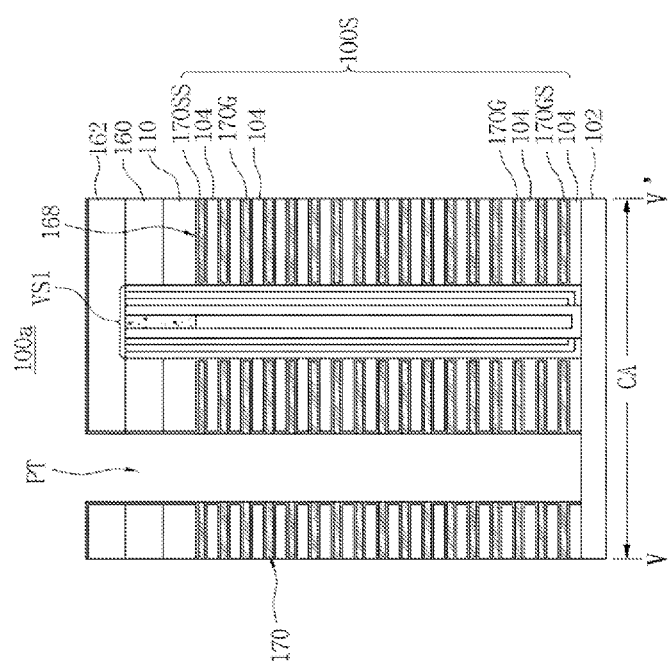
Figure 6E:
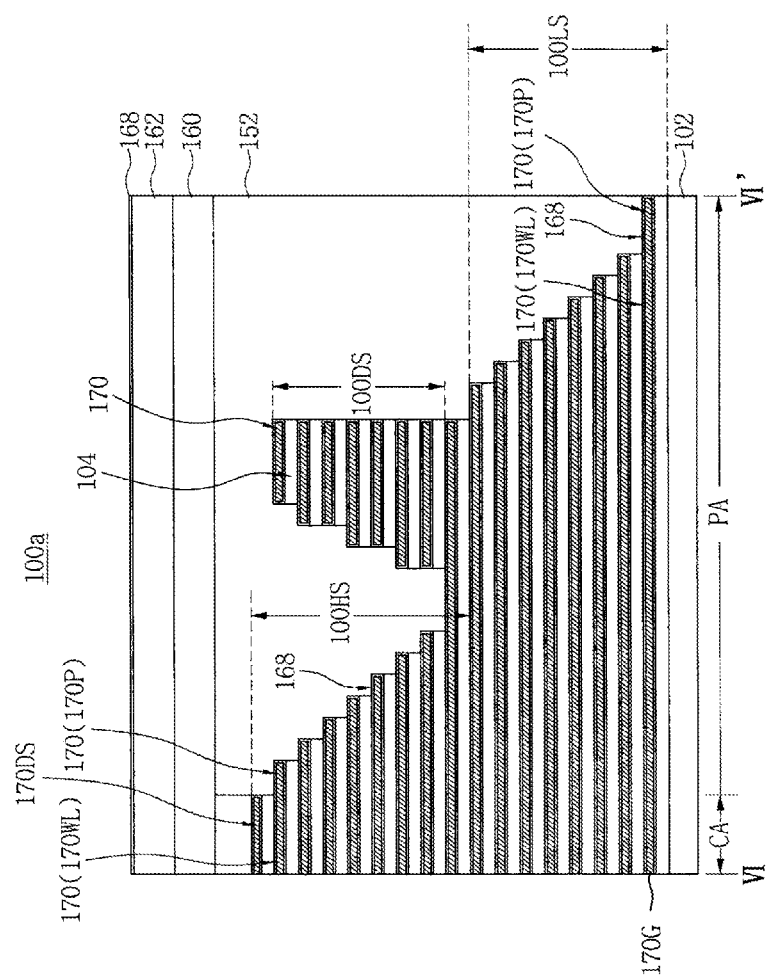

Referring to FIGS. 5E and 6E, according to example embodiments of inventive concepts, the method of fabricating the vertical-cell-type semiconductor device 100*a* may include forming a blocking layer 168 on the surface of the interlayer insulating layer 104 and the exposed surfaces of the first capping pattern 110', the second capping layer 160, and the third capping layer 162, and forming a conductive layer 170 in the interlayer space 166.

A portion of the conductive layer 170 close to the first vertical structure VS1 may be referred to as a gate electrode 170G, a portion of the conductive layer 170, which extends from the gate electrode 170G to the pad area PA, may be referred to as a word line 170WL, and a portion of the conductive layer 170, which is exposed by one end portion of the word line 170WL, may be referred to as a word pad 170P. In this case, among gate electrodes 170G, an uppermost gate electrode may be used as a string selection gate electrode 170SS, and a lowermost gate electrode may be used as a ground selection gate electrode 170GS.

Accordingly, a stack structure 100S, which may include interlayer insulating layers 104 and conductive layers 107 stacked alternately and repetitively, may be formed on a substrate 102. The stack structure 100S may include an upper stack structure 100HS having one end portion formed as a staircase type in the first pad area WPA1, and a lower stack structure 100LS formed as a staircase type in the second pad area WPA2. Also, a dummy stack structure 100DS, which may include interlayer insulating layers 104 and conductive layers 107 stacked alternately and repetitively, may be separated from the upper stack structure 100HS and formed in the dummy area DA.

The blocking layer 168 may include a high-k dielectric material (e.g., having a dielectric constant greater than a dielectric constant of silicon oxide) such as aluminum oxide ($Al_2O_3$) or hafnium oxide (HfO). The conductive layer 170 may include a doped semiconductor (e.g., doped Si), a metal (e.g., tungsten (W), copper (Cu), or aluminum (Al)), a conductive metal nitride (e.g., titanium nitride (TiN) or tantalum nitride (TaN)), a conductive metal-semiconductor compound (e.g., a metal silicide), or a transition metal (e.g., titanium (Ti) or tantalum (Ta)). For example, the conductive layer 170 may include tungsten (W) or titanium nitride (TiN).

Figure 5F:
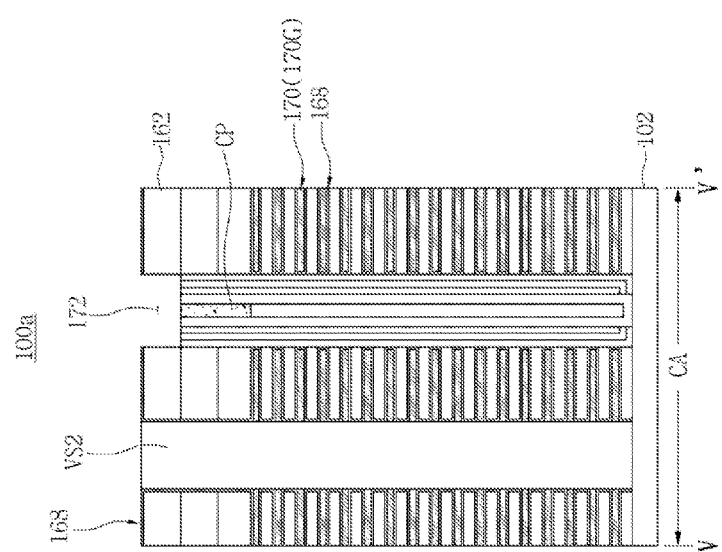
Figure 6F:
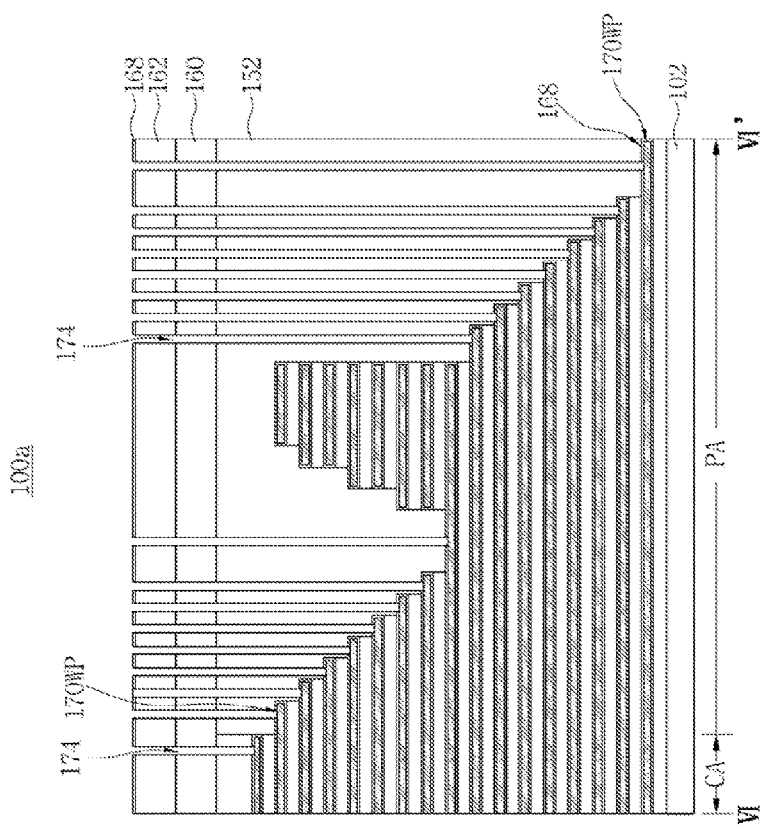

Referring to FIGS. 5F and 6F, according to example embodiments of inventive concepts, the method of fabricating the vertical-cell-type semiconductor device 100a may include forming a second vertical structure VS2 to fill the trench T, forming cell vias 172 in the cell area CA, and forming pad vias 174 in the pad area PA.

The second vertical structure VS2 may include silicon oxide.

The cell vias 172 may be formed through the blocking layer 168 and the third capping layer 162, and a top surface of the contact pad CP may be exposed through the cell via 172. The pad vias 174 may be formed through the third capping layer 162, the second capping layer 160, the insulating layer 152, the blocking layer 168 formed on top surfaces of the word pads 170WP, and the blocking layer 168 formed on a top surface of the third capping layer 162. In this case, the top surfaces of a plurality of word pads 170WP formed as the staircase type may be exposed through the pad vias 174. In this case, the blocking layer 168 may not be present on the top surface of the third capping layer 162.

The vias 172 and 174 may be formed using means of etching having an etch selectivity with respect to a poly-Si layer, an oxide layer, and a metal layer. In particular, the pad vias 174 to be formed in the pad area PA in consideration of an etch selectivity of the means of etching, may be divided by a desired (and/or alternatively predetermined) number according to the height of the pad vias 174, and the divided pad vias 174 may be fabricated using separate processes.

In this case, when the means of etching has a high etch selectivity, the pad vias 174 may be simultaneously formed.

Figure 6G:
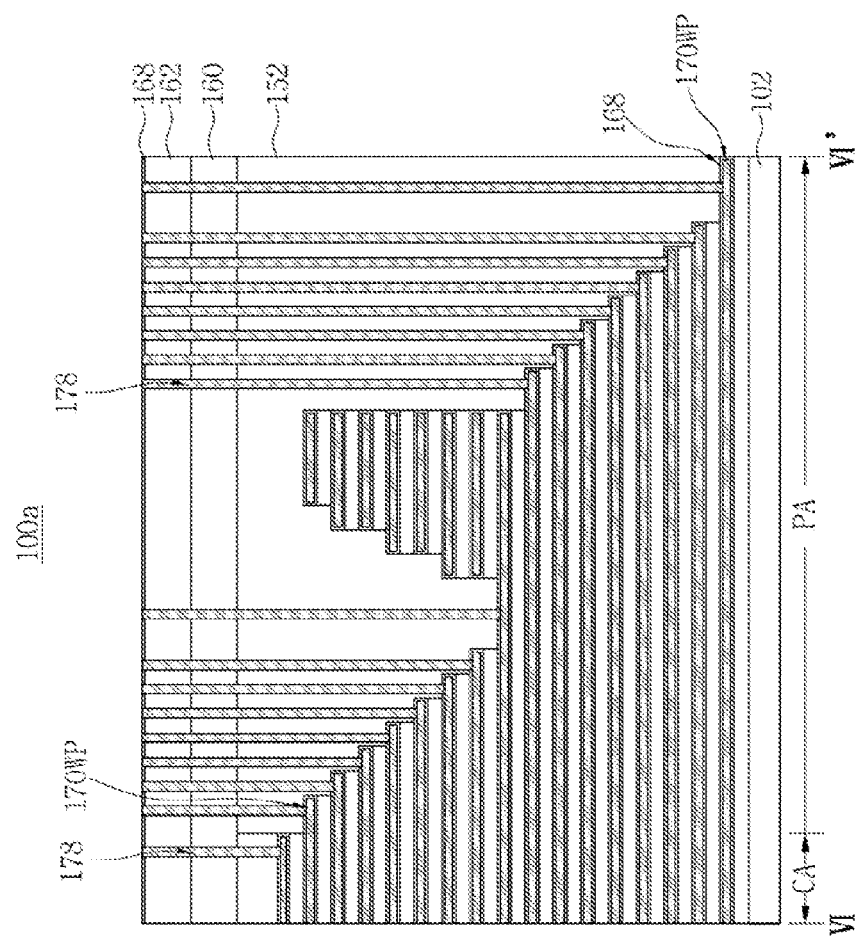

Referring to FIGS. 5G and 6G, according to example embodiments of inventive concepts, the method of fabricating the vertical-cell-type semiconductor device 100a may include forming contact electrodes 176 in the cell area CA, and forming pad contact electrodes 178 in the first pad area WPA1 and the second pad area WPA2. The contact electrodes 176 may be in contact with the contact pads CP, and the pad contact electrodes 178 may be in contact with the word pads 170WP.

Figure 7A:
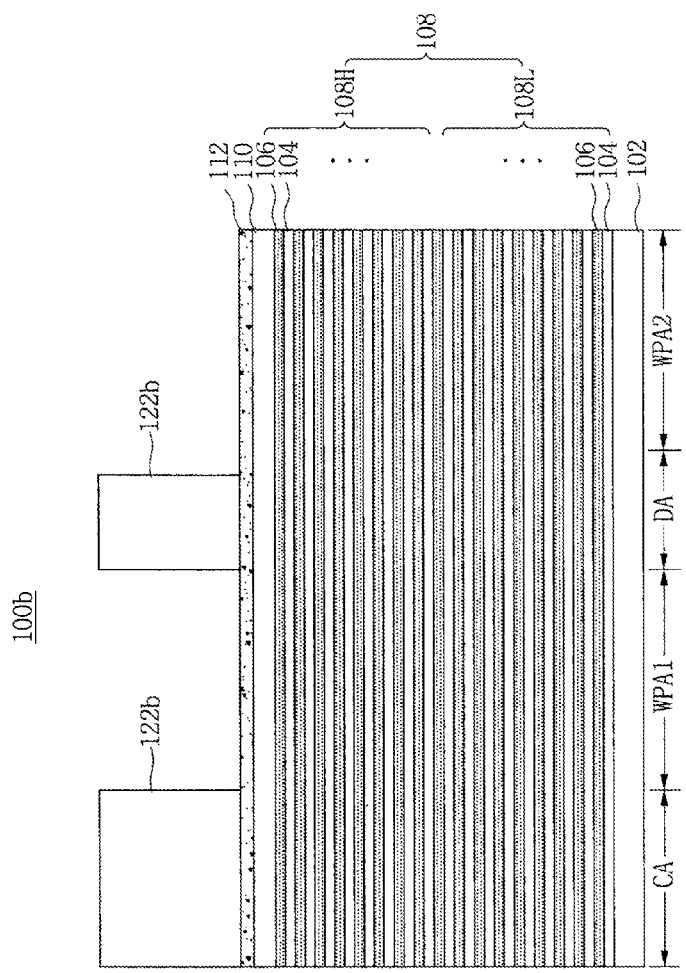
FIGS. 7A through 7P are cross-sectional views of process operations of a method of fabricating the vertical-cell-type semiconductor device shown in FIGS. 2A and 2B, according to example embodiments of inventive concepts.
Figure 7B:
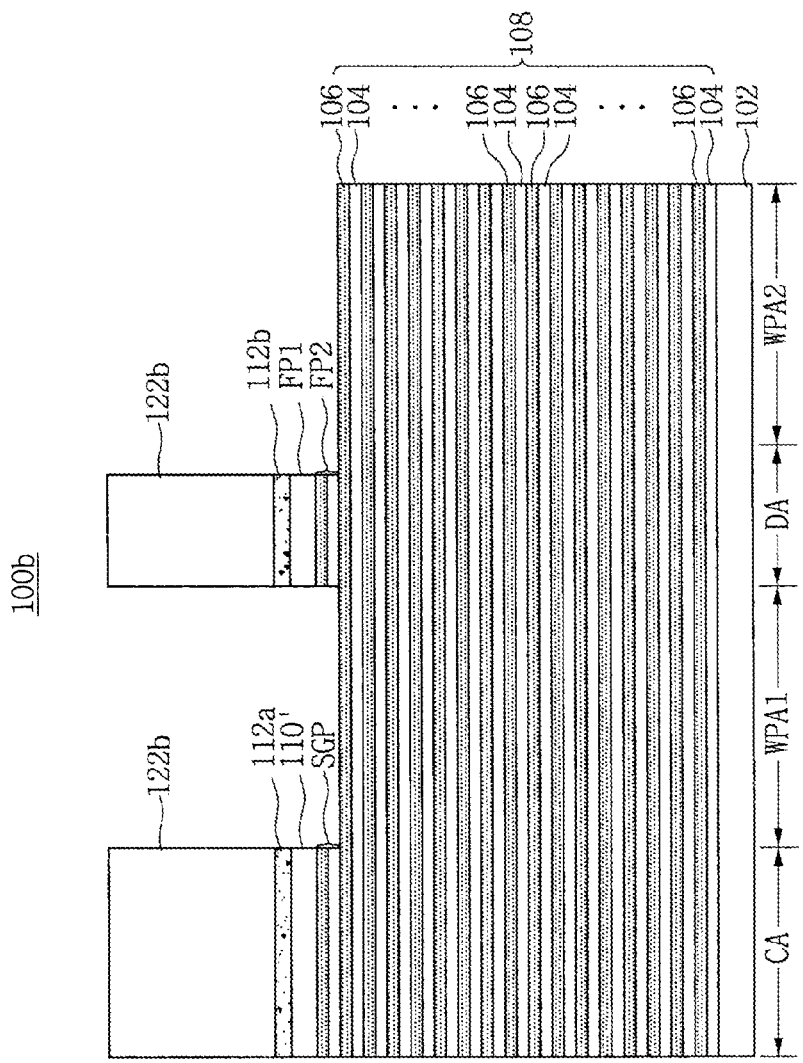
Figure 7C:
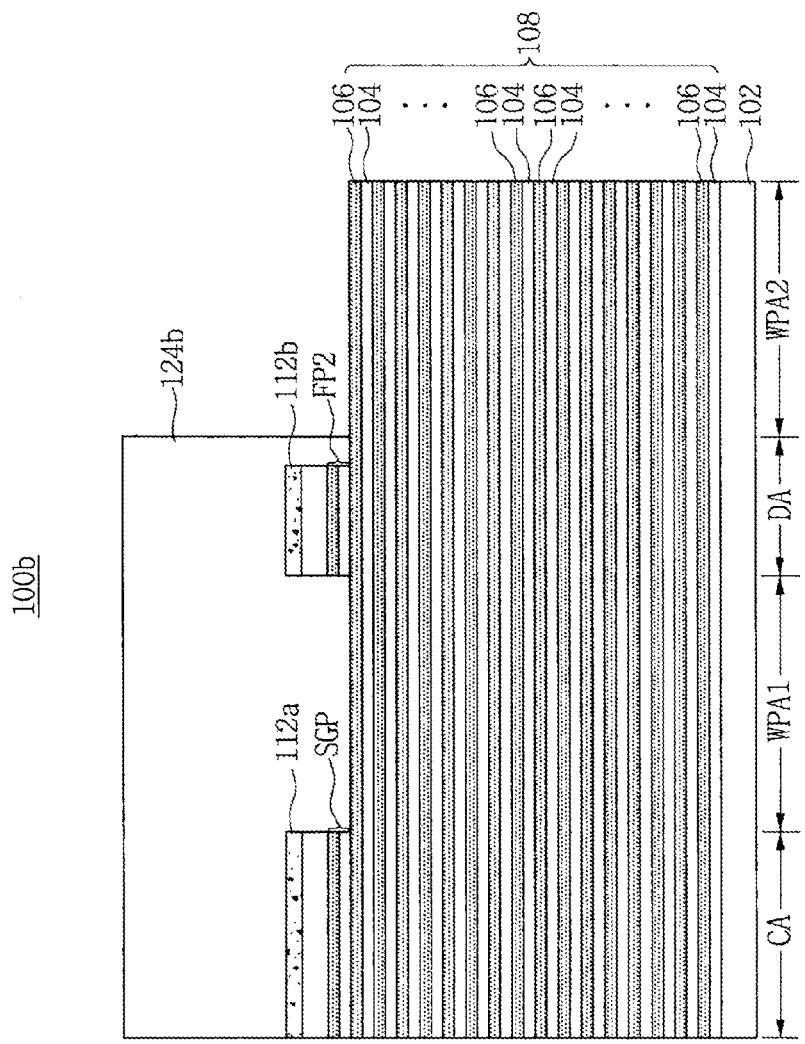
Figure 7D:
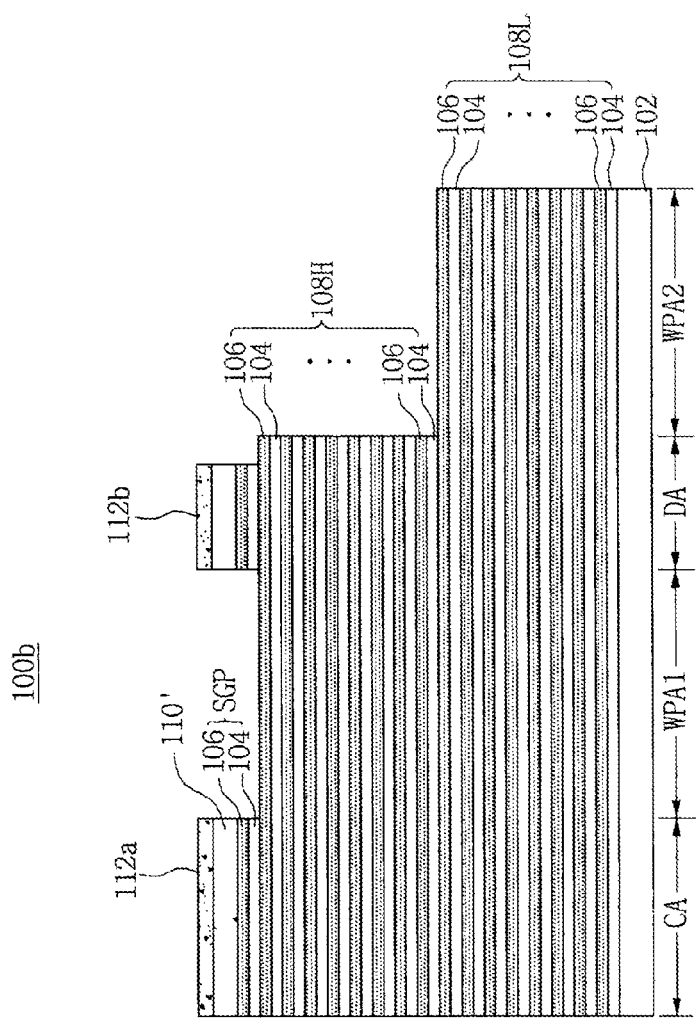
Figure 7E:
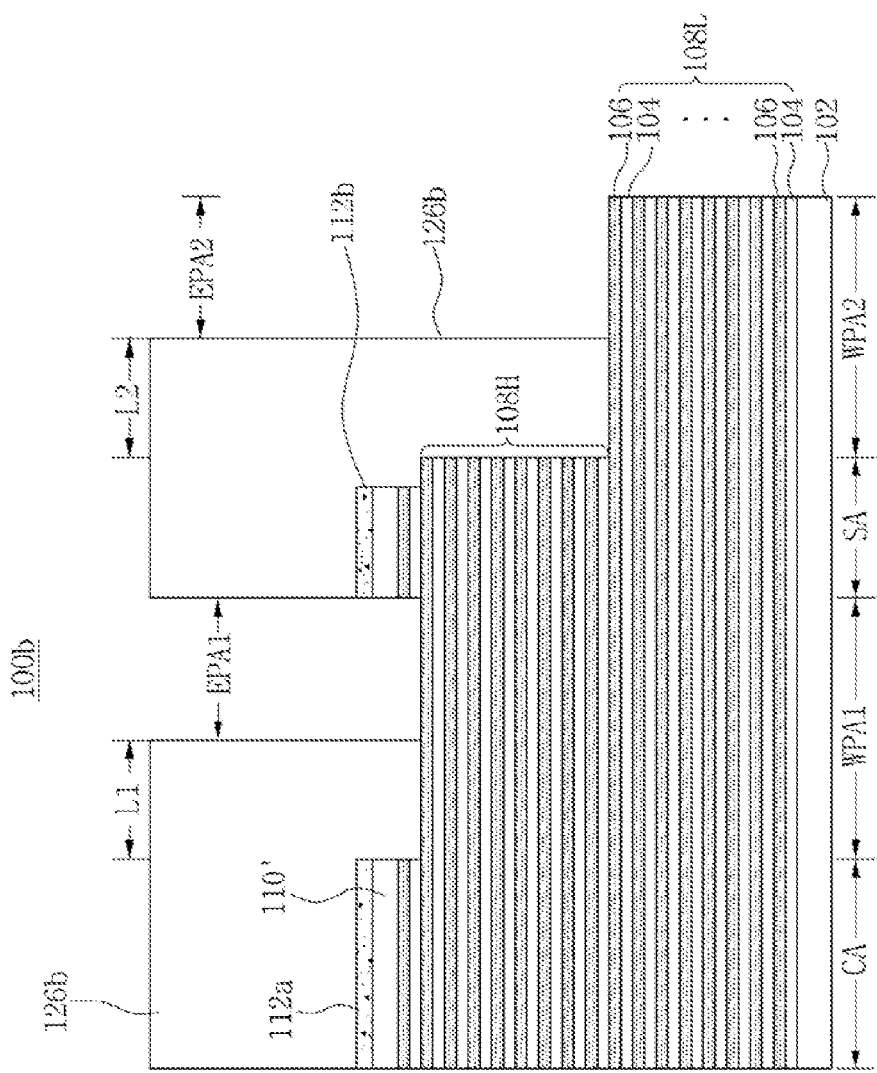
Figure 7F:
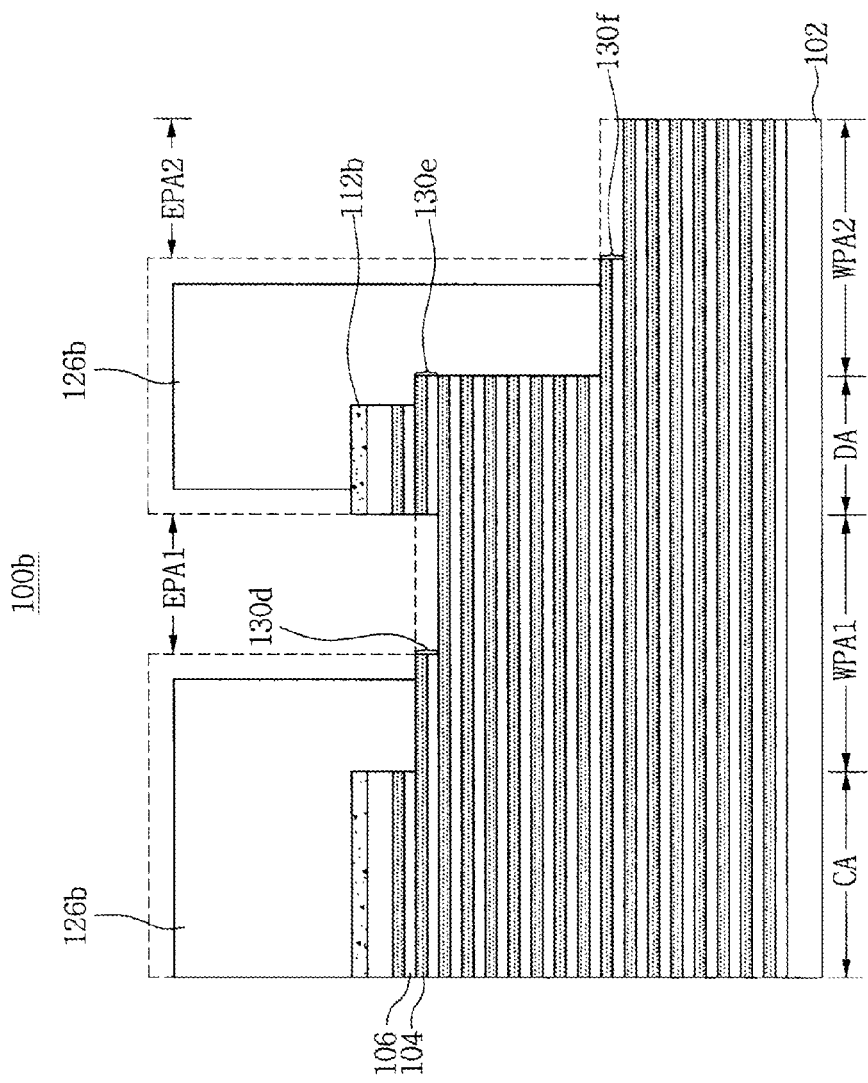
Figure 7G:
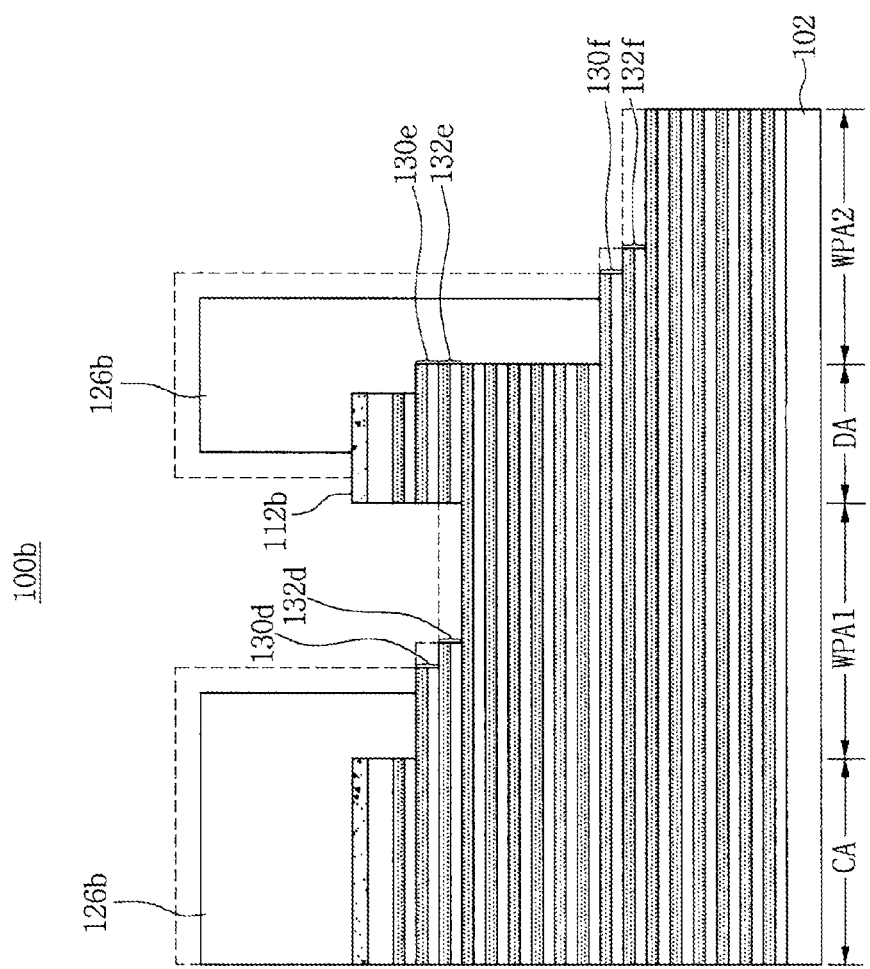
Figure 7I:
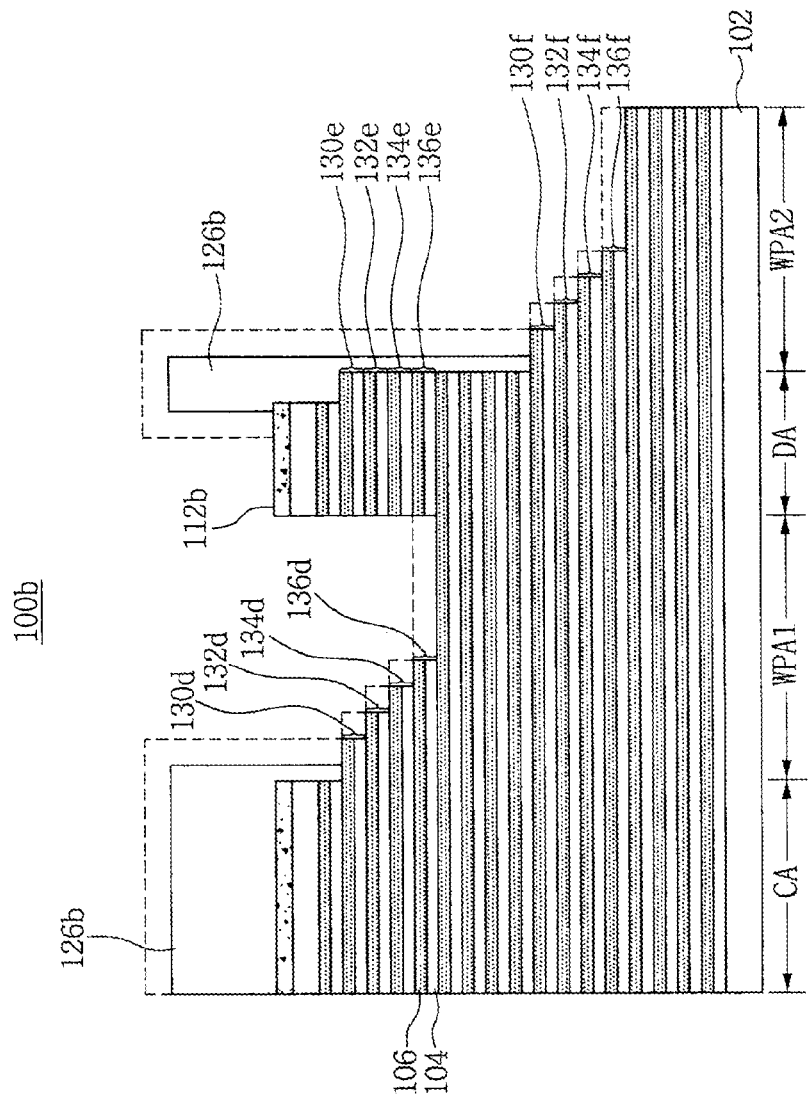
Figure 7J:
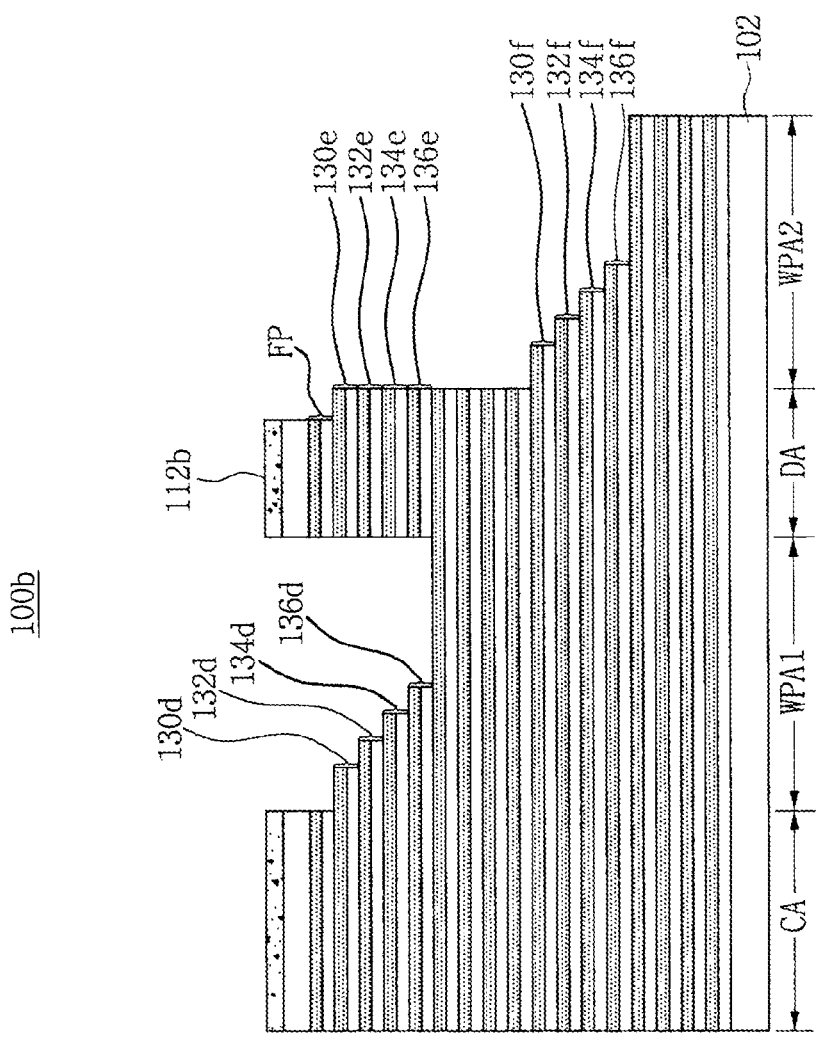
Figure 7K:
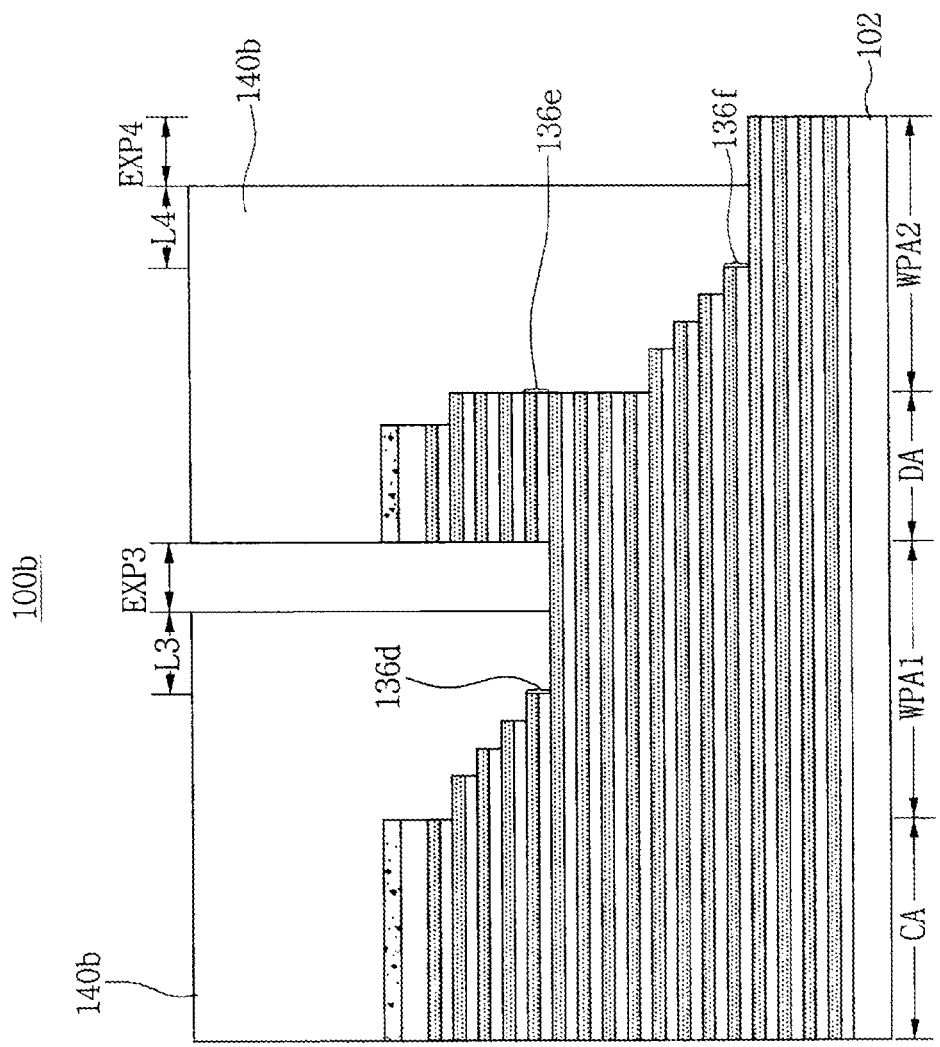
Figure 7L:
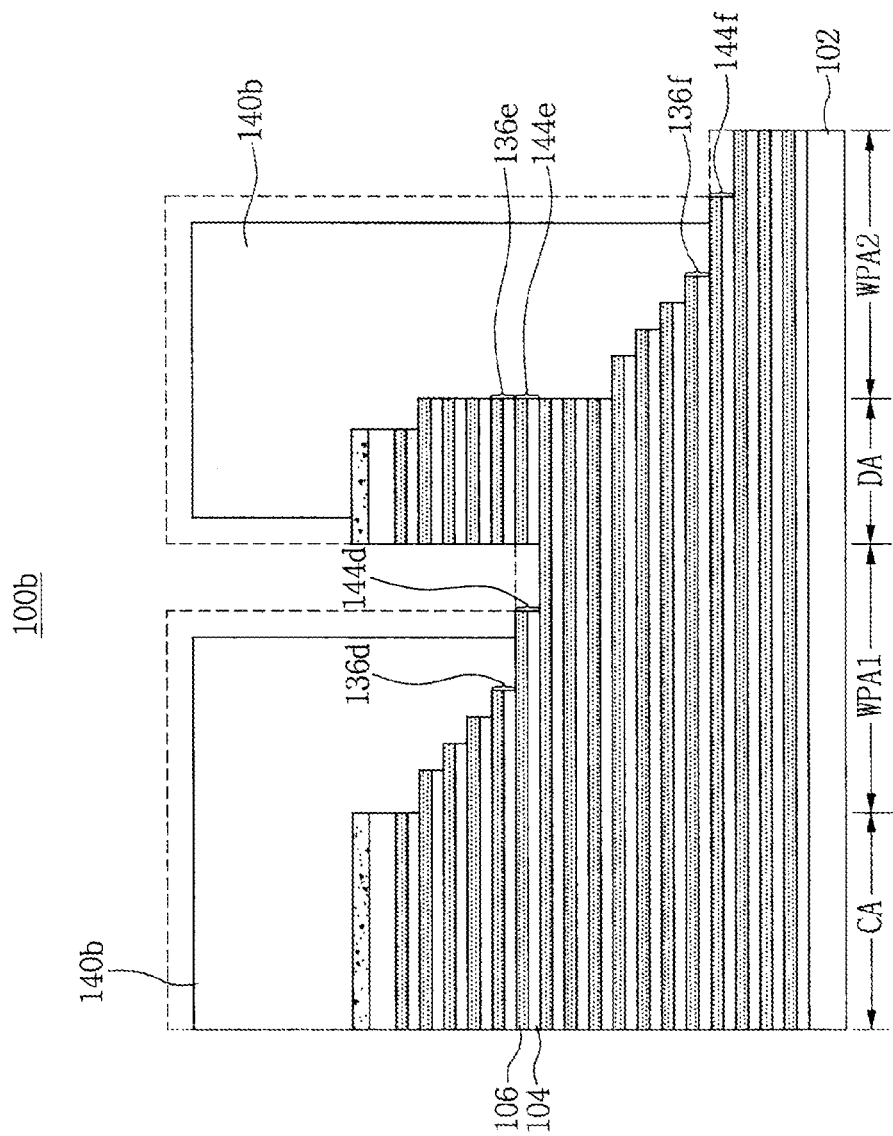
Figure 7M:
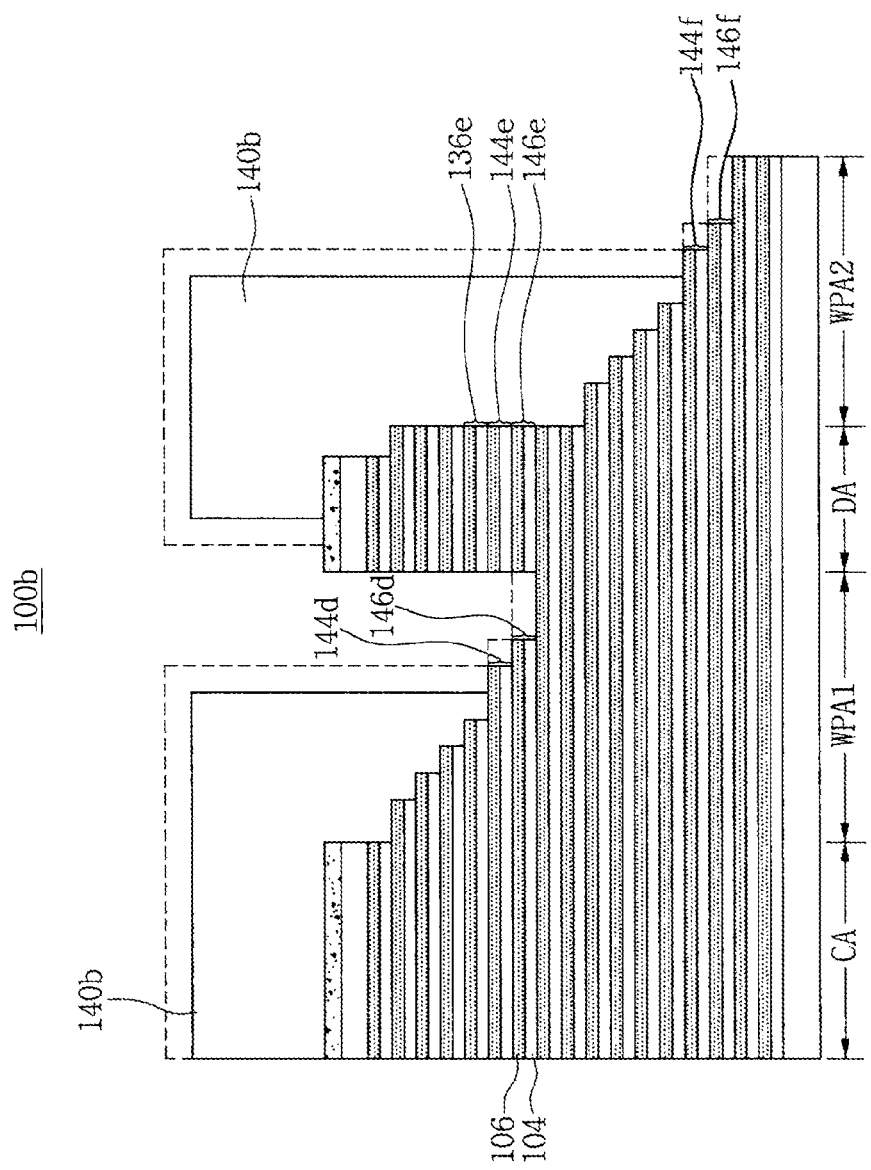
Figure 7N:
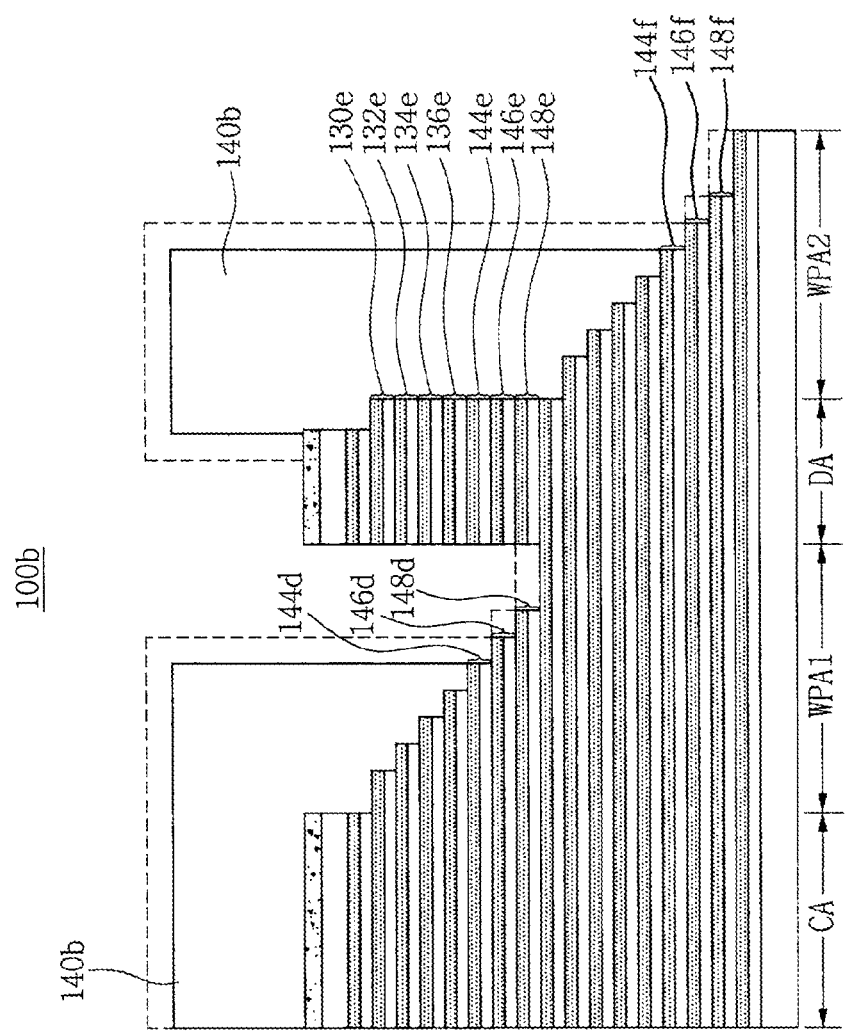
Figure 70:
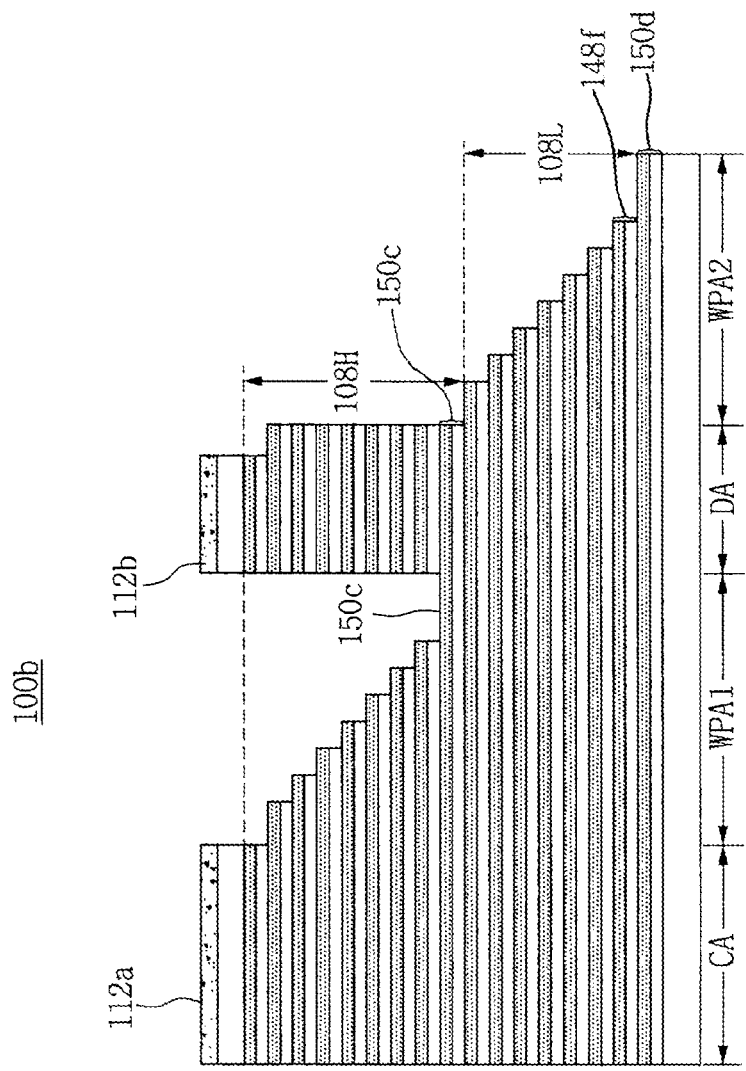
Figure 7P:
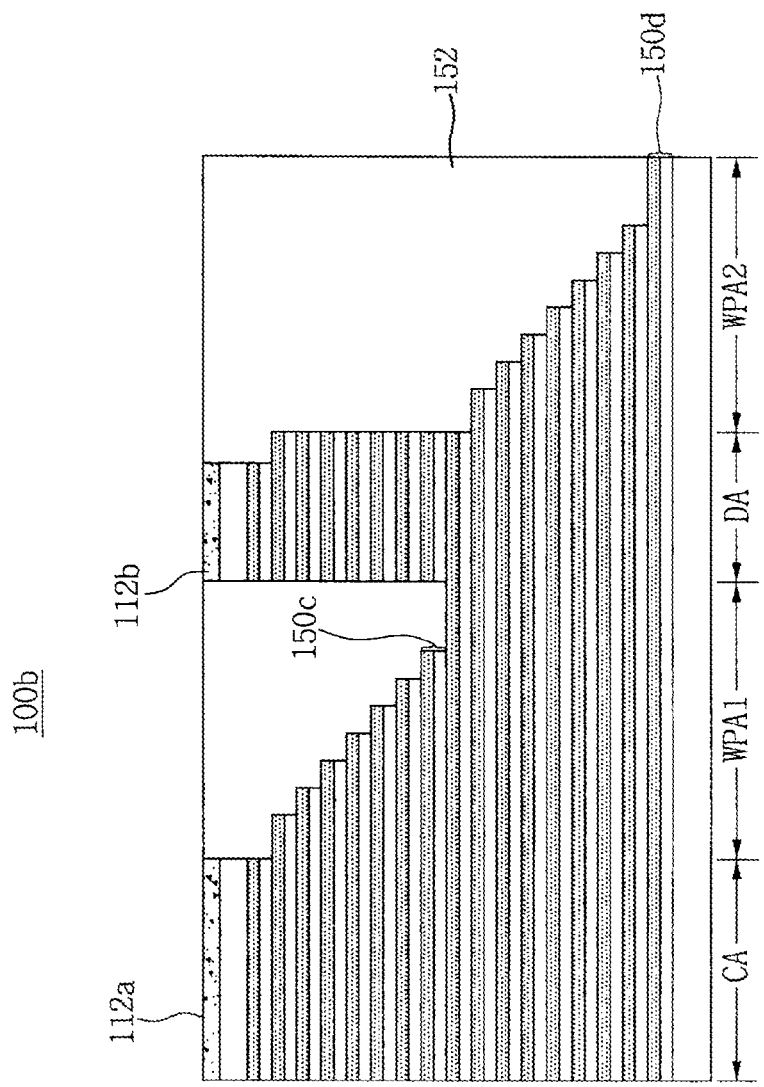

FIGS. 7A through 7P are cross-sectional views of process operations of a method of fabricating the vertical-cell-type semiconductor device shown in FIGS. 2A and 2B, according to example embodiments of inventive concepts.

When subsequent processes are the same as in the previous embodiments, a description thereof will be omitted or briefly presented.

Referring to FIG. 7A, according to example embodiments of inventive concepts, the method of fabricating the vertical-cell-type semiconductor device 100b may include forming a stack structure 108 and a first capping layer 110 on a substrate 102, forming a poly-Si layer 112 on the first capping layer 110, and forming first masks 122b on the poly-Si layer 112.

The formation of the poly-Si layer 112 may include depositing an amorphous silicon (a-Si) layer, and applying desired (and/or alternatively predetermined) heat. The formation of the first masks 122b may include coating photoresist on a top surface of the poly-Si layer 112 to form a photoresist layer, performing an exposure process, and removing photoresist to leave the photoresist layer 122b only in the cell area CA and the dummy area DA.

For brevity, the preliminary stack structure 108 will be divided into an upper preliminary stack structure 108H and a lower preliminary stack structure 108L and described.

Referring to FIG. 7B, according to example embodiments of inventive concepts, the method of fabricating the vertical-cell-type semiconductor device 100b may include performing a first etching process to remove the poly-Si layer 112, the first capping layer 110 disposed under the poly-Si layer 112, and the sacrificial layer 106 and the interlayer insulating layer 104 disposed under the first capping layer 110, from the first pad area WPA1 and the second pad area WPA2.

Due to the first etching process, a first poly-Si pattern 112a, a preliminary string selection gate pattern SGP, and a capping pattern 110' may be formed in the cell area CA, and a second poly-Si pattern 112b, a first floating pattern FP1 disposed under the second poly-Si pattern 112b, and a second floating pattern FP2 disposed under the first floating pattern FP1 may be formed in the sacrificial area SA.

The second poly-Si pattern 112b may be subsequently used as an etch stop pattern configured to stop (and/or limit) an underlying layer from being etched during a staircase forming process. Hereinafter, the second poly-Si pattern 112b will be referred to as an etch stop pattern 112b.

Referring to FIG. 7C, according to example embodiments of inventive concepts, the method of fabricating the vertical-cell-type semiconductor device 100b may include forming a second mask 124b on the cell area CA, the first pad area WPA1, and the dummy area DA. The second mask 124b may include photoresist.

Referring to FIG. 7D, according to example embodiments of inventive concepts, the method of fabricating the vertical-cell-type semiconductor device 100b may include removing the upper preliminary stack structure 108H corresponding to the second pad area WPA2, and removing the second mask 124b. Accordingly, only the lower preliminary stack structure 108L may be present in the second pad area WPA2.

Referring to FIG. 7E, according to example embodiments of inventive concepts, the method of fabricating the vertical-cell-type semiconductor device 100b may include forming third masks 126b to cover the entire cell area CA and a portion L1 of the first pad area WPA1, and simultaneously, cover the entire dummy area DA and a portion L2 of the second pad area WPA2.

Cut-off lengths L1 and L2 of the first pad area WPA1 and the second pad area WPA2 respectively covered with the third masks 126b may be equal to or greater than the product of an exposed width of a staircase to be formed and the number of steps of the staircase.

A region of the first pad area WPA1, which is not covered with the third mask 126b, may be referred to as a first exposed area EPA1, while a region of the second pad area WPA2, which is not covered with the third masks 126b, may be referred to as a second exposed area EPA2.

Hereinafter, staircase forming processes will be described with reference to FIGS. 7F and 7K.

Referring to FIG. 7F, according to example embodiments of inventive concepts, the method of fabricating the vertical-cell-type semiconductor device 100b may include performing a first etching process to form first patterns 130d, 130e and 130f in the first pad area WPA1, the dummy area DA, and the second pad area WPA2.

The first etching process may include removing each of the sacrificial layer 106 exposed by the first exposed area EXP1 and the second exposed area EXP2, and the interlayer insulating layer 104 disposed under the sacrificial layer 106, and simultaneously, shrinking top and side surfaces of the third masks 126a. Accordingly, first patterns 130d and 130f may be formed in the respective areas WPA1, and WPA2, and simultaneously, one end portions of the first patterns 130d and 130f may be exposed in the first pad area WPA1 and the second pad area WPA2.

The first pattern 130e may be separated from the first pattern 130d of the first pad area WPA1 and formed in the dummy area DA, and one side surface of the separated first pattern 130e may be vertically aligned with one side surface of the second etch stop pattern 112b disposed thereon.

Referring to FIG. 7G, according to example embodiments of inventive concepts, the method of fabricating the vertical-cell-type semiconductor device 100b may include performing a second etching process (i.e., a staircase forming process) of forming second patterns 132d, 132e, and 132f under the first patterns 130d, 130e, and 130f.

Due to the second etching process, the second patterns 132d, 132e, and 132f may be formed under the first patterns 130d, 130e, and 130f in the respective areas WPA1, SA, and WPA2, and simultaneously, end portions of the first patterns 130d and 130f and the second patterns 132d and 132f may be formed as a staircase type in the first pad area WPA1 and the second pad area WPA2. One end portions of the first patterns 130d and 130f may be exposed on side surfaces of the third masks 126b.

The second pattern 132e may be separated from the second pattern 132d of the first pad area WPA1 and formed in the dummy area DA, and one side surface of the second pattern 132e close to the first pad area WPA1 may be vertically aligned with one side surface of the first pattern 130e disposed thereon.

Referring to FIG. 7H, according to example embodiments of inventive concepts, the method of fabricating the vertical-cell-type semiconductor device 100b may include performing a third etching process to form third patterns 134d, 134e, and 134f under the second patterns 132d, 132e, and 132f.

Due to the third etching process, third patterns 134d, 134e, and 134f may be formed under the second patterns 132d, 132e, and 132f in the respective areas WPA1, SA, and WPA2, and simultaneously, end portions of the first patterns 130d and 130f, the second patterns 132d and 132f, and the third patterns 134d and 134f may be formed as a staircase type in the first pad area WPA1 and the second pad area WPA2.

The third pattern 134e may be separated from the third pattern 134d of the first pad area WPA1 and formed in the dummy area DA, and one side surfaces of the first through third patterns 130e, 132e, and 134e close to the first pad area WPA1 may be vertically aligned.

Referring to FIG. 7I, according to example embodiments of inventive concepts, the method of fabricating the vertical-cell-type semiconductor device 100b may include performing a fourth etching process to form the fourth patterns 136d, 136e, and 136f under the third patterns 134d, 134e, and 134f.

Due to the fourth etching process, fourth patterns 136d, 136e, and 136f may be formed under the third patterns 134d, 134e, and 134f, and simultaneously, end portions of the first patterns 130d and 130f, the second patterns 132d and 132f, the third patterns 134d and 134f, and the fourth patterns 136d and 136f may be formed as a staircase type in the first pad area WPA1 and the second pad area WPA2. One side surfaces of the first through fourth patterns 130e, 132e, 134e, and 136e close to the first pad area WPA1 may be vertically aligned in the dummy area DA.

Referring to FIG. 7J, after the multi-stage etching process (staircase forming process) using the third masks 126b is completed, the first patterns 130d and 130f, the second patterns 132f and 132f, the third patterns 134d and 134f, and the fourth patterns 136d and 136f may be simultaneously performed in the first pad area WPA1 and the second pad area WPA2. One side surfaces of the first through fourth patterns 130e, 132e, 134e, and 136e of the dummy area DA, which are close to the first pad area WPA1, may be vertically aligned.

Since the etch stop pattern 112b is provided in the dummy area DA unlike in the first and second pad areas WPA1 and WPA2, the first through fourth patterns 130f, 132f, 134f, and 136f disposed under the etching stop pattern 112b may not be etched any longer.

Accordingly, semiconductor devices according to example embodiments of inventive concepts, since one end portions of the respective patterns are not formed as a staircase type in the dummy area DA, an area occupied by the dummy area DA on the substrate 102 may be reduced (and/or minimized). This point may become more advantageous to processes as the number of elements increases.

Hereinafter, a staircase forming process using a fourth mask, namely, a process of forming fifth through eighth patterns having one end portions with a staircase shape in the first pad area WPA1 and the second pad area WPA2, will be described with reference to FIGS. 7K through 7O.

Referring to FIG. 7K, according to example embodiments of inventive concepts, the method of fabricating the vertical-cell-type semiconductor device 100b may include forming fifth masks 140b on the substrate 102 to cover the entire cell area CA and a portion of the first pad area WPA1, and cover the entire dummy area DA and a portion of the second pad area WPA2.

The fifth masks 140b may be formed to further cover at least a third length L3 equal to the product of the exposed width of the staircase and the number of the steps of the staircase from the side surface of the fourth pattern 136d of the first pad area WPA1, and further cover at least a fourth length L4 equal to the product of the exposed width of the staircase and the number of the steps of the staircase from the side surface of the fourth pattern 136f of the second pad area WPA2. In this case, the fourth length L4 may be equal to the third length L3. A third exposed area EPA3 and a fourth exposed area EPA4, which are not covered with the fifth masks 140b, may be present.

Referring to FIG. 7L, according to example embodiments of inventive concepts, the method of fabricating the vertical-cell-type semiconductor device 100b may include performing a fifth etching process to form fifth patterns 144d, 144e, and 144f under the fourth patterns 142d, 142e, and 142f.

Due to the fifth etching process, one end portions of the fifth patterns 144*d* and 144*f* may be exposed in the first pad area WPA1 and the second pad area WPA2. The fifth pattern 144*e* may be separated from the fifth pattern 144*d* of the first pad area WPA1 and formed in the dummy area DA. One side surface of the fifth pattern 144*e* close to the first pad area WPA1 may be vertically aligned with one side surface of the fourth pattern 136*e* thereon.

Referring to FIG. 7M, according to example embodiments of inventive concepts, the method of fabricating the vertical-cell-type semiconductor device 100*b* may include performing a sixth etching process to form sixth patterns 146*d*, 146*e*, and 146*f* under the fifth patterns 144*d*, 144*e*, and 144*f*.

Due to the sixth etching process, one end portions of the fifth patterns 144*d* and 144*f* and the sixth patterns 146*d* and 146*f* disposed thereunder may be formed as a staircase type in the first pad area WPA1 and the second pad area WPA2, and one end portions of the fifth patterns 144*d* and 144*f* may be exposed. In the dummy area DA, one side surface of the fifth pattern 144*e* close to the first pad area WPA1 may be vertically aligned with one side surface of the sixth pattern 146*e* disposed thereunder.

Referring to FIG. 7N, according to example embodiments of inventive concepts, the method of fabricating the vertical-cell-type semiconductor device 100*b* may include performing a seventh etching process to form seventh patterns 148*d*, 148*e*, and 148*f* under the sixth patterns 146*d*, 146*e*, and 146*f*.

Due to the seventh etching process, one end portions of the sixth patterns 146*d* and 146*f* and the seventh patterns 148*d* and 148*f* disposed thereunder may be formed as a staircase type in the first pad area WPA1 and the second pad area WPA2, and one end portions of the sixth patterns 146*d* and 146*f* may be exposed. One side surface of the sixth pattern 146*e* close to the first pad area WPA1 may be vertically aligned with one side surface of the seventh pattern 148*e* disposed thereunder in the dummy area DA.

Referring to FIG. 7O, after a multi-stage etching process (i.e., staircase forming process) is performed using the fifth masks 140*b*, the fifth patterns 144*d* and 144*f*, the sixth patterns 146*d* and 146*f*, and the seventh patterns 148*d* and 148*f* may be simultaneously formed in the first pad area WPA1 and WPA2. That is, etching processes may be simultaneously performed on the upper preliminary stack structure 108H and the lower preliminary stack structure 108L, thereby halving the process time taken to form end portions of the respective patterns as a staircase type.

In this case, although a layer disposed under the seventh patterns 148*d* and 148*f* in the first pad area WPA1 and the second pad area WPA2 is not patterned, the layer may form along with the seventh patterns 148*d* and 148*f* and will be referred to as eighth patterns 150*c* and 150*d*. The eighth pattern 150*c* disposed under the seventh pattern 148*d* in the first pad area WPA1 may extend over the first pad area WPA1 and the dummy area DA, and a portion of the eighth pattern 150*c* may be exposed between the seventh pattern 148*d* of the first pad area WPA1 and the seventh pattern 148*e* of the dummy area DA. The eighth pattern 150*d* disposed under the seventh pattern 148*f* may extend over the dummy area DA, the first pad area WPA1, and cell area CA, and an end portion of the eighth pattern 150*d* may be exposed in the second pad area WPA2.

Referring to FIG. 7P, according to example embodiments of inventive concepts, the method of fabricating the vertical-cell-type semiconductor device 100*b* may include forming an insulating layer 152 to cover the first pad area WPA1, the dummy area DA, and the second pad area WPA2. The insulating layer 152 may cover the first pad area WPA1, the dummy area DA, and the second pad area WPA2, and planarize a top surface of the substrate 102. The insulating layer 152 may include silicon oxide ($SiO_2$).

Figure 8:
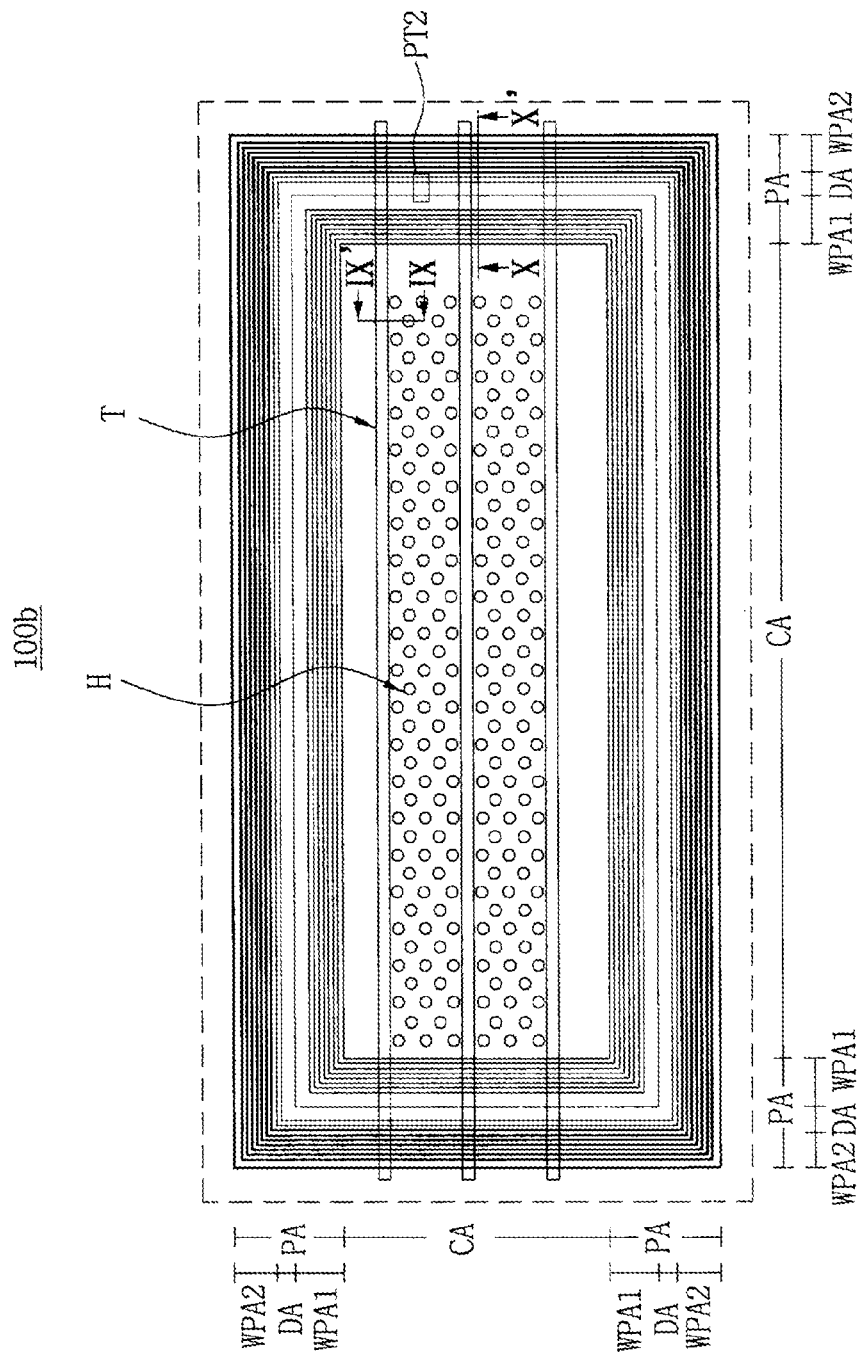
FIG. 8 is a schematic plan view of the semiconductor device shown in FIGS. 2A and 2B, according to example embodiments of inventive concepts.

FIG. 8 is a schematic plan view of the semiconductor device 100*b* shown in FIGS. 2A and 2B, according to example embodiments of inventive concepts.

Referring to FIG. 8, the semiconductor device 100*b* may include a cell area CA, and a pad area PA configured to define the cell area CA around the cell area CA.

The cell area CA may include through holes H and trenches T formed in one direction. In some cases, the through holes H may be formed also in the pad area PA, and the trenches T may extend from the cell area CA to the pad area PA.

The pad area PA may include the above-described first pad area WPA1, dummy area DA, and second pad area WPA2, and end portions of a plurality of patterns may be formed as a staircase type in the first pad area WPA1 and the second pad area WPA2. The dummy area DA may include a plurality of patterns PT2 stacked such that both side surfaces of the patterns PT2 are vertically aligned.

Hereinafter, processes subsequent to the above-described processes of FIG. 7P, which include forming through holes H and trenches T in the cell area CA and the pad area PA, will be described with reference to the above-described processes.

FIGS. 9A through 9D and FIGS. 10A through 10D are cross-sectional views taken along lines IX-IX' and X-X' of FIG. 8, which illustrate process operations of a method of fabricating the semiconductor device shown in FIGS. 2A and 2B.

Figure 9A:
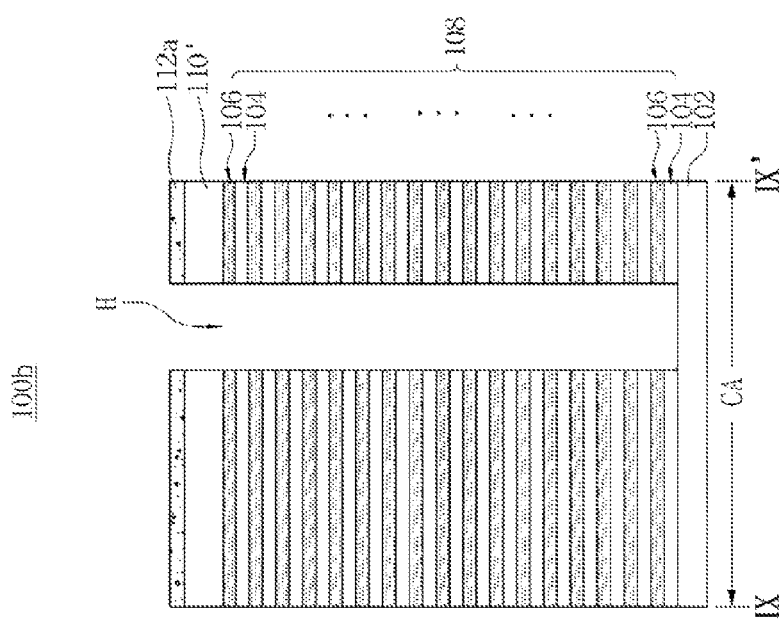
Figure 10A:
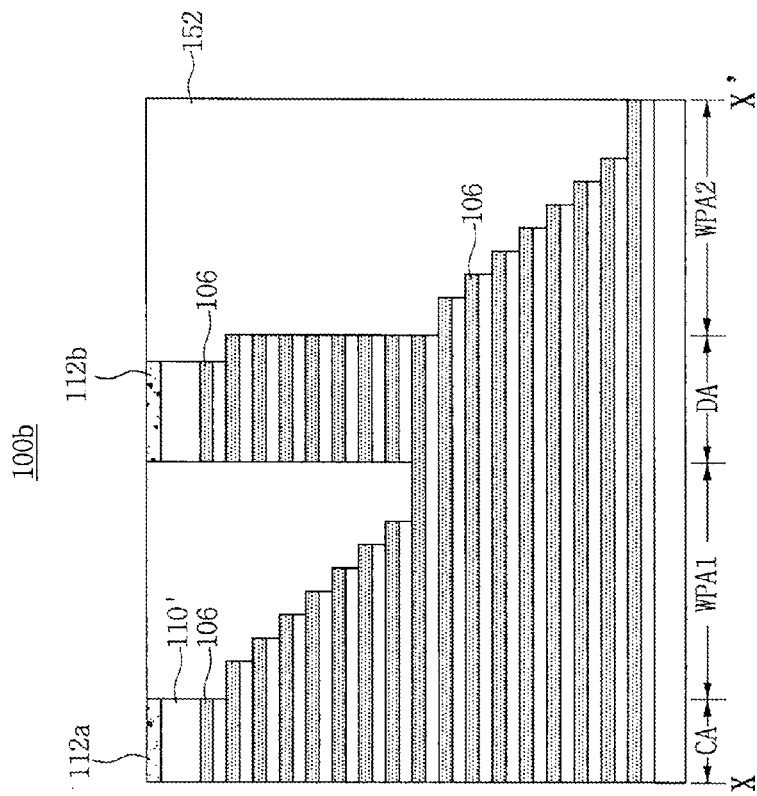

Referring to FIGS. 8, 9A, and 10A, according to example embodiments of inventive concepts, the method of fabricating the vertical-cell-type semiconductor device 100*b* may include forming a plurality of through holes H in the cell area CA.

The through hole H may be formed through the first poly-Si pattern 112*a*, the first capping pattern 110', and the preliminary stack structure 108. In some cases, the through hole H may be formed in the pad area PA.

Figure 10B:
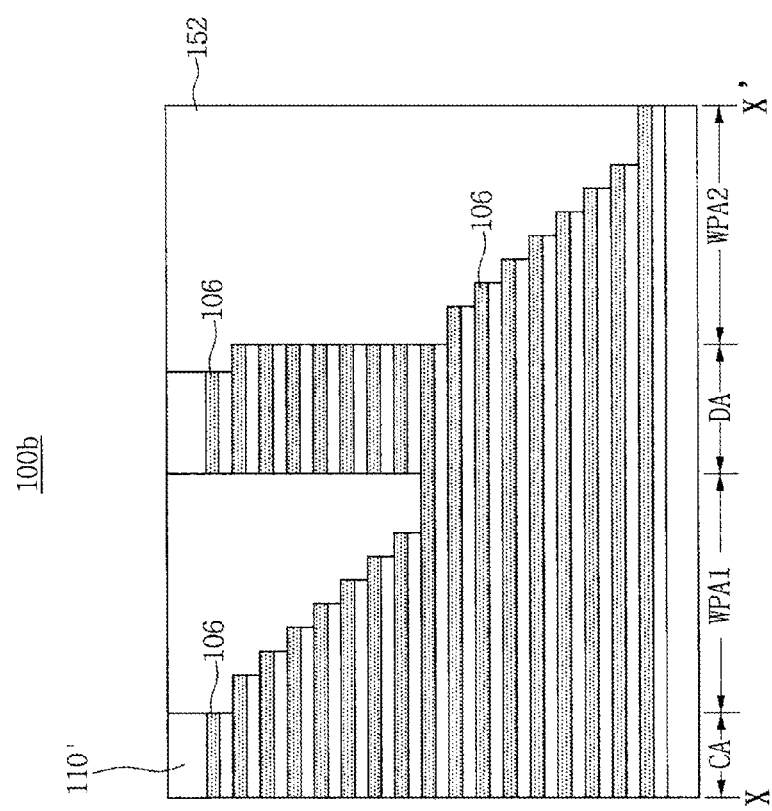

Referring to FIGS. 9B and 10B, according to example embodiments of inventive concepts, the method of fabricating the vertical-cell-type semiconductor device 100*b* may include forming a first vertical structure VS1 to fill the through hole H.

The formation of the first vertical structure VS1 may include forming a gap-fill pattern GFP to mostly fill the through hole H, forming a channel pattern 120 around the gap-fill pattern GFP, forming a gate dielectric layer GDa around the channel pattern 120, and forming a contact pad CP to fill an upper portion of the gap-fill pattern GFP. In this case, when the through hole H is formed in the pad area PA, the through hole H formed in the pad area PA may not be filled with a vertical structure.

A process of forming the gate dielectric layer GDa and the channel pattern 120 may include a CMP process for planarizing the surface of the resultant structure. During the CMP process, the first poly-Si pattern 112*a* and the etch stop pattern 112*b* formed on the cell area CA and the dummy area DA may be removed.

Figure 10C:
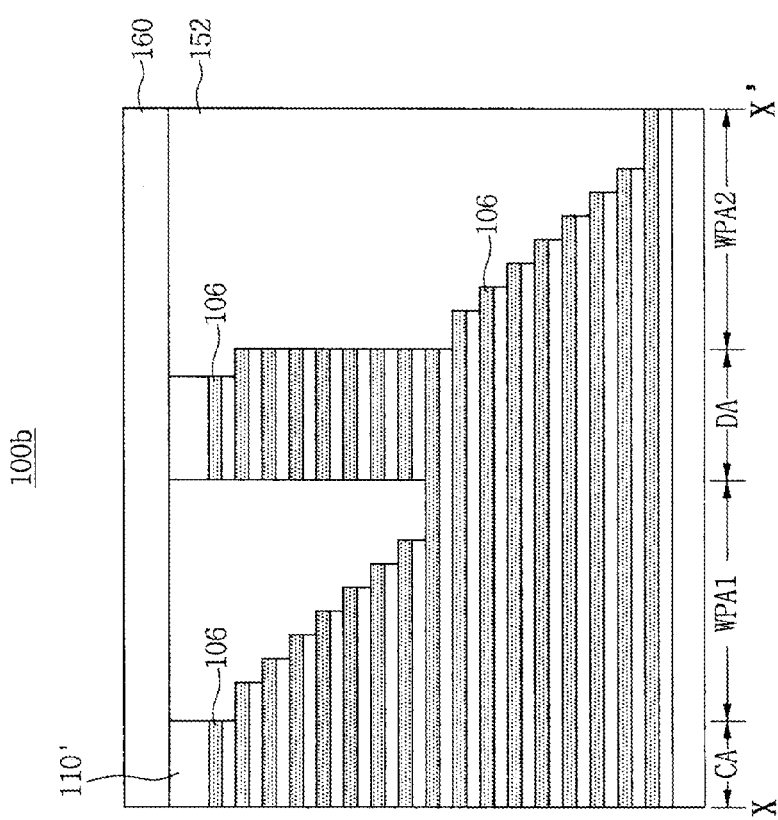

Referring to FIGS. 9C and 10C, according to example embodiments of inventive concepts, the method of fabricating the vertical-cell-type semiconductor device 100*b* may include forming a second capping layer 160 and a trench T.

The second capping layer 160 may be formed on the entire surface of the substrate 102 having the vertical structure VS2, and the trench T may penetrate the second capping layer 160, the first capping pattern 110', and the preliminary stack structure 108 and extend in one direction. Referring to FIG. 8, the trench T may extend from the cell area CA to the pad area PA.

The second capping layer 160 may have an etch selectivity with respect to the sacrificial layer 106. For example, when the sacrificial layer 106 is formed of silicon nitride, the second capping layer 160 may include silicon oxide.

Since subsequent processes are the same as described with reference to FIGS. 5C through 5G and 6C through 6G, a description thereof will be briefly presented with reference to FIGS. 9D and 10D.

Figure 9D:
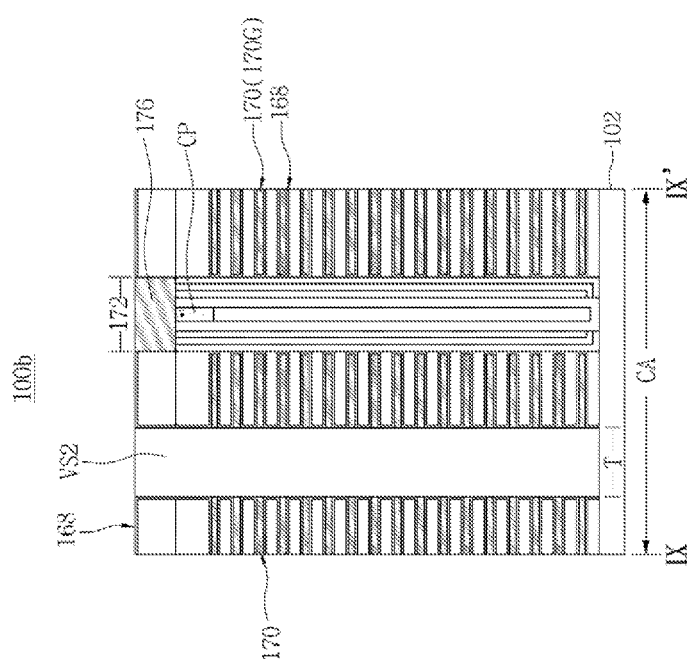
Figure 10D:
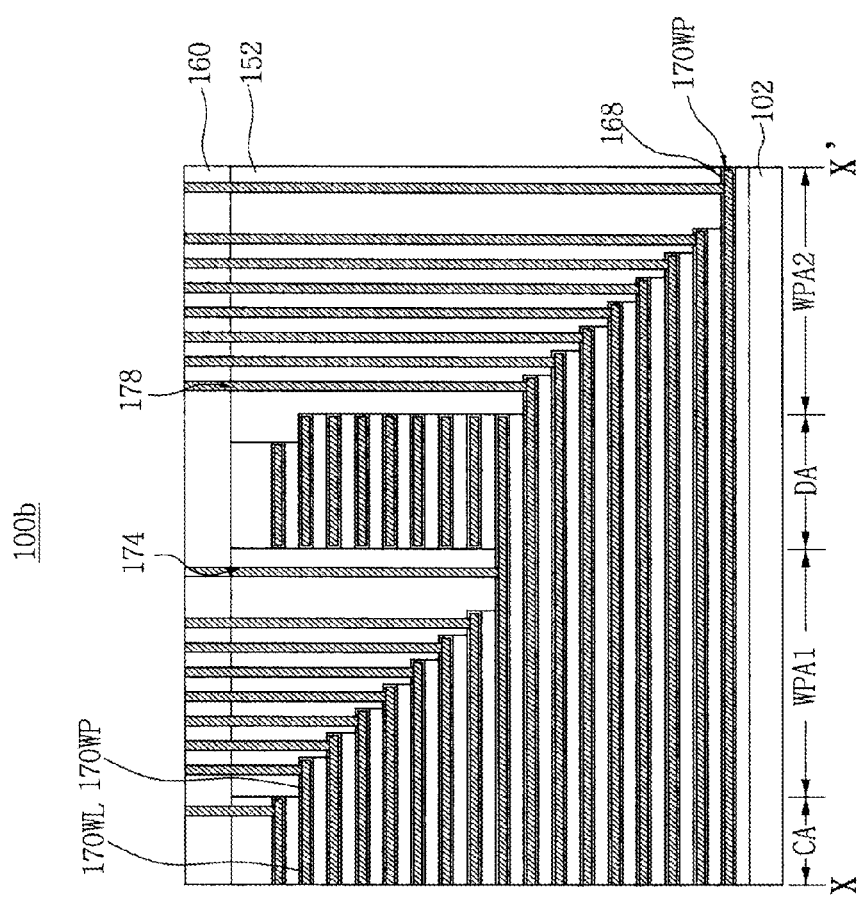

Referring to FIGS. 8, 9D, and 10D, according to example embodiments of inventive concepts, the method of fabricating the vertical-cell-type semiconductor device 100b may include removing the sacrificial layer 106 from the cell area CA and the pad area PA through the trench T, forming a block layer 168 in contact with the interlayer insulating layer 104 and the gate dielectric layer GDa, and forming a conductive layer 170 in contact with the blocking layer 168 to fill a portion from which the sacrificial layer 106 is removed. The conductive layer 170 may be referred to as a gate electrode 170G, a word line 170WL, and a word pad 170P according to position.

Next, the method may include forming a second vertical structure VS2 to fill the trench T of the cell area CA, forming cell vias 172 exposing top surfaces of the contact pad CP and pad vias 174 exposing top surfaces of the word pads 170WP, and forming contact electrodes 176 filling the cell vias 172 and pad contact electrodes 178 filling the pad vias 174.

In methods of fabricating semiconductor devices according to example embodiments, before forming the preliminary stack structure 108, a staircase-type preliminary added stack structure on a substrate 102 may be further formed, and an insulating layer may be further formed to cover the staircase-type added stack structure and planarize the surface of the added stack structure.

These processes will now be described with reference to FIGS. 11A through 11G.

FIGS. 11A through 11G are process cross-sectional views of process operations of a method of fabricating a vertical-cell-type semiconductor device according to example embodiments of inventive concepts.

Figure 11A:
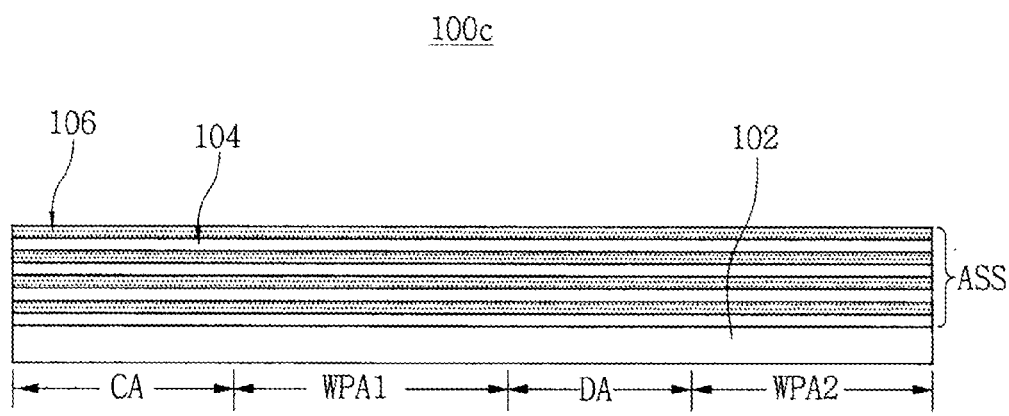

Referring to FIG. 11A, according to example embodiments of inventive concepts, a method of fabricating the vertical-cell-type semiconductor device 100c may include forming an added stack structure ASS by alternately repetitively stacking a plurality of interlayer insulating layers 104 and a plurality of sacrificial layers 106 on a substrate 102.

Figure 11B:
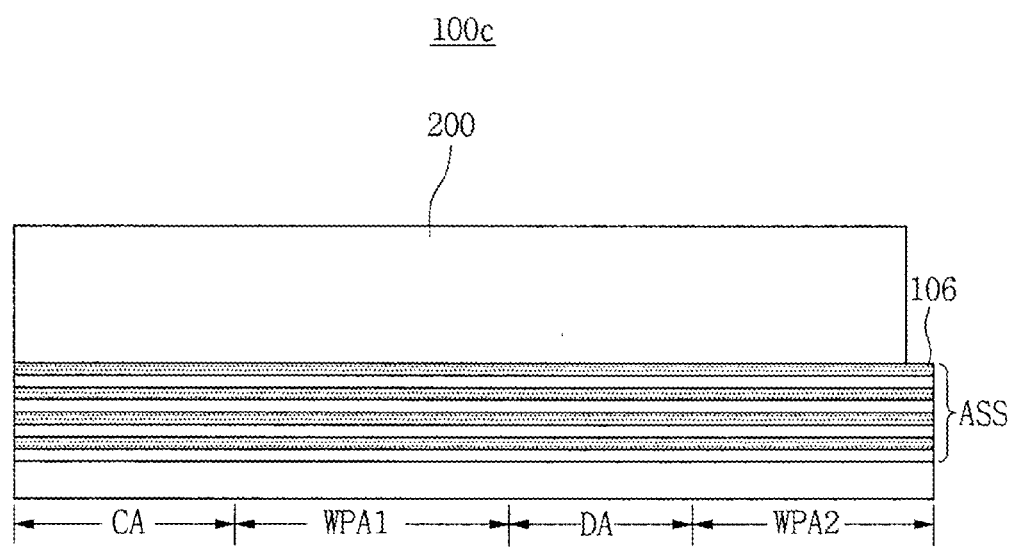

Referring to FIG. 11B, according to example embodiments of inventive concepts, the method of fabricating the vertical-cell-type semiconductor device 100c may include forming a mask pattern 200 on the added stack structure ASS. The formation of the mask pattern 200 may include forming a photoresist layer on a top surface of an uppermost sacrificial layer 106, performing an exposure process, and partially removing the photoresist layer. An end portion of one side of the sacrificial layer 106 may not be covered with the mask pattern 200 but exposed.

Figure 11C:
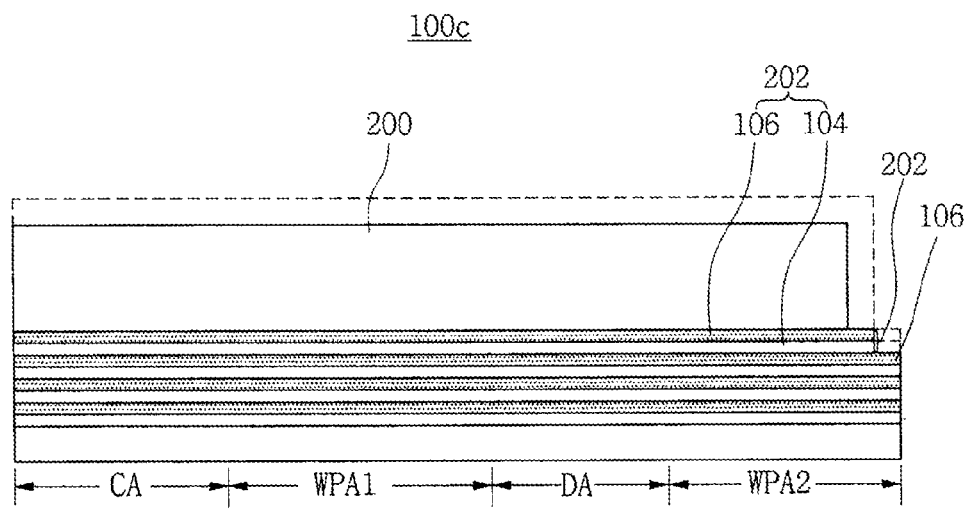

Referring to FIG. 11C, according to example embodiments of inventive concepts, the method of fabricating the vertical-cell-type semiconductor device 100c may include performing a first etching process to remove the exposed sacrificial layer 106 and the interlayer insulating layer 104 disposed thereunder.

Due to the first etching process, a first pattern 202 may be formed. An end portion of the first pattern 202 may be etched to expose the underlying sacrificial layer 106. In this case, side and top surfaces of the mask pattern 200 may also shrink to expose the end portion of the first pattern 202.

Figure 11D:
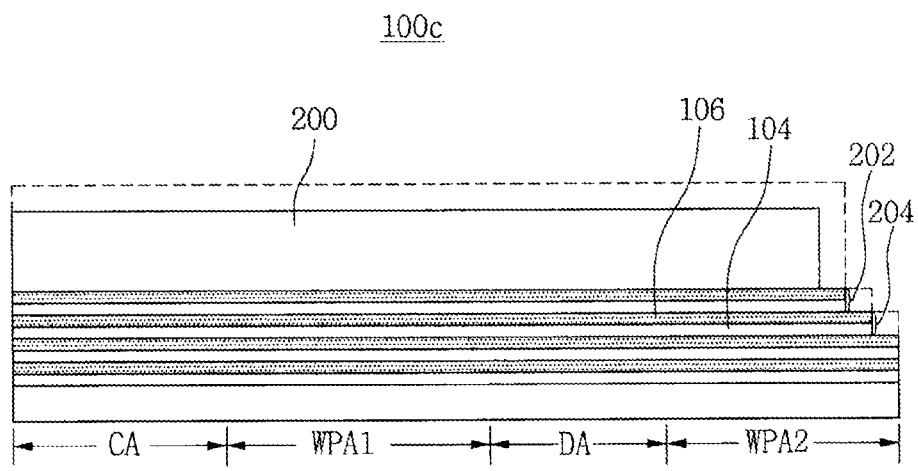

Referring to FIG. 11D, according to example embodiments of inventive concepts, the method of fabricating the vertical-cell-type semiconductor device 100c may include performing a second etching process (or staircase forming process) of forming a second pattern 204 to make a staircase along with the first pattern 202.

Due to the second etching process, one end portions of the first pattern 202 and the underlying second pattern 204 may be formed as a staircase type, and the end portion of the first pattern 202 may be exposed again.

Figure 11E:
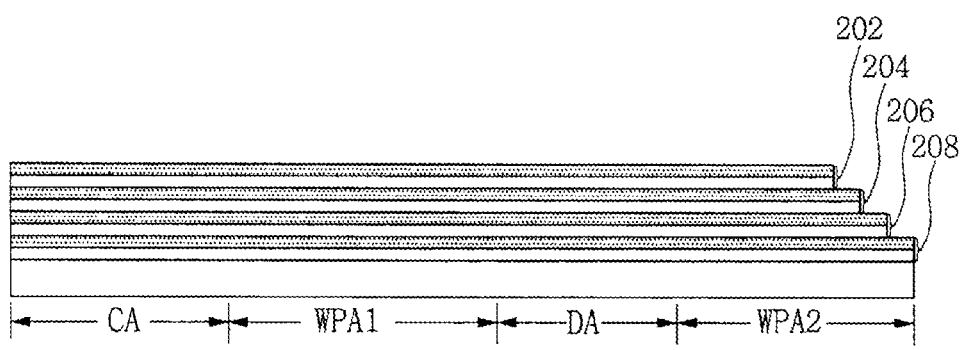

Referring to FIG. 11E, according to example embodiments of inventive concepts, the method of fabricating the vertical-cell-type semiconductor device 100c may include performing the above-described staircase forming processes, and sequentially forming a third pattern 206 and a fourth pattern 208 under the second pattern 204. Thus, end portions of the first through fourth patterns 202, 204, 206, and 208 may be formed as a staircase type.

Figure 11F:
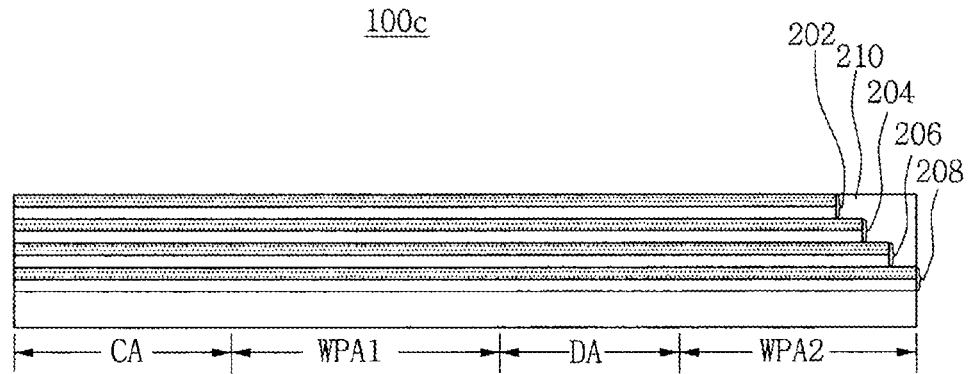

Referring to FIG. 11F, according to example embodiments of inventive concepts, the method of fabricating the vertical-cell-type semiconductor device 100c may include forming an insulating layer 210 to cover the staircase of the first through fourth patterns 202, 204, 206, and 208.

A top surface of the insulating layer 210 may be at the same level as a top surface of the first pattern 202 and serve to planarize the top surface of the substrate 102.

Referring to FIG. 11G, according to example embodiments of inventive concepts, the method of fabricating the vertical-cell-type semiconductor device 100c may include forming a preliminary stack structure 108 by alternately and repetitively stacking a plurality of interlayer insulating layers 104 and a plurality of sacrificial layers 106 on the first pattern 202 and the top surface of the insulating layer 208.

Subsequent processes may be performed with reference to the above-described embodiments to fabricate semiconductor devices.

Figure 12:
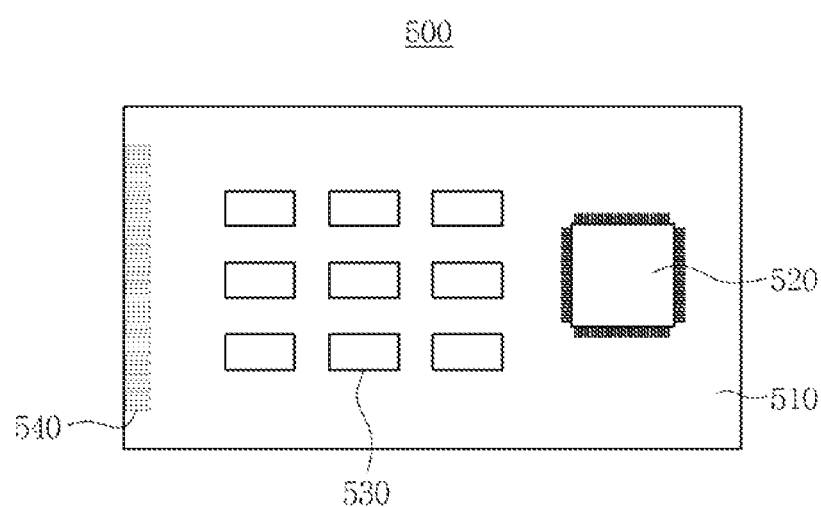
FIG. 12 is a conceptual diagram of a semiconductor module including at least one of semiconductor devices according to various example embodiments of inventive concepts.

FIG. 12 is a conceptual diagram of a semiconductor module 500 including at least one of semiconductor devices 100a, 100b, and 100c according to example embodiments of inventive concepts. Referring to FIG. 12, according to example embodiments of inventive concepts, the semiconductor module 500 may include at least one semiconductor device 530. The semiconductor device 530 may be one of the semiconductor device 100a, 100b, and 100c according to example embodiments of inventive concepts, which may be mounted on a semiconductor module substrate 510. The semiconductor module 500 may further include a microprocessor (MP) 520 mounted on the module substrate 510. Input/output (I/O) terminals 540 may be disposed on at least one side of the module substrate 510. The semiconductor module 500 may include a memory card or solid-state drive (SSD).

Figure 13:
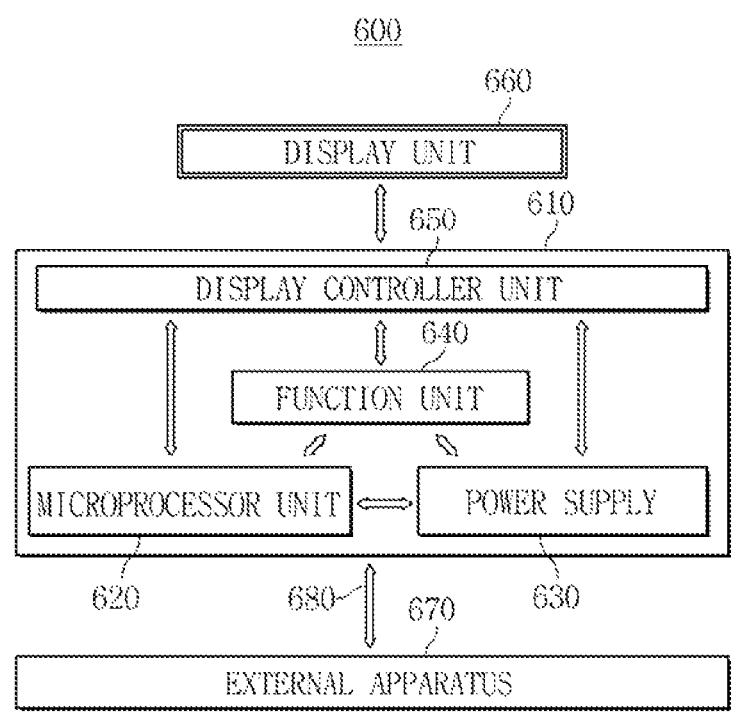
FIG. 13 is a conceptual block diagram of an electronic system including one of semiconductor devices according to example embodiments of inventive concepts.

FIG. 13 is a block diagram of an electronic system 600 including at least one semiconductor device 100a, 100b, and 100c according to example embodiments of inventive concepts. Referring to FIG. 13, semiconductor devices 100a, 100b, and 100c according to example embodiments of inventive concepts may be applied to the electronic system 600. The electronic system 600 may include a body 610, an MP unit 620, a power supply 630, a function unit 640, and/or a display controller unit 650. The body 610 may be a system board or motherboard having a printed circuit board (PCB) 102. The MP unit 620, the power supply 630, the function unit 640, and the display controller unit 650 may be mounted on the body 610. A display unit 660 may be disposed on a top surface of the body 610 or outside the body 610. For example, the display unit 660 may be disposed on a surface of the body 610 and display an image processed by the display controller unit 650. The power supply 630 may receive a desired (and/or alternatively predetermined) voltage from an external power source, divide the desired (and/or alternatively predetermined) voltage into various voltage levels, and transmit the divided voltages to the MP unit 620, the function unit 640, and the display controller unit 650. The MP unit 620 may receive a voltage from the power supply 630 and control the function unit 640 and the display unit 660. The function unit 640 may implement various functions of the electronic system 600. For instance, when the electronic system 600 is a mobile electronic product, such as a portable phone, the function unit 640 may include several elements capable of wireless communication functions, such as output of an image to the display unit 660 or output of a voice to a speaker, by dialing or communication with an external unit 670. When the function unit 640 includes a camera, the function unit 640 may serve as an image processor. In applied embodiments, when the electronic system 600 is connected to a memory card to increase the capacity of the electronic system 600, the function unit 640 may be a memory card controller. The function unit 640 may exchange signals with the external apparatus 670 through a wired or wireless communication unit 680. In addition, when the electronic system 600 needs a universal serial bus (USB) to expand functions thereof, the function unit 640 may serve as an interface controller. Semiconductor devices 100a, 100b, and 100c according to example embodiments of inventive concepts may be included in the function unit 640.

Figure 14:
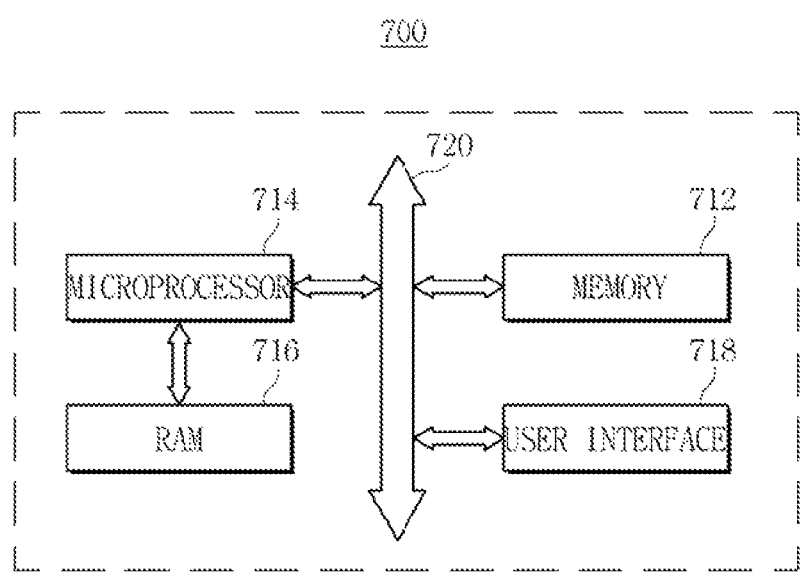
FIG. 14 is a schematic block diagram of an electronic system according to example embodiments of inventive concepts.

FIG. 14 is a schematic block diagram of an electronic system 700 according to example embodiments of inventive concepts. Referring to FIG. 14, the electronic system 700 may include at least one semiconductor device (e.g., 100a, 100b, and 100c) according to example embodiments of inventive concepts. The electronic system 700 may be applied to a mobile electronic device or computer. For example, the electronic system 700 may include a memory system 712, an MP 714, a random access memory (RAM) 716, and a user interface 718, which may communicate data using a bus 720. The MP 714 may program and control the electronic system 700. The RAM 716 may be used as an operation memory of the MP 714. For instance, the MP 714 or the RAM 716 may include at least one semiconductor device (e.g., 100a, 100b, and 100c) according to example embodiments of inventive concepts. The MP 714, the RAM 716, and/or other elements may be assembled within a single package. The user interface 718 may be used to input data to the electronic system 700 or output data from the electronic system 700. The memory system 712 may store codes for operating the MP 714, data processed by the MP 714, or external input data. The memory system 712 may include a controller and a memory.

Figure 15:
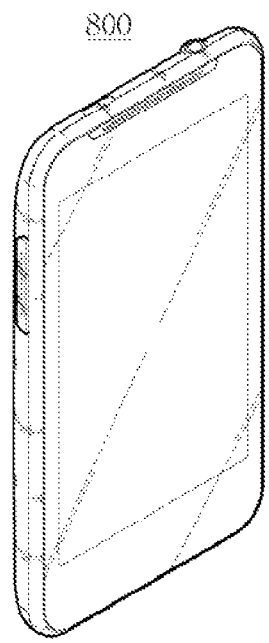
FIG. 15 is a conceptual diagram of a mobile electronic device according to example embodiments of inventive concepts.

FIG. 15 is a schematic diagram of a mobile device 800 according to example embodiments of inventive concepts. The mobile device 800 may be a tablet personal computer (PC), but example embodiments of inventive concepts are not limited thereto. Furthermore, at least one semiconductor device (e.g., 100a, 100b, and 100c) according to example embodiments of inventive concepts may be used not only for a tablet PC but also for a portable computer such as a laptop computer, an MPEG-1 audio layer 3 (MP3) player, an MP4 player, a navigation device, a solid-state disk (SSD), a desktop computer, or electronic devices for automotive and household uses.

In a method of fabricating a vertical-cell-type semiconductor device according to example embodiments of inventive concepts, when signal input terminals of vertically formed elements are formed as a staircase type, the stacked input terminals can be divided into two parts, and processes are simultaneously performed on the two parts, thereby reducing process time.

A method of fabricating a semiconductor device according to example embodiments of inventive concepts can shorten a process time, reduce fabrication costs, and/or increase yields. Although some example embodiments of inventive concepts have been described, it will be understood by one of ordinary skill in the art that variations in form and detail may be made therein without departing from the spirit and scope of the claims.

What is claimed is:

1. A semiconductor device comprising:
   a substrate including a cell area, a first pad area surrounding the cell area, a dummy area surrounding the first pad area, and a second pad area surrounding the dummy area;
   a lower stack structure on the first pad area, the dummy area, and the second pad area and having one side portion formed as a staircase type;
   an upper stack structure on the lower stack structure on the first pad area and having one side portion formed as a staircase type; and
   a dummy stack structure on the lower stack structure in the dummy area and having one side portion formed as a staircase type,
   the lower stack structure, the dummy stack structure, and the upper stack structure including conductive layers and interlayer insulating layers stacked alternately.

2. The device of claim 1, wherein the staircase type includes a plurality of horizontal portions and a plurality of vertical portions,
   wherein each of the vertical portions of the lower stack structure and the upper stack structure is a portion formed by vertically aligning a pair of an interlayer insulating layer and a conductive layer, and each of the vertical portions of the dummy stack structure is a portion formed by vertically aligning two pairs of interlayer insulating layers and conductive layers.

3. The device of claim 1, wherein the other side portion of the dummy stack structure is formed by vertically aligning the interlayer insulating layers and the conductive layers.

4. The device of claim 1, further comprising:
   a stack structure including electrodes and interlayer insulating layers alternately stacked in the cell area,
   wherein the electrodes are connected to the conductive layers in the first pad area and the second pad area.

5. The device of claim 1, further comprising:
   contact electrodes being in contact with one end portions of the conductive layers exposed by the staircase-type one side portions of the lower stack structure and the upper stack structure.

6. The device of claim 5, wherein the contact electrodes have respectively different heights.

* * * * *